United States Patent
Endo et al.

(10) Patent No.: US 10,338,716 B2
(45) Date of Patent: *Jul. 2, 2019

(54) ELECTRONIC DEVICE

(71) Applicant: Semiconductor Energy Laboratory Co., Ltd., Kanagawa-ken (JP)

(72) Inventors: Akio Endo, Kanagawa (JP); Shigeru Onoya, Kanagawa (JP); Masaaki Hiroki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/963,459

(22) Filed: Apr. 26, 2018

(65) Prior Publication Data

US 2018/0246609 A1    Aug. 30, 2018

Related U.S. Application Data

(63) Continuation of application No. 15/443,670, filed on Feb. 27, 2017, now Pat. No. 9,958,976, which is a (Continued)

(30) Foreign Application Priority Data

Feb. 28, 2014 (JP) .................. 2014-039372
Oct. 28, 2014 (JP) .................. 2014-218932

(51) Int. Cl.
*H05K 5/00* (2006.01)
*H05K 7/00* (2006.01)
(Continued)

(52) U.S. Cl.
CPC .......... *G06F 3/0412* (2013.01); *G02F 1/1368* (2013.01); *G02F 1/13338* (2013.01); (Continued)

(58) Field of Classification Search
CPC ........................................................ H05K 5/00
See application file for complete search history.

(56) References Cited

U.S. PATENT DOCUMENTS 6,353,529 B1    3/2002  Cies
6,842,338 B2    1/2005  Iredale
(Continued)

FOREIGN PATENT DOCUMENTS

EP       1 635 313 A2    3/2006
JP       2003-174153 A   6/2003
(Continued)

*Primary Examiner* — Jerry Wu
(74) *Attorney, Agent, or Firm* — Husch Blackwell LLP

(57) ABSTRACT

Provided is an electronic device with high portability and/or high browsability. The electronic device includes first and second support bodies, a first hinge, and a flexible display panel. The first hinge has a first rotation axis and connects the first and second support bodies to each other, and the first and second support bodies are capable of relatively rotating on the first rotation axis. The display panel includes at least first and second portions supported by the first and second support bodies, respectively; the first rotation axis and a first plane including the display surface overlapping with the first portion or a second plane including the display surface overlapping with the second portion are parallel to each other; and each of a distance between the first rotation axis and the first plane or the second plane is greater than zero.

15 Claims, 27 Drawing Sheets

Related U.S. Application Data continuation of application No. 14/629,990, filed on Feb. 24, 2015, now Pat. No. 9,588,549.

(51) Int. Cl.

| | | |
|---|---|---|
| *G06F 3/041* | (2006.01) | |
| *G06F 1/16* | (2006.01) | |
| *G06F 3/042* | (2006.01) | |
| *G06F 3/044* | (2006.01) | |
| *G02F 1/1333* | (2006.01) | |
| *G02F 1/1368* | (2006.01) | |
| *H01L 27/32* | (2006.01) | |
| *H01L 51/52* | (2006.01) | |

(52) U.S. Cl.
CPC ...... *G02F 1/133305* (2013.01); *G06F 1/1618* (2013.01); *G06F 1/1641* (2013.01); *G06F 1/1643* (2013.01); *G06F 1/1652* (2013.01); *G06F 3/042* (2013.01); *G06F 3/044* (2013.01); *H01L 27/323* (2013.01); *H01L 27/3244* (2013.01); *H01L 51/5237* (2013.01); *G06F 2203/04102* (2013.01); *H01L 27/3211* (2013.01); *H01L 27/3251* (2013.01); *H01L 2251/5315* (2013.01); *H01L 2251/5338* (2013.01)

(56) References Cited

U.S. PATENT DOCUMENTS

| | | | |
|---|---|---|---|
| 7,446,757 B2 | 11/2008 | Mochizuki et al. | |
| 8,369,075 B2 | 2/2013 | Huang | |
| 8,415,208 B2 | 4/2013 | Takayama et al. | |
| 8,670,244 B2 * | 3/2014 | Wakimoto | G06F 1/1626 361/755 |
| D719,542 S | 12/2014 | Lee et al. | |
| D760,219 S * | 6/2016 | Yamazaki | D14/341 |
| 2006/0050169 A1 | 3/2006 | Misawa | |
| 2010/0016038 A1 | 1/2010 | Demuynck et al. | |
| 2010/0201603 A1 | 8/2010 | Kee et al. | |
| 2010/0201604 A1 | 8/2010 | Kee et al. | |
| 2010/0277448 A1 | 11/2010 | Okamoto et al. | |
| 2011/0210937 A1 | 9/2011 | Kee et al. | |
| 2012/0002360 A1 | 1/2012 | Seo et al. | |
| 2012/0033353 A1 | 2/2012 | Huang | |
| 2012/0033354 A1 | 2/2012 | Huang | |
| 2012/0264489 A1 | 10/2012 | Choi et al. | |
| 2012/0307423 A1 | 12/2012 | Bohn et al. | |
| 2012/0307472 A1 | 12/2012 | Bohn et al. | |
| 2013/0010405 A1 | 1/2013 | Rothkopf et al. | |
| 2013/0120912 A1 | 5/2013 | Ladouceur et al. | |
| 2013/0314611 A1 | 11/2013 | Okutsu et al. | |
| 2013/0342094 A1 | 12/2013 | Walters et al. | |
| 2014/0029171 A1 | 1/2014 | Lee | |
| 2014/0042293 A1 | 2/2014 | Mok et al. | |
| 2014/0111954 A1 | 4/2014 | Lee et al. | |
| 2014/0226275 A1 | 8/2014 | Ko et al. | |
| 2014/0355181 A1 | 12/2014 | Jung et al. | |
| 2014/0355195 A1 | 12/2014 | Kee et al. | |
| 2014/0375660 A1 | 12/2014 | Tamaki | |
| 2015/0016126 A1 | 1/2015 | Hirakata et al. | |
| 2015/0023030 A1 | 1/2015 | Tsukamoto | |
| 2015/0023031 A1 | 1/2015 | Endo | |
| 2015/0035777 A1 | 2/2015 | Hirakata et al. | |
| 2015/0055286 A1 | 2/2015 | Eguchi | |
| 2015/0055287 A1 | 2/2015 | Seo | |
| 2015/0062028 A1 | 3/2015 | Go et al. | |
| 2015/0062525 A1 | 3/2015 | Hirakata | |
| 2015/0062927 A1 | 3/2015 | Hirakata et al. | |
| 2015/0103023 A1 | 4/2015 | Iwaki | |
| 2015/0177789 A1 | 6/2015 | Jinbo | |
| 2015/0229844 A1 | 8/2015 | Yamazaki et al. | |
| 2015/0233557 A1 | 8/2015 | Aoyama et al. | |
| 2015/0248149 A1 | 9/2015 | Yamazaki et al. | |
| 2015/0250038 A1 | 9/2015 | Sakuishi et al. | |
| 2015/0261259 A1 | 9/2015 | Endo et al. | |

FOREIGN PATENT DOCUMENTS

| | | |
|---|---|---|
| JP | 2005-141715 A | 6/2005 |
| JP | 2006-072115 A | 3/2006 |
| JP | 2006-243621 A | 9/2006 |
| JP | 3164598B U | 12/2010 |
| JP | 3164599B U | 12/2010 |

* cited by examiner

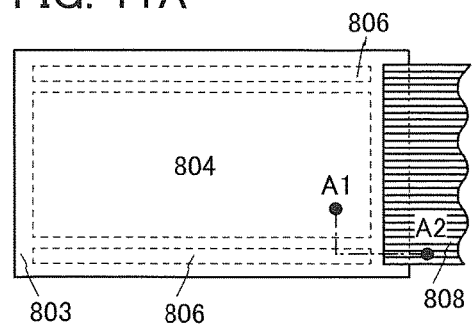
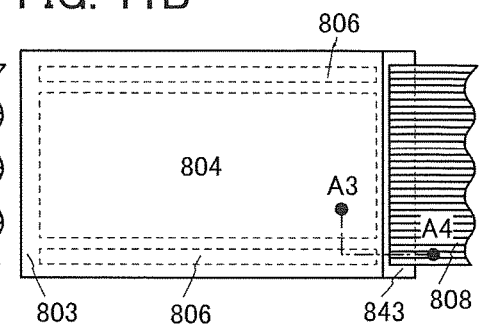
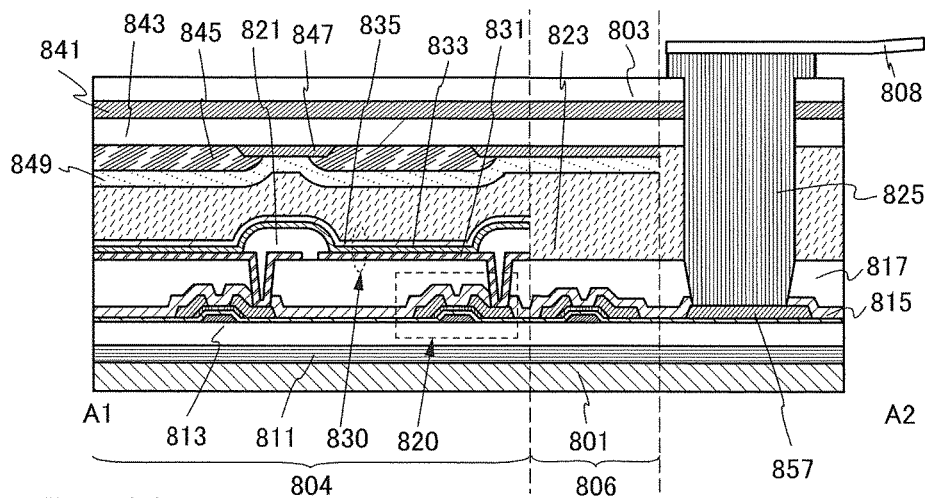
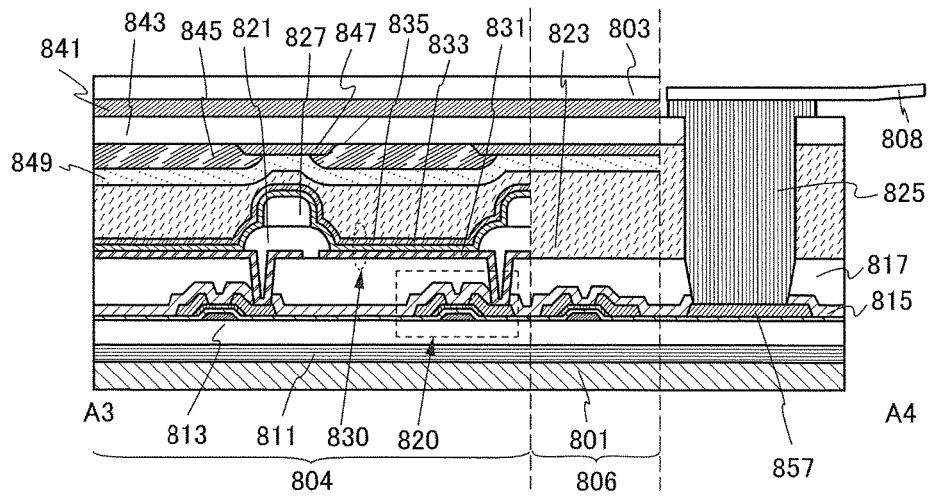

ELECTRONIC DEVICE

BACKGROUND OF THE INVENTION

This application is a continuation of copending U.S. application Ser. No. 15/443,670, filed on Feb. 27, 2017 which is a continuation of U.S. application Ser. No. 14/629,990, filed on Feb. 24, 2015 (now U.S. Pat. No. 9,588,549 issued Mar. 7, 2017) which are all incorporated herein by reference.

1. Field of the Invention

One embodiment of the present invention relates to a display device, and particularly relates to a display device which has flexibility and can be curved. Furthermore, one embodiment of the present invention relates to an electronic device including a display device.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Therefore, specifically, examples of the technical field of one embodiment of the present invention disclosed in this specification include a semiconductor device, a display device, a light-emitting device, a lighting device, a power storage device, a memory device, a driving method thereof, and a manufacturing method thereof.

2. Description of the Related Art

In recent years, display devices have been expected to be applied to a variety of uses and have become diversified. For example, display devices for use in portable electronic devices and the like are required to be thin, light, or robust, for example. In addition, novel application is required.

In addition, Patent Document 1 discloses a flexible active-matrix light-emitting device in which an organic EL element and a transistor serving as a switching element are provided over a film substrate.

PRIOR ART REFERENCE

Patent Document

[Patent Document 1] Japanese Published Patent Application No. 2003-174153

SUMMARY OF THE INVENTION

In recent years, browsability of display has been considered to be improved by enlarging display regions of display devices to display a larger amount of data. However, in applications of portable devices, an enlargement of display devices might entail a reduction in portability. For this reason, high browsability of display and high portability are difficult to achieve at the same time.

An object of one embodiment of the present invention is to provide an electronic device with high portability. Another object is to provide an electronic device with high browsability. Another object is to provide an electronic device with high reliability. Another object is to provide a novel display device or electronic device.

Note that the descriptions of these objects do not disturb the existence of other objects. One embodiment of the present invention does not need to achieve all the objects. Objects other than those described above will be apparent from the descriptions of the specification and the like, and objects other than those described above can be derived from the descriptions of the specification and the like.

One embodiment of the present invention is an electronic device which includes a first support body, a second support body, a first hinge, and a display panel, characterized in that the display panel has flexibility; the display panel includes a first display surface and a second display surface; the first hinge has a function of being capable of rotating on a first rotation axis; the first hinge has a function of being capable of connecting the first support body and the second support body to each other; the first support body and the second support body have a function of being capable of relatively rotating on the first rotation axis; the display panel includes a first portion, a second portion, and a third portion; the first portion includes a portion supported by the first support body; the second portion includes a portion supported by the second support body; the third portion includes a portion not fixed to the first support body and the second support body; the first display surface includes a region where the first display surface and the first portion overlap with each other; the second display surface includes a region where the second display surface and the second portion overlap with each other; a first plane includes a region parallel to the first rotation axis; the first plane is positioned on the same plane as the first display surface; the first plane is a plane obtained by extending the first display surface in a direction parallel to the first display surface; the first plane includes a region where the first plane and the first rotation axis overlap with each other; the second plane includes a region parallel to the first rotation axis; the second plane is positioned on the same plane as the second display surface; the second plane is a plane obtained by extending the second display surface in a direction parallel to the second display surface; the second plane includes a region where the second plane and the first rotation axis overlap with each other; a distance between the first plane and the first rotation axis is greater than zero; and a distance between the second plane and the first rotation axis is greater than zero.

In addition, one embodiment of the present invention is an electronic device which includes a first support body, a second support body, a first hinge, and a display panel. The display panel includes a first portion supported by the first support body, a second portion supported by the second support body, and a third portion that is positioned between the first portion and the second portion and has flexibility. The display panel includes a display surface overlapping with the first portion, the second portion, and the third portion. The first hinge has a first rotation axis and has a function of connecting the first support body and the second support body to each other. The first support body and the second support body have a function of relatively rotating on the first rotation axis. It is characterized in that the first rotation axis and a first plane including the display surface overlapping with the first portion are parallel to each other; the first rotation axis and a second plane including the display surface overlapping with the second portion are parallel to each other; a distance between the first plane and the first rotation axis is greater than zero; and a distance between the second plane and the first rotation axis is greater than zero.

In the above, it is preferable that the distance between the first plane and the first rotation axis be greater than or equal to 0.1 mm and less than or equal to 20 mm and the distance between the second plane and the first rotation axis be greater than or equal to 0.1 mm and less than or equal to 20 mm.

In the above, it is also preferable that the distance between the first plane and the first rotation axis and the distance between the second plane and the first rotation axis be substantially equal to each other.

In the above, it is also preferable that the first support body and the second support body be capable of relatively rotating on the first rotation axis by an angle greater than 180 degrees.

In the above, it is also preferable that the first rotation axis be positioned on a side in a direction of a normal vector to the first display surface when the first plane and the second plane are identical with each other, and that the display panel be foldable so that a third display surface overlapping with the third portion becomes a concave surface. Alternatively, it is preferable that the first rotation axis be positioned on a side opposite to the direction of the normal vector to the first display surface when the first plane and the second plane are identical with each other, and that the display panel be foldable so that the third display surface overlapping with the third portion becomes a convex surface.

In the above, it is also preferable that a third support body and a second hinge be further included; the second hinge have a function of being capable of rotating on a second rotation axis; the second hinge have a function of being capable of connecting the second support body and the third support body to each other; the second support body and the third support body have a function of being capable of relatively rotating on the second rotation axis; the display panel include a fourth portion and a fifth portion; the display panel include a fourth display surface; the fourth portion include a portion supported by the third support body; the fifth portion include a portion not fixed to the second support body and the third support body; the fourth display surface include a region where the fourth display surface and the fourth portion overlap with each other; the second plane include a region parallel to the second rotation axis; a third plane include a region parallel to the second rotation axis; the third plane be positioned on the same plane as the fourth display surface; the third plane be a plane obtained by extending the fourth display surface in a direction parallel to the fourth display surface; the third plane include a region where the third plane and the second rotation axis overlap with each other; a distance between the second plane and the second rotation axis be greater than zero; and a distance between the third plane and the second rotation axis be greater than zero.

Alternatively, it is preferable that a third support body and a second hinge be further included in a structure; the second hinge have a second rotation axis and have a function of connecting the second support body and the third support body to each other; the second support body and the third support body have a function of relatively rotating on the second rotation axis; the display panel include a fourth portion supported by the third support body and a fifth portion that is positioned between the second portion and the fourth portion and has flexibility; the display surface include a portion overlapping with the fourth portion and the fifth portion; the second rotation axis and a third plane including the display surface overlapping with the fourth portion be parallel to each other; the second plane and the second rotation axis be parallel to each other; a distance between the second plane and the second rotation axis be greater than zero; and a distance between the third plane and the second rotation axis be greater than zero.

In the above, it is also preferable that the distance between the second plane and the second rotation axis be greater than or equal to 0.1 mm and less than or equal to 20 mm and the distance between the third plane and the second rotation axis be greater than or equal to 0.1 mm and less than or equal to 20 mm.

In the above, it is also preferable that the distance between the second plane and the second rotation axis and the distance between the third plane and the second rotation axis be substantially equal to each other.

In the above, it is also preferable that the second support body and the third support body be capable of relatively rotating on the second rotation axis by an angle greater than 180 degrees.

In the above, it is also preferable that the second rotation axis be positioned on a side in a direction of a normal vector to the second display surface when the second plane and the third plane are identical with each other when the second plane and the third plane are identical with each other, and that the display panel be foldable so that a fifth display surface overlapping with the fifth portion becomes a concave surface. Alternatively, it is preferable that the second rotation axis be positioned on a side opposite to the direction of the normal vector to the second display surface when the second plane and the third plane are identical with each other, and that the display panel be foldable so that the fifth display surface overlapping with the fifth portion becomes a convex surface.

An electronic device with high portability can be provided. Alternatively, an electronic device with high browsability can be provided. Alternatively, an electronic device with high reliability can be provided. Alternatively, a novel display device or electronic device can be provided. Note that the descriptions of these effects do not disturb the existence of other effects. Note that one embodiment of the present invention does not necessarily need to have all the above effects. Note that effects other than these will be apparent from the descriptions of the specification, drawings, claims, and the like, and effects other than these can be derived from the descriptions of the specification, drawings, claims, and the like.

BRIEF DESCRIPTION OF THE DRAWINGS

FIGS. 11A to 11D show diagrams illustrating examples of light-emitting panels according to an embodiment.

DETAILED DESCRIPTION OF THE INVENTION

Figure 1A:
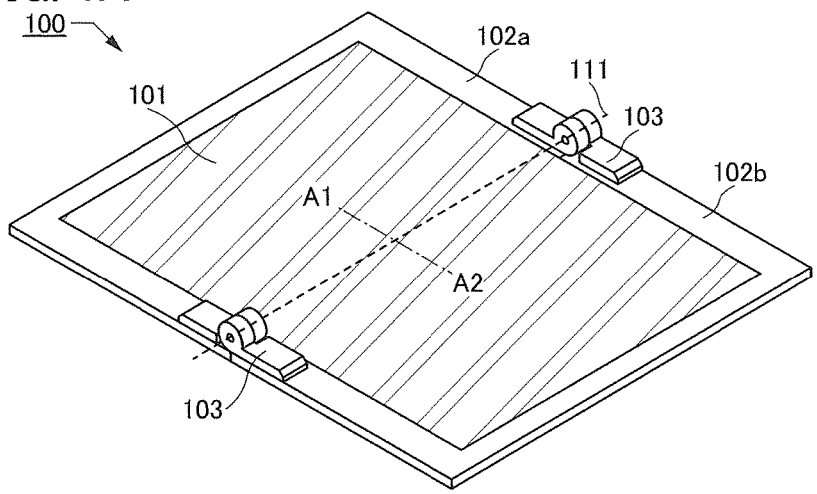
FIGS. 1A to 1C show structure examples of an electronic device according to an embodiment.

Embodiments will be described in detail with reference to drawings. Note that the present invention is not limited to the following description, and it will be easily understood by those skilled in the art that various changes can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and repetitive description thereof is omitted. Furthermore, the same hatch pattern is applied to similar functions, and these are not especially denoted by reference numerals in some cases.

Note that in each drawing described in this specification, the size, the layer thickness, or the region of each component is exaggerated for clarity in some cases. Therefore, it is not necessarily limited to such scales.

Note that ordinal numbers such as "first" and "second" in this specification and the like are used in order to avoid confusion among components, and do not limit the components numerically.

Note that in this specification and the like, a plane A being parallel to a plane B means a state in which an angle between a normal to the plane A and a normal to the plane B is greater than or equal to −20° and less than or equal to 20°. In addition, in this specification and the like, a plane C being perpendicular to the plane B means a state in which an angle between a normal to the plane C and the normal to the plane B is greater than or equal to 70° and less than or equal to 110°. In addition, in this specification and the like, a line D being perpendicular to the plane B means a state in which an angle between the line D and the normal to the plane B is greater than or equal to −20° and less than or equal to 20°. In addition, in this specification and the like, a line E being parallel to the plane B means a state in which an angle between the line E and the normal to the plane B is greater than or equal to 70° and less than or equal to 110°.

(Embodiment 1)

In this embodiment, a structure example of an electronic device in one embodiment of the present invention will be described with reference to drawings.

[Structure Example 1]

FIG. 1A is a perspective view of an electronic device 100 described in this structure example. The electronic device 100 includes a display panel 101, a support body 102a, a support body 102b, and a hinge 103.

The support body 102a and the support body 102b are connected by the hinge 103. The support body 102a and the support body 102b can be relatively rotated on a rotation axis 111 of the hinge 103. In the structure example illustrated in FIG. 1A, the support body 102a and the support body 102b can be relatively rotated on the rotation axis 111 by an angle greater than or equal to 180° from a state where the support body 102a and the support body 102b are set horizontal.

Here, the rotation axis 111 of the hinge 103 refers to a straight line corresponding to a rotation axis of a rotation mechanism of the hinge 103. For example, in the case where the hinge 103 has a mechanism to rotate on an axis of a spindle or the like that is a tangible object, a straight line corresponding to an extending direction of the axis is the rotation axis 111.

The display panel 101 includes a display surface where an image or the like to be viewed by a user is displayed. Note that in this specification and the like, the display surface refers to a surface of a display panel on a side where an image or the like is displayed.

The display panel 101 has flexibility at least partly. Therefore, the display panel 101 can be reversibly changed in shape from a state where the display surface is planar into a state where it has a curved surface. The display panel 101 has flexibility at least in a portion which is changed in shape with a change in the relative position of the two support bodies, and does not necessarily have flexibility in other portions.

Furthermore, part of the display panel 101 is supported by the support body 102a and another part thereof is supported by the support body 102b.

The electronic device 100 of one embodiment of the present invention has a structure in which the display panel 101 having flexibility is supported by two support bodies. The display panel 101 can be changed in shape by bending or the like. For example, the display panel 101 can be bent so that the display surface faces inward (bent inward). The display panel 101 can also be folded by bending. The electronic device 100 of one embodiment of the present invention has high portability with the display panel 101 folded, and has high browsability with a seamless large display region in an opened state.

Figure 1B:
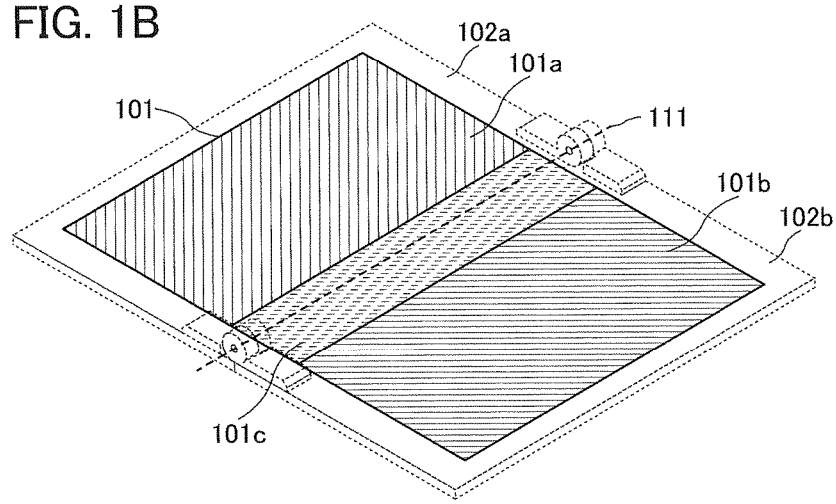

FIG. 1B is a schematic diagram illustrating each region (also referred to as portion) of the display panel 101. The display panel 101 has a portion 101a supported by the support body 102a in a portion overlapping with the support body 102a. In addition, the display panel 101 has a portion 101b supported by the support body 102b in a portion overlapping with the support body 102b. Furthermore, the display panel 101 has a portion 101c not fixed to either of the support bodies between the portion 101a and the portion 101b.

In the portion 101a, the display panel 101 is preferably supported by the support body 102a such that the display surface of the display panel 101 is planar. Similarly, in the portion 101b, the display panel 101 is preferably supported by the support body 102b such that the display surface of the display panel 101 is horizontal.

In addition, the display panel 101 is preferably supported by each support body so as to slide in a direction parallel to a bending direction. For example, the display panel 101 is preferably supported by each support body such that its position in the thickness direction is fixed. At this time, it is preferable that the display panel 101 can slide in the bending direction of the directions parallel to the display surface and its position in a direction perpendicular thereto be fixed. By using such a supporting method, when the support bodies are relatively rotated from a state in which the display panel 101 is set planar into a state in which it is bent by 180°, a slight difference in the length of the display panel 101 between the two states can be corrected by the slide operation, whereby damage to the display panel 101 can be reduced. Alternatively, one of the plurality of support bodies and the display panel 101 may be fixed to each other such that the display panel 101 does not slide. Furthermore, part of the display panel 101 may have elasticity. Expansion and contraction of part of the display panel 101 can correct the above difference in length. Furthermore, the display panel 101 may be fixed to each support body such that the portion 101c of the display panel 101 loosens in the state where the display panel 101 is opened. By the looseness of the display panel 101, the above difference in length can be corrected.

A method for supporting the display panel 101 with each support body is not particularly limited. For example, by using a method in which the display panel 101 is sandwiched between two members that are processed such that grooves in which the display panel 101 can be fitted are formed, the display panel 101 can be supported so as to slide. In the case where the display panel 101 and each support body are fixed to each other, examples include an attaching method, a fixing method with screws or the like, a mechanically fixing method in which the display panel 101 is sandwiched between members, and the like.

In addition, the areas of the portion 101a and the portion 101b are not particularly limited, and the display panel 101 includes at least two regions supported by respective support bodies and one or more regions not supported by (fixed to) either of the support bodies therebetween. For example, the display panel 101 may be supported in a region overlapping with an edge of each support body, and the entire visible region may be the portion 101c not supported by the support bodies.

Figure 1C:
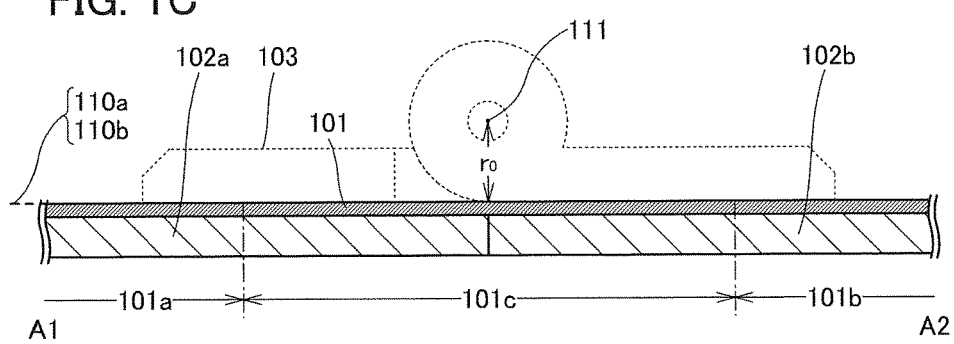

FIG. 1C is a schematic cross-sectional view along cutting-plane line A1-A2 in FIG. 1A. In addition, in FIG. 1C, the hinge 103 is indicated by a broken line in order to show the positional relationship between each component and the hinge 103.

Each of FIGS. 1A to 1C illustrates the case where the support body 102a and the support body 102b are positioned so that the entire display surface of the display panel 101 is set planar, in other words, the case where a first plane 110a including the display surface in the portion 101a of the display panel 101 and a second plane 110b including the display surface in the portion 101b of the display panel 101 are parallel to each other.

At this time, the rotation axis 111 of the hinge 103 is provided so as to overlap with the portion 101c of the display panel 101 (i.e., so as to be positioned over the portion 101c). Furthermore, as illustrated in FIG. 1C, a distance between the rotation axis 111 and the display surface is preferably provided so as to be apart from each other by a distance $r_0$ to prevent the rotation axis 111 of the hinge 103 and the display surface of the display panel 101 from corresponding to each other (i.e., to prevent the rotation axis 111 from being positioned in a plane including the display surface). That is, the hinge 103 is preferably provided so that each of the distance between the first plane 110a and the rotation axis 111 and the distance between the second plane 110b and the rotation axis 111 has a value greater than zero. Furthermore, when the first plane 110a and the second plane 110b are identical with each other (i.e., positioned on the same plane), the rotation axis 111 is provided on a display surface side of the display panel 101 (specifically, a side in a direction of a normal vector to the display surface) so as to be in a position apart from the display surface.

Furthermore, as illustrated in FIG. 1C, it is preferable that the display surface of the display panel 101 and the rotation axis 111 be parallel to each other. That is, it is preferable that the first plane 110a and the rotation axis 111 be parallel to each other and the second plane 110b and the rotation axis 111 be parallel to each other.

Note that there may be a case where a plane including the display surface (here, a plane including the first plane 110a and the second plane 110b) and the rotation axis 111 are not exactly parallel to each other when the display surface of the display panel 101 is set planar. At this time, it is acceptable as long as the first plane 110a or the second plane 110b and the rotation axis 111 do not intersect with each other at least in a region overlapping with the display surface of the display panel 101. Note that in the case where the plane including the display surface and the rotation axis 111 are not exactly parallel to each other (i.e., in the case where the angle between the normal direction to the display surface and the rotation axis 111 is not exactly 90°), the distance $r_0$ between the rotation axis 111 and the display surface (or the first plane 110a or the second plane 110b) can be a distance $r_0$ having the smallest value between the display surface (or the first plane 110a or the second plane 110b) and a line overlapping with the display surface of the display panel 101 on a straight line including the rotation axis 111.

Figure 2A:
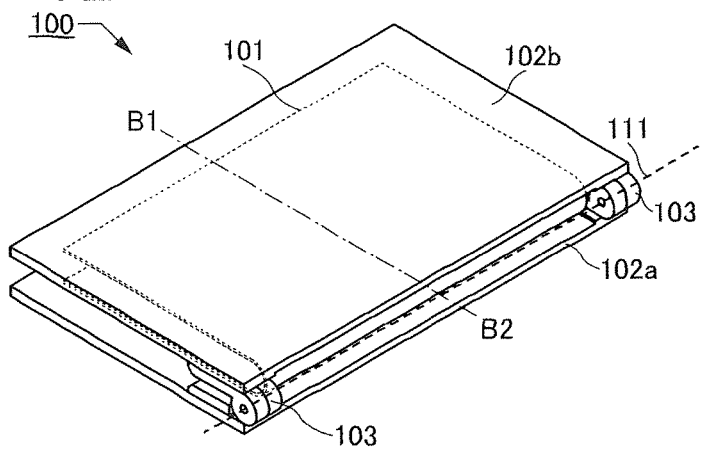
FIGS. 2A to 2C show structure examples of an electronic device according to an embodiment.
Figure 2B:
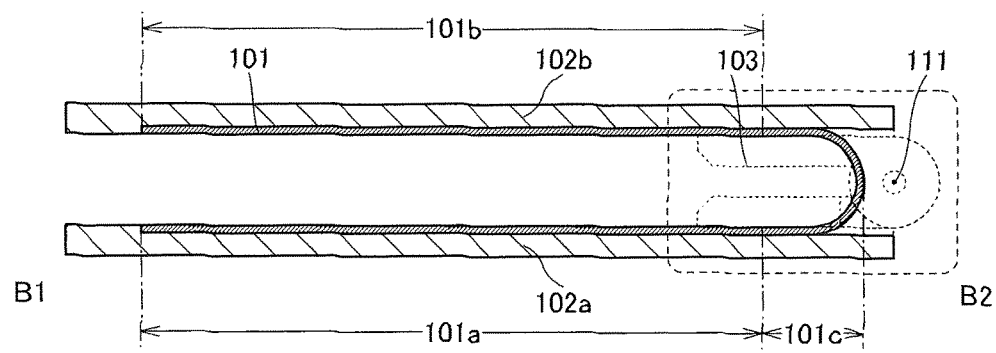

FIG. 2A is a schematic perspective view of the electronic device 100 in a state where the support body 102b is rotated on the rotation axis 111 by 180° to the support body 102a. In addition, FIG. 2B is a schematic cross-sectional view along cutting-plane line B1-B2 in FIG. 2A. Furthermore, FIG. 2C is an enlarged schematic cross-sectional view of a region enclosed by a broken line in FIG. 2B.

Figure 2C:
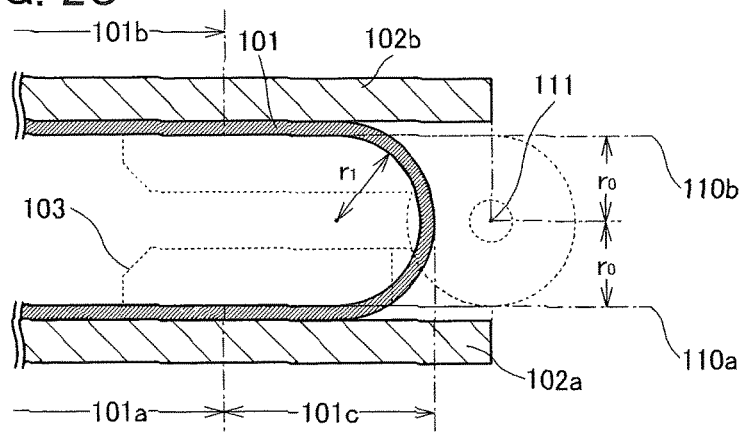

As illustrated in FIGS. 2B and 2C, the display panel 101 has a portion where the display surface in the portion 101c is curved by 180° so as to be concave. In addition, the first plane 110a including part of the display surface in the portion 101a of the display panel 101 and the plane 110b including part of the display surface in the portion 101b are parallel to each other.

At this time, the distance between the first plane 110a and the rotation axis 111 and the distance between the second plane 110b and the rotation axis 111 are preferably set to the same distance ($r_0$). When these distances are equal, the entire display surface of the display panel 101 can be set flat (planar) with no step (level difference) generated on the surface of the display panel 101 positioned between the support body and the support body, in a state where the two support bodies are opened as illustrated in FIGS. 1A to 1C. Accordingly, the electronic device 100 with high visibility can be realized.

Part of the portion 101c of the display panel 101 is curved depending on the angle made by the two support bodies. Furthermore, each of the two support bodies rotates on the rotation axis 111 while being supported by the hinge 103. Therefore, the direction of force to which the portion 101c of the display panel 101 is subjected when the angle between the two support bodies is changed is a direction parallel to the rotation direction of the support bodies, in other words, a direction perpendicular to a contact surface between each support body and the display panel 101. That is, most components of force applied to the portion 101c of the display panel 101 are in a direction parallel to the thickness direction of the display panel 101, that is, a direction in which the display panel 101 is curved. Therefore, the display panel 101 is not subjected to excessive force; thus, damage to the curved portion of the display panel 101 can be effectively reduced.

In addition, as illustrated in FIG. 2C, when the first plane 110a and the second plane 110b are parallel to each other, the curvature radius $r_1$ of the curved portion of the display panel 101 is substantially equal to the distance $r_0$.

Figure 3A:
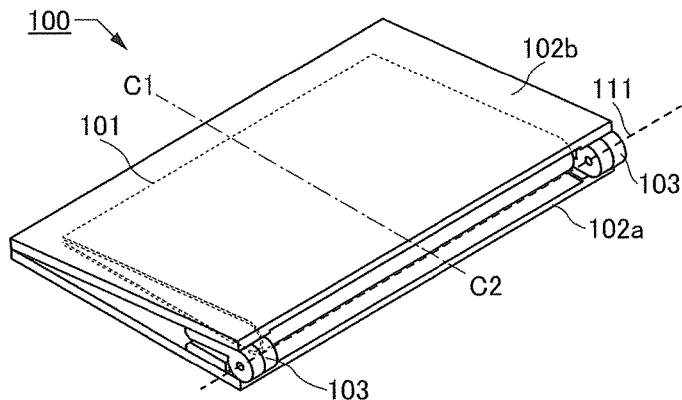
FIGS. 3A to 3C show structure examples of an electronic device according to an embodiment.
Figure 3B:
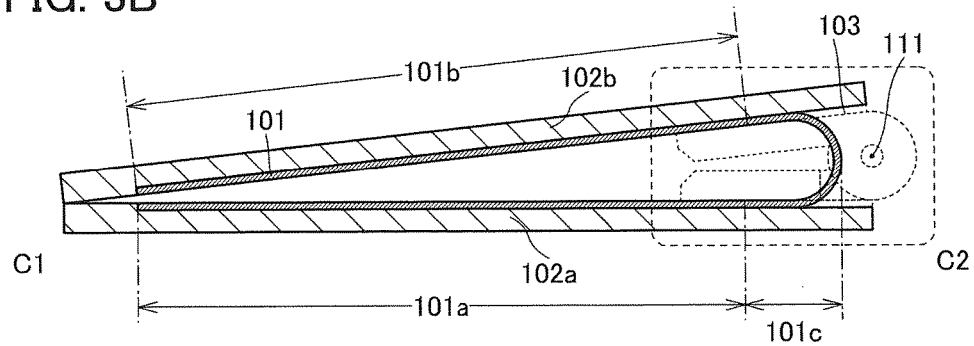

FIG. 3A is a schematic perspective view of the electronic device 100 in a state where the support body 102b is rotated on the rotation axis 111 by an angle greater than 180° to the support body 102a. In addition, FIG. 3B is a schematic cross-sectional view along cutting-plane line C1-C2 in FIG. 3A. Furthermore, FIG. 3C is an enlarged schematic cross-sectional view of a region enclosed by a broken line in FIG. 3B.

Figure 3C:
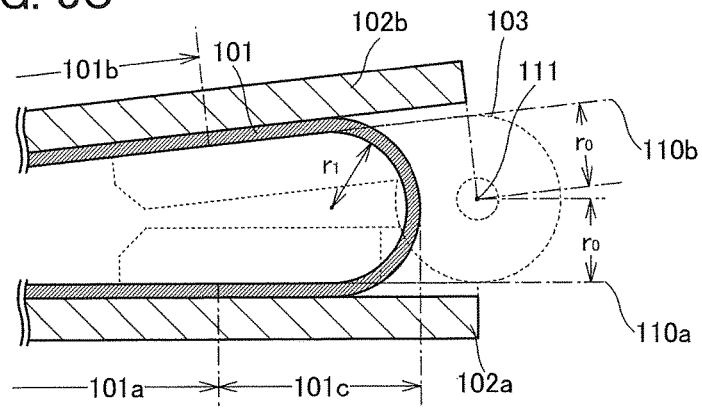

Each of FIGS. 3A to 3C illustrates a state where the support body 102a and the support body 102b are rotated such that respective end portions of the two support bodies on sides opposite to the hinge 103 are in contact with each other.

As illustrated in FIG. 3C, when the two support bodies are rotated by an angle greater than 180° from a state where the display panel 101 is set flat, the curvature radius $r_1$ of the portion 101c of the display panel 101 is smaller than the distance $r_0$ between the first plane 110a (or the second plane 110b) and the rotation axis 111 of the hinge 110.

Here, the curvature radius $r_1$ of the curved portion of the display panel 101 refers to a curvature radius of the curved display surface which has the smallest value. As the angle of rotation from the state where the display panel 101 is set flat increases, the value of the curvature radius $r_1$ with respect to the distance $r_0$ decreases. For example, the curvature radius $r_1$ at a rotation angle of 185° is approximately 0.93 times the distance $r_0$, the curvature radius $r_1$ at a rotation angle of 190° is approximately 0.87 times the distance $r_0$, and the curvature radius $r_1$ at a rotation angle of 195° is approximately 0.82 times the distance $r_0$.

When the angle of rotation from the state where the display panel 101 is set flat is greater than 180°, the thickness of the electronic device 100 in a state where the two support bodies are folded can be partially small; thus, the electronic device with high portability can be realized. For example, the maximum value of the rotation angle may be set in a range greater than 180° and less than or equal to 200°, preferably greater than 180° and less than or equal to 195°, more preferably greater than 180° and less than or equal to 190°.

Damage to the curved portion of the display panel 101 can be reduced by setting the distance $r_0$ between the first plane 110a (or the second plane 110b) and the rotation axis 111 of the hinge 110 in view of the maximum value of the rotation angle and the minimum curvature radius allowable to the display panel 101.

For example, when the distance between the first plane 110a and the rotation axis 111 and the distance between the second plane 110b and the rotation axis 111 are equal to each other and are each $r_0$, the value of $r_0$ is preferably set larger than or equal to 0.1 mm and smaller than or equal to 20 mm, preferably larger than or equal to 0.5 mm and smaller than or equal to 15 mm, more preferably larger than or equal to 1 mm and smaller than or equal to 10 mm, and is typically preferably set to 4 mm. As $r_0$ decreases, the thickness of the electronic device 100 in the state where the support bodies are folded can be reduced; thus, the electronic device 100 with high portability can be realized.

Furthermore, the thickness of the display panel 101 is preferably larger than or equal to 5 μm and smaller than or equal to 2000 μm, preferably larger than or equal to 5 μm and smaller than or equal to 1000 μm, more preferably larger than or equal to 10 μm and smaller than or equal to 500 μm, further preferably larger than or equal to 20 μm and smaller than or equal to 300 μm. As the thickness of the display panel 101 decreases, the minimum allowable curvature radius can be decreased; thus, the thickness of the electronic device 100 can be decreased.

In the case where the display panel 101 is too thin to have a sufficient mechanical strength, the strength may be supplemented by attaching a sheet having flexibility or the like to at least the curving portion of the display panel 101. For example, besides an elastic body of hard rubber or the like, plastic, a metal such as aluminum, an alloy such as stainless steel or a titanium alloy, rubber such as silicone rubber, or the like can be used. A material having lower flexibility than the display panel 101 is preferably used for the sheet. In the case where the sheet does not have a light transmitting property, it may be placed on a back surface side of the display panel 101 or in a region outside a display region of the display surface. A structure may be employed in which a sheet having an opening in a portion overlapping with the display surface is placed on a display surface side and the display panel is sandwiched between two sheets.

The curvature radius $r_1$ in the state where the two support bodies are folded, i.e., a state where the curved portion of the display panel 101 is curved with the smallest curvature radius, is preferably set larger than or equal to 0.1 mm and smaller than or equal to 20 mm, preferably larger than or equal to 0.5 mm and smaller than or equal to 15 mm, more preferably larger than or equal to 1 mm and smaller than or equal to 10 mm, and is typically preferably set smaller than or equal to 4 mm.

Here, a module including a touch sensor is preferably provided by being stacked on the display surface side of the display panel 101. At this time, it is preferable that at least part of the module including the touch sensor have flexibility and can be curved along the display panel 101. At this time, the module including the touch sensor and the display panel 101 may be attached to each other with an adhesive or the like, or a polarizing plate or a buffer material (separator) may be provided therebetween. In addition, the thickness of the module including the touch sensor is preferably smaller than or equal to the thickness of the display panel 101.

Alternatively, the display panel 101 may function as a touch panel. For example, a structure of an on-cell touch panel or an in-cell touch panel may be employed as the display panel 101. By using the structure of the on-cell or in-cell touch panel, the thickness can be reduced even when the function of a touch panel is added to the display panel 101.

In addition, the structure of the hinge 103 is not limited to the structure illustrated in FIGS. 1A to 1C or the like, and ones in a variety of modes can be used. Furthermore, part of the support body 102a or the support body 102b may have a mode of functioning as the hinge 103. Moreover, although a pair of hinges 103 are provided in the structure of FIGS. 1A to 1C or the like, one hinge or three or more hinges may be provided.

Note that electronic components, for example, a battery, a printed wiring board on which a variety of ICs such as an arithmetic device and a driver circuit are mounted, a wireless receiver, a wireless transmitter, a wireless power receiver, and a variety of sensors such as an acceleration sensor are incorporated as appropriate into one of the support body 102a and the support body 102b, or both, so that the electronic device 100 can function as a portable terminal, a portable image reproducing device, a portable lighting device, or the like. A camera, a speaker, a variety of input/output terminals such as a power supply terminal and a signal supply terminal, a variety of sensors such as an optical sensor, an operation button, or the like may also be incorporated into one of the support body 102a and the support body 102b, or both.

The above is the description of the structure example 1.

[Structure Example 2]

A structure example of an electronic device 120 whose structure is partly different from the above structure example 1 will be described below. Note that description of portions overlapping with those in the structure example 1 may be omitted in some cases.

Figure 4A:
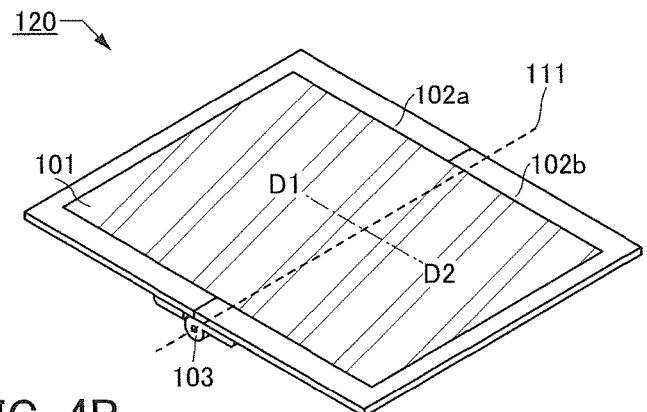
FIGS. 4A to 4C show structure examples of an electronic device according to an embodiment.
Figure 4B:
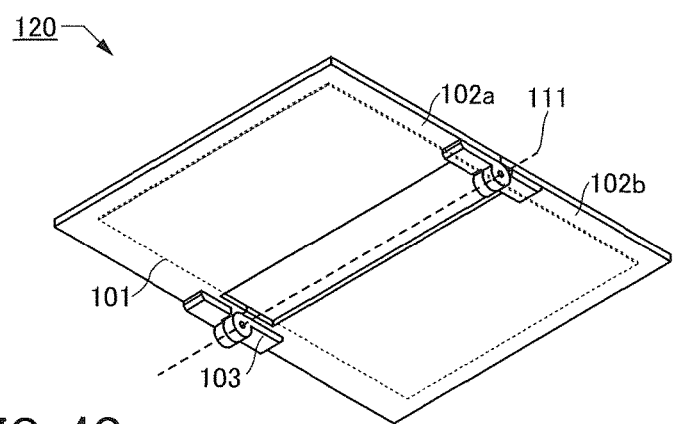
Figure 4C:
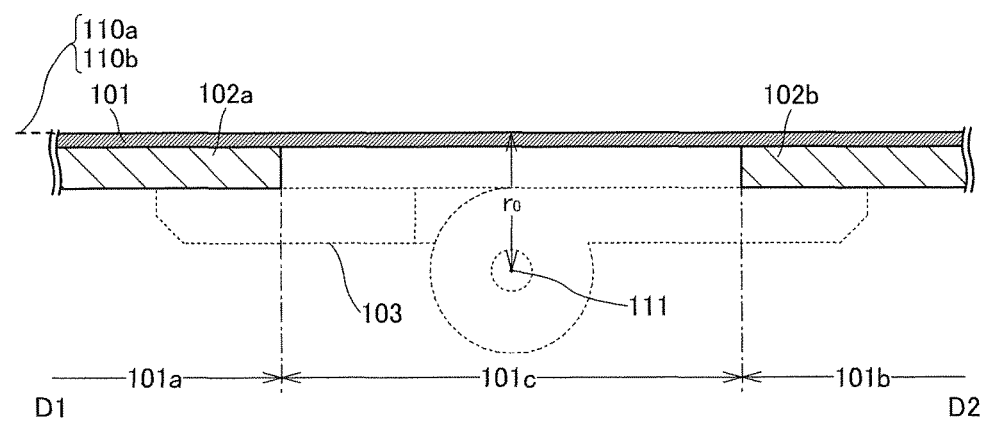

FIG. 4A is a perspective view of a display surface side of the electronic device 120, and FIG. 4B is a perspective view of a back surface side. In addition, FIG. 4C is a schematic cross-sectional view along cutting-plane line D1-D2 in FIG. 4A.

The electronic device 120 differs from the electronic device 100 exemplified in the above structure example 1 mainly in that the position of the hinge 103 is different and in that the shapes of the support body 102a and the support body 102b are different.

The electronic device 120 of one embodiment of the present invention has a structure in which the display panel 101 having flexibility is supported by two support bodies. The display panel 101 can be changed in shape by bending or the like. For example, the display panel 101 can be bent so that a display surface faces outward (bent outward). The display panel 101 can also be folded by bending. The electronic device 120 of one embodiment of the present invention has high portability with the display panel 101 folded, and has high browsability of display with a seamless large display region in an opened state.

The hinge 103 is provided such that the rotation axis 111 thereof is positioned on a side opposite to the display surface of the display panel 101. In a structure illustrated in FIGS. 4A to 4C, the hinge 103 is provided on a side opposite to surfaces of the support body 102a and the support body 102b where the display panel 101 is provided. Furthermore, when the first plane 110a including the display surface in the portion 101a of the display panel 101 and the second plane 110b including the display surface in the portion 101b of the display panel 101 are identical with each other, the rotation axis 111 is provided on a side opposite to the display surface of the display panel 101 (specifically, a side opposite to a direction of a normal vector to the display surface) so as to be in a position apart from the display surface.

In addition, the support body 102a and the support body 102b have a cut-out portion at least in a region overlapping with the portion 101c of the display panel 101. In FIG. 4C, a portion overlapping with the support body 102a of the display panel 101 is the portion 101a, a portion overlapping with the support body 102b is the portion 101b, and a portion overlapping with the cut-out portion is the portion 101c. Note that the entire portion overlapping with the support body 102a (or the support body 102b) in the display panel 101 does not need to be supported by the support body 102a (or the support body 102b) and it is acceptable as long as it is partly supported as in the structure example 1.

The support body 102a and the support body 102b can be relatively rotated on the rotation axis 111 by an angle greater than or equal to 180° so that the display surface in the portion 101c of the display panel 101 becomes convex.

Figure 5A:
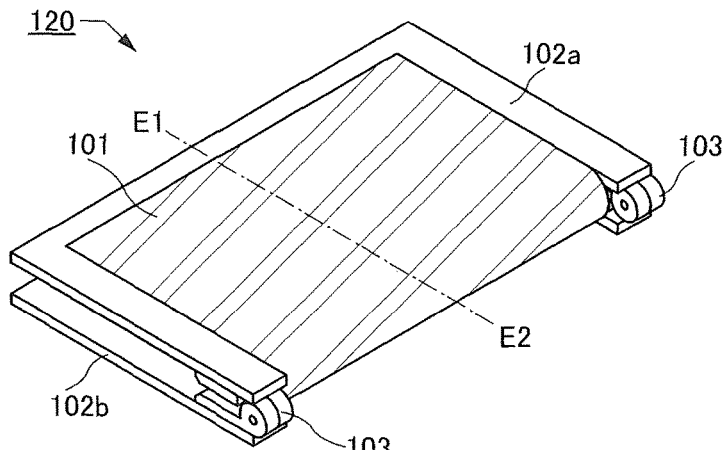
FIGS. 5A to 5C show structure examples of an electronic device according to an embodiment.
Figure 5B:
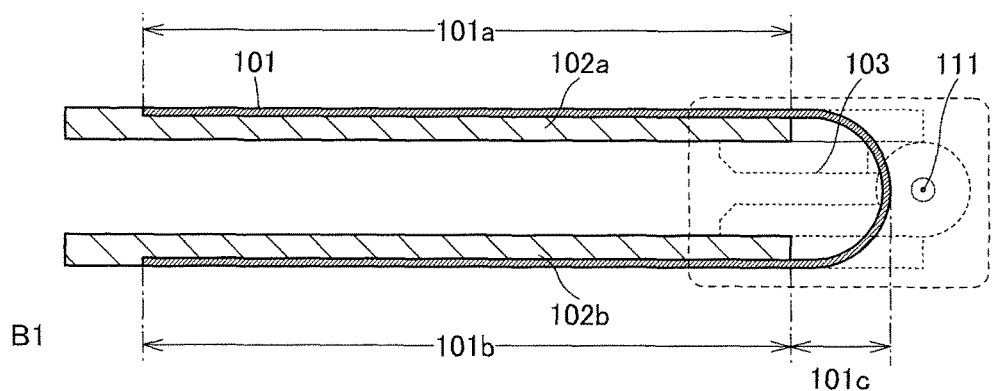

FIG. 5A is a schematic perspective view of the electronic device 120 in a state where the support body 102b is rotated on the rotation axis 111 by 180° to the support body 102a. In addition, FIG. 5B is a schematic cross-sectional view along cutting-plane line E1-E2 in FIG. 5A. Furthermore, FIG. 5C is an enlarged schematic cross-sectional view of a region enclosed by a broken line in FIG. 5B.

Figure 5C:
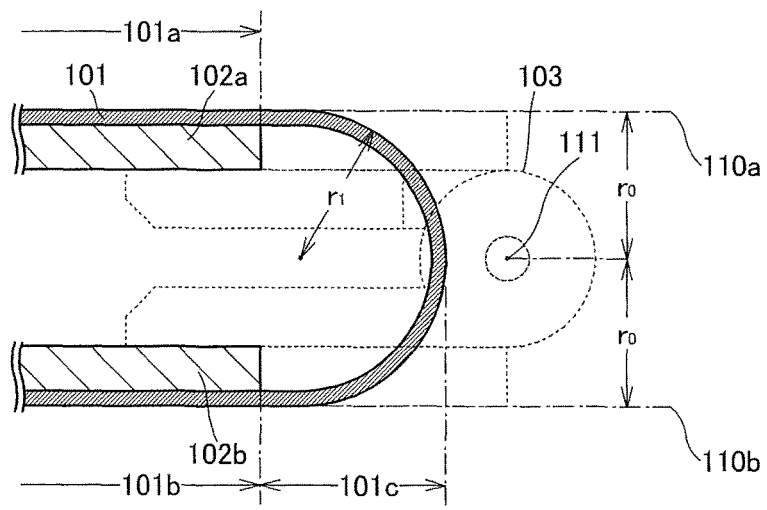

As illustrated in each of FIGS. 5A to 5C, the display panel 101 is curved such that part of the display surface in the portion 101c is changed in shape so as to be convex. At this time, the cut-out portion provided in the support body 102a and the support body 102b allows the display panel 101 to be curved without physical interference of the display panel 101 and each support body with each other.

Figure 6:
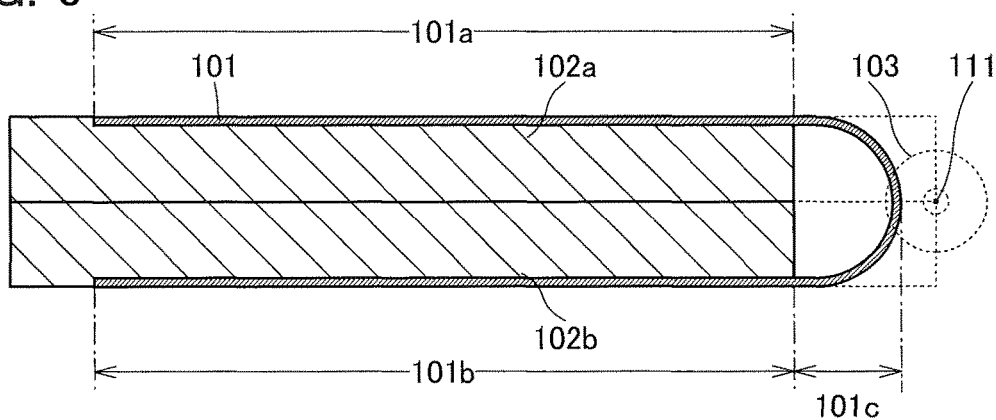
FIG. 6 shows a structure example of an electronic device according to an embodiment.

Note that a structure may be employed in which back surface sides of the support body 102a and the support body 102b are in contact with each other when the display panel 101 is bent 180° as illustrated in FIG. 6.

Figure 7A:
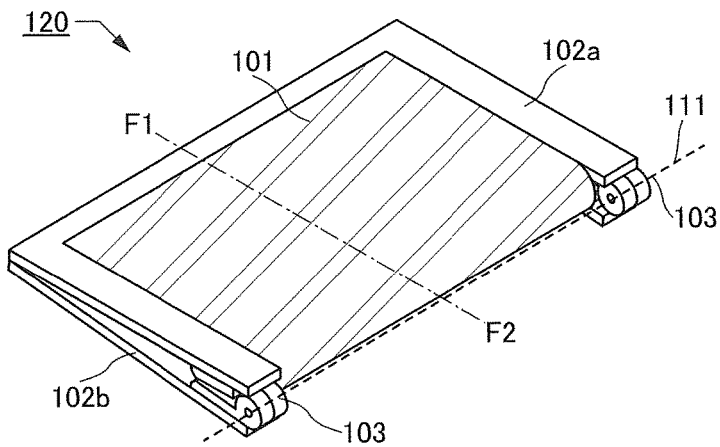
FIGS. 7A to 7C show structure examples of an electronic device according to an embodiment.
Figure 7B:
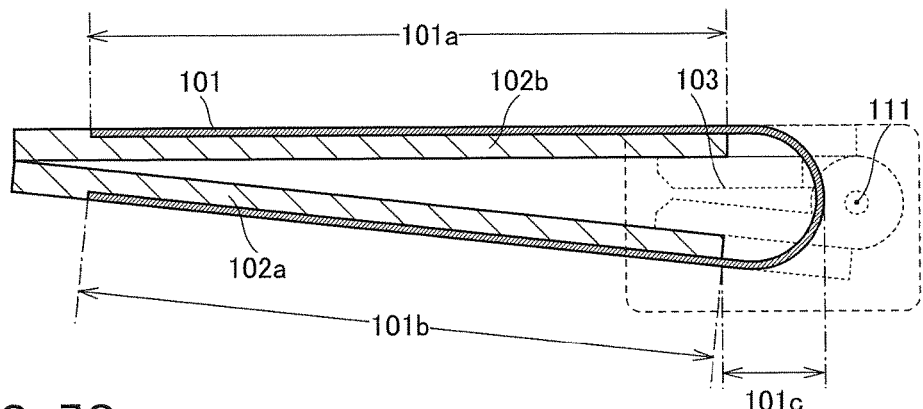

FIG. 7A is a schematic perspective view of the electronic device 120 in a state where the support body 102b is rotated on the rotation axis 111 by an angle greater than 180° to the support body 102a. In addition, FIG. 7B is a schematic cross-sectional view along cutting-plane line F1-F2 in FIG. 7A. Furthermore, FIG. 7C is an enlarged schematic cross-sectional view of a region enclosed by a broken line in FIG. 7B.

When the two support bodies are thus rotated by an angle greater than 180° from a state where the display panel 101 is set flat, the thickness of the electronic device 120 in a state where the two support bodies are folded can be partially small; thus, the electronic device with high portability can be realized.

Figure 7C:
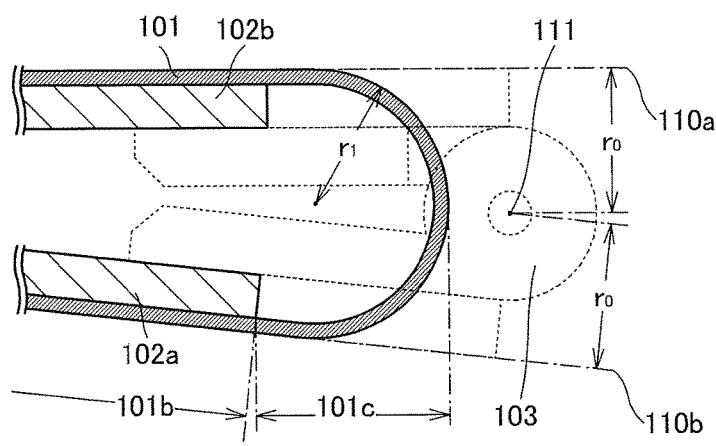

As illustrated in FIG. 7C, when the two support bodies are rotated by an angle greater than 180° from the state where the display panel 101 is set flat, the curvature radius $r_1$ of the portion 101c of the display panel 101 is smaller than the distance $r_0$ between the first plane 110a (or the second plane 110b) and the rotation axis 111 of the hinge 110.

The above is the description of the structure example 2.

[Structure Example 3]

A structure example of an electronic device 130 whose structure is partly different from the above structure example will be described below. Note that description of portions overlapping with those in the above structure example may be omitted in some cases.

Figure 8A:
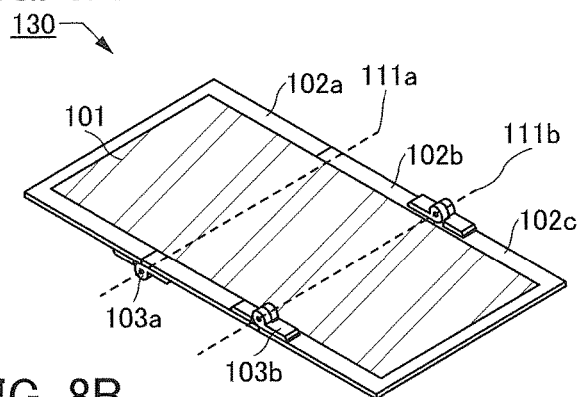
FIGS. 8A to 8D show structure examples of an electronic device according to an embodiment.
Figure 8B:
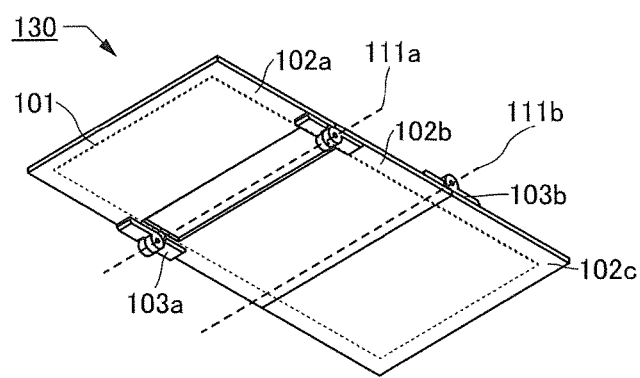

FIG. 8A is a perspective view of a display surface side of the electronic device 130, and FIG. 8B is a perspective view of a back surface side.

The electronic device 130 differs mainly in including a support body 102c in addition to the electronic device 120 exemplified in the structure example 2.

The support body 102a and the support body 102b are connected to each other by a hinge 103a. The support body 102b and the support body 102c are connected to each other by a hinge 103b. The display panel 101 includes regions supported by the support body 102a, the support body 102b, and the support body 102c, respectively. In addition, the display panel 101 includes regions not supported by the support bodies between the region supported by the support body 102a and the region supported by the support body 102b and between the region supported by the support body 102b and the region supported by the support body 102c.

The electronic device 130 of one embodiment of the present invention has a structure in which the display panel 101 having flexibility is partly supported by three support bodies. The electronic device 130 includes a region where the display panel 101 can be bent so that a display surface faces inward (bent inward) and a region where the display panel 101 can be bent so that the display surface faces outward (bent outward).

The display panel 101 can also be folded by bending. The electronic device 130 of one embodiment of the present invention has high portability with the display panel 101 folded, and has high browsability of display with a seamless large display region in an opened state.

When the display surface of the display panel 101 is set planar as illustrated in FIG. 8A, a rotation axis 111a of the hinge 103a is provided so as to be positioned on a side opposite to the display surface as in the structure example 2. In addition, at this time, a rotation axis 111b of the hinge 103b is provided so as to be positioned on a display surface side as in the structure example 1.

The support body 102a and the support body 102b can be relatively rotated on the rotation axis 111a of the hinge 103a by an angle greater than or equal to 180° so that the display surface of the display panel 101 becomes convex as in the structure example 2.

The support body 102b and the support body 102c can be relatively rotated on the rotation axis 111b of the hinge 103b by an angle greater than or equal to 180° so that the display surface of the display panel 101 becomes concave as in the structure example 1.

Figure 8C:
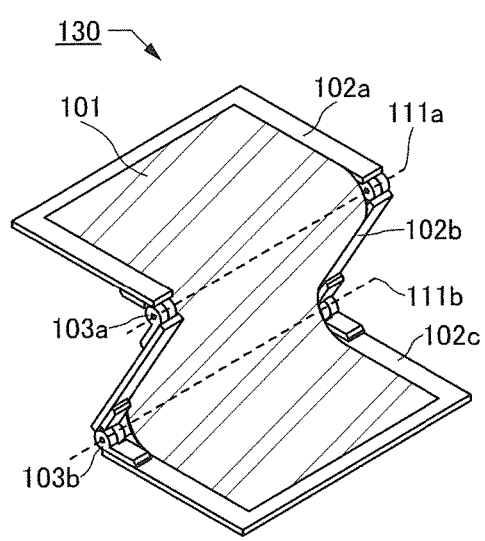
Figure 8D:
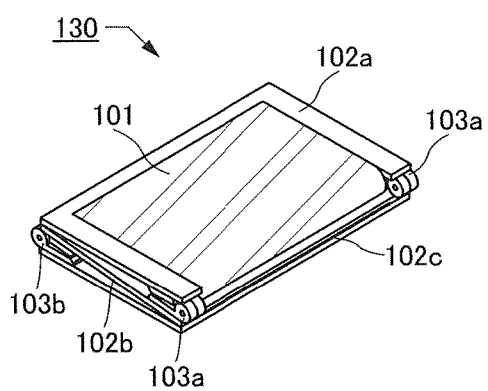

By relatively rotating the support bodies on the rotation axis 111a and the rotation axis 111b, the electronic device 130 can be changed in shape into a folded state illustrated in FIG. 8D through the mode illustrated in FIG. 8C.

As illustrated in FIG. 8D, the support body 102a and the support body 102c can be set parallel to each other by folding the electronic device 130 such that an angle made by facing planes of the support body 102a and the support body 102b and an angle made by facing planes of the support body 102b and the support body 102c are equal to each other. This is preferable because the thickness of the electronic device 130 in the folded state can be uniform.

In addition, the thickness of the electronic device 130 can be reduced by folding the electronic device 130 such that both the above two angles are acute angles as illustrated in FIG. 8D, as compared with the case where the three support bodies are set parallel.

To use the electronic device 130 of one embodiment of the present invention, the display panel 101 may be opened as illustrated in FIG. 8A so that the entire display surface can be used as a seamless large display surface, or part of the display surface can be used in the folded state as illustrated in FIG. 8D. When the display panel 101 is folded inward, part of the display surface that is hidden from a user is put in a non-display (non-operation) state, leading to a reduction in power consumption of the display panel 101.

Furthermore, only the support body 102a may be rotated to a back side to use part of the display surface overlapping with the support body 102b and the support body 102c. At this time, a portion of the display surface which overlaps with the support body 102a may display an image or the like or may be put in a non-display (non-operation) state. This portion can also be used as a touch pad.

A convexly curved portion of the display surface can display notification of an incoming e-mail, SNS (social networking service), call, or the like; a subject of an e-mail, an SNS, or the like; a sender of an e-mail, an SNS, or the like; the date; the time; remaining battery; the reception strength of an antenna; and the like. Alternatively, an image having a function of an operation button, an icon, a slider, or the like may be displayed.

In addition, the display surface of the display panel 101 is preferably set to have a predetermined aspect ratio in an opened state (e.g., the state illustrated in FIG. 8A). For example, the aspect ratio is set to 9:16 or the like. In addition, the display panel 101 in the folded state (e.g., the state illustrated in FIG. 8D) is preferably set to have a value close to the aspect ratio in the opened state. This enables the aspect ratios of images displayed in the opened and folded states to be substantially equal to each other. Accordingly, in the case where the same image is displayed on the entire display surface visible in the opened and folded states by zooming in or out, generation of an unnatural margin in either state can be reduced.

The above is the description of the structure example 3.

[Structure Example 4]

A more specific structure example will be described below. Note that description of portions overlapping with those in the above structure example may be omitted in some cases.

Figure 9A:
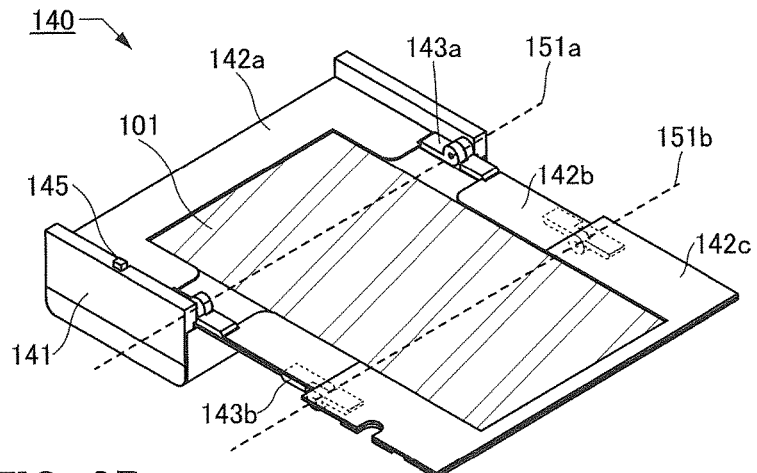
FIGS. 9A to 9C show structure examples of an electronic device according to an embodiment.
Figure 9B:
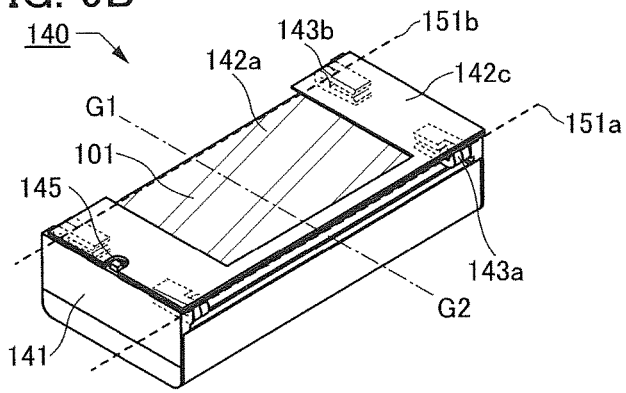

FIG. 9A is a schematic perspective view of an electronic device 140 in a state where the display panel 101 is opened, and FIG. 9B is a schematic perspective view in a state where the display panel 101 is folded.

The electronic device 140 includes the display panel 101, a housing 141, a support body 142a, a support body 142b, a support body 142c, a hinge 143a, and a hinge 143b.

The electronic device 140 can be reversibly changed in shape from the state in FIG. 9A to the state in FIG. 9B by relatively rotating the support bodies on a rotation axis 151a of the hinge 143a and a rotation axis 151b of the hinge 143b.

In addition, the electronic device 140 may include an operation button 145 or the like. For example, the operation button 145 may have a function of switching images displayed on the display surface of the display panel 101, a function of controlling turning on and off power, a function of changing the display panel 101 in shape from the folded state to the opened state, or the like.

Figure 9C:
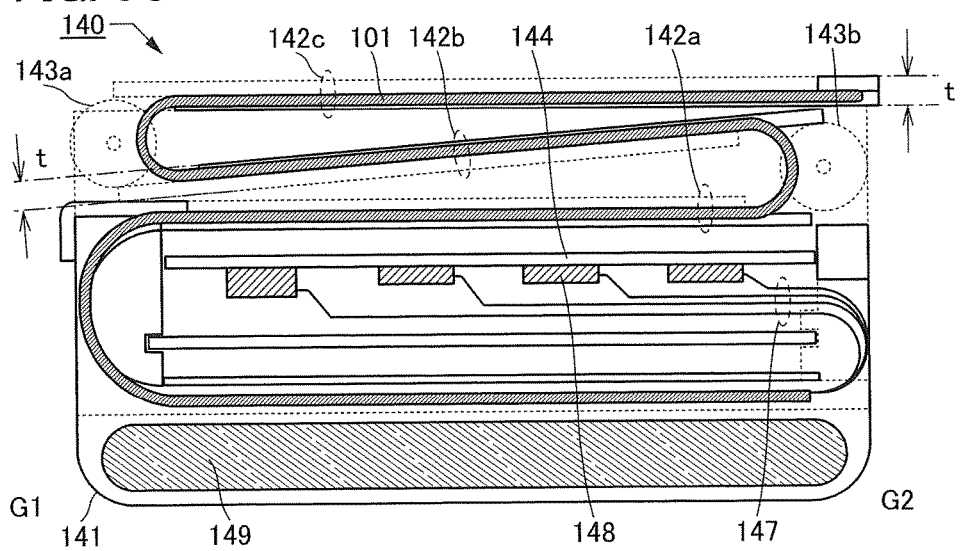

FIG. 9C is a schematic cross-sectional view along cutting-plane line G1-G2 illustrated in FIG. 9B. As illustrated in FIG. 9C, the housing 141 includes a printed board 144, a battery 149, and the like in the inside.

In addition, a plurality of FPCs 147 electrically connected to the display panel 101 are connected to a plurality of terminal connection portions 148 of the printed board 144. Furthermore, power is supplied to the printed board 144 from the battery 149.

As the battery 149, a secondary battery such as a lithium ion battery is preferably used, for example. In addition, the battery 149 preferably includes an antenna and a circuit for controlling charge and discharge and has a wirelessly rechargeable structure.

On the printed board 144, a battery and a variety of ICs such as an arithmetic device and a driver circuit are mounted. Although not illustrated, electronic components, for example, a wireless receiver, a wireless transmitter, a wireless power receiver, and a variety of sensors such as an acceleration sensor are incorporated as appropriate into the housing 141, so that the electronic device 140 can function as a portable terminal, a portable image reproducing device, a portable lighting device, or the like. A camera, a speaker, a variety of input/output terminals such as a power supply terminal and a signal supply termianal, a variety of sensors such as an optical sensor, an operation button, or the like may also be incorporated into the housing 141.

Here, as illustrated in FIG. 9A, the thicknesses of the support body 142b and the support body 142c which do not overlap with the housing 141 in a state where the display panel 101 is opened are preferably small. For example, as illustrated in FIG. 9C, it is preferable that the thicknesses t of the support body 142b and the support body 142c be equal and smaller than the thickness of the housing 141. For example, the thicknesses t of the support body 142b and the support body 142c are preferably larger than or equal to 0.3 mm and smaller than or equal to 10 mm, preferably larger than or equal to 0.3 mm and smaller than or equal to 5 mm, and are typically preferably set to 1 mm. By reducing the thicknesses of the support body 142b and the support body 142c, the weight of the electronic device 140 can be reduced, and the portability can be further improved. In addition, when the thicknesses of the support body 142b and the support body 142c are smaller than that of the housing 141, there is a small difference in the position of the center of gravity between the opened and folded states; thus, the use while supporting only the housing 141 with one hand becomes easy in either state, leading to improvement in convenience.

The above is the description of the structure example 4.

[Modification Example]

Figure 10A:
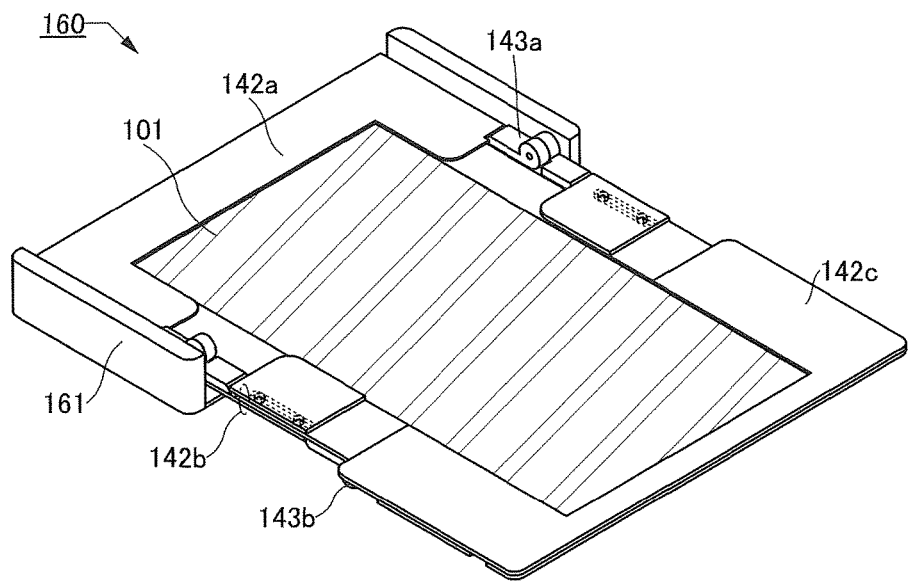
FIGS. 10A to 10B show structure examples of an electronic device according to an embodiment.

FIG. 10A illustrates a schematic perspective view of an electronic device 160. The electronic device 160 differs mainly in the structures of the housing 141 and the support body 142b in the electronic device 140 exemplified in FIGS. 9A to 9C.

A housing 161 of the electronic device 160 is thinner than the housing 141. Therefore, the electronic device 160 has a structure that is easily graspable with one hand.

In addition, the support body 142b of the electronic device 160 has a mechanism with which the length between both ends thereof changes (also referred to as a slide mechanism) so that a distance between the support body 142a and the support body 142c can be changed.

Figure 10B:
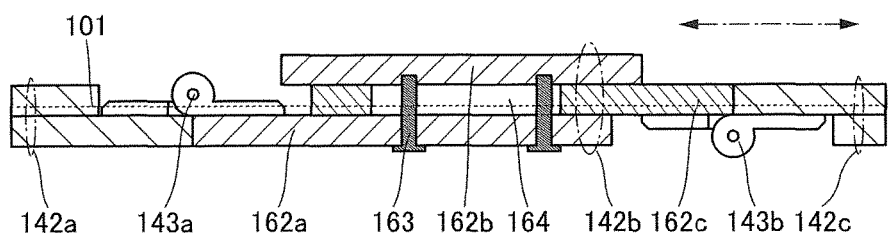

FIG. 10B illustrates a schematic cross-sectional view of the support body 142b and its vicinity. The support body 142b includes a plate-like member 162a, a plate-like member 162b, a plate-like member 162c, and a screw 163.

The member 162a is connected to the hinge 143a. The member 162c is connected to the hinge 143b. In addition, the member 162c has an opening 164. The member 162a and the member 162b are provided to overlap with part of the member 162c such that the opening 164 of the member 162c is sandwiched. In addition, the member 162a and the member 162b are fixed to each other by the screw 163. Furthermore, the member 162a and the member 162c as well as the member 162b and the member 162c are not fixed to each other.

With such a structure, the member 162c can be slid with respect to the member 162a and the member 162b in directions of arrows illustrated in the drawing. Therefore, a distance between the hinge 143a and the hinge 143b can be variable. In other words, a distance between the support body 142a and the support body 142c can be changed.

At this time, it is preferable that the display panel 101 be provided so as to be fixed to each of the support body 142a and the support body 142c and not fixed to the support body 142b.

With such a structure, a slight difference in the length of the display panel 101 which is caused by bending the display panel 101 can be corrected by the slide operation of the support body 142b.

In the structure illustrated in FIG. 10B, the length to which the member 162c can be displaced is determined by the position of the screw 163 and the size of the opening 164. In sliding the member 162c, the slide stops when an end portion of the opening 164 is brought into contact with the screw 163.

Note that the structure illustrated in FIGS. 10A and 10B is one example, and any mechanism with which the length between both ends of the support body 142b can be changed is acceptable without limitation to this structure. A mechanism with which the distance between the hinge 143a and the hinge 143b can be changed may be provided in the electronic device 160. Alternatively, a mechanism with which the distance between the support body 142a and the support body 142c can be changed may be provided in the electronic device 160.

At least part of this embodiment can be implemented as appropriate in combination with any of the other embodiments described in this specification.

(Embodiment 2)

In this embodiment, structure examples and a manufacturing method example of a light-emitting panel that is applicable to a display panel of the electronic device of one embodiment of the present invention will be described.

<Specific Example 1>

FIG. 11A illustrates a plan view of a light-emitting panel, and FIG. 11C illustrates an example of a cross-sectional view along dashed-dotted line A1-A2 in FIG. 11A. The light-emitting panel described in the specific example 1 is a top-emission light-emitting panel using a color filter method. In this embodiment, the light-emitting panel can employ, for example, a structure in which sub-pixels of three colors of R (red), G (green), and B (blue) express one color, or a structure in which sub-pixels of four colors of R (red), G (green), B (blue), and W (white) express one color. There is no particular limitation on a color element, and colors other than R, G, B, and W may be used. For example, yellow, cyan, magenta, and the like may be included.

The light-emitting panel illustrated in FIG. 11A includes a light-emitting portion 804, driver circuit portions 806, and an FPC (Flexible Printed Circuit) 808. Light-emitting elements and transistors included in the light-emitting portion 804 and the driver circuit portions 806 are sealed by a substrate 801, a substrate 803, and a sealing layer 823.

The light-emitting panel illustrated in FIG. 11C includes the substrate 801, an adhesive layer 811, an insulating layer 813, a plurality of transistors, a conductive layer 857, an insulating layer 815, an insulating layer 817, a plurality of light-emitting elements, an insulating layer 821, the sealing layer 823, an overcoat 849, a coloring layer 845, a light-blocking layer 847, an insulating layer 843, an adhesive layer 841, and the substrate 803. The sealing layer 823, the overcoat 849, the insulating layer 843, the adhesive layer 841, and the substrate 803 transmit visible light.

The light-emitting portion 804 includes a transistor 820 and a light-emitting element 830 over the substrate 801 with the adhesive layer 811 and the insulating layer 813 provided therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

The light-emitting portion 804 also includes the coloring layer 845 overlapping with the light-emitting element 830 and the light-blocking layer 847 overlapping with the insulating layer 821. The coloring layer 845 and the light-blocking layer 847 are covered with the overcoat 849. A space between the light-emitting element 830 and the overcoat 849 is filled with the sealing layer 823.

The insulating layer 815 has an effect of reducing the diffusion of impurities into a semiconductor included in the transistor. As the insulating layer 817, an insulating layer having a planarization function is preferably selected in order to reduce surface unevenness due to the transistor.

The driver circuit portions 806 include a plurality of transistors over the substrate 801 with the adhesive layer 811 and the insulating layer 813 provided therebetween. FIG. 11C illustrates one of the transistors included in the driver circuit portions 806.

The insulating layer 813 and the substrate 801 are attached to each other with the adhesive layer 811. In addition, the insulating layer 843 and the substrate 803 are attached to each other with the adhesive layer 841. It is preferable to use films with low water permeability for the insulating layer 813 and the insulating layer 843, in which case the entry of an impurity such as water into the light-emitting element 830 or the transistor 820 can be reduced, leading to high reliability of the light-emitting panel.

The conductive layer 857 is electrically connected to an external input terminal through which a signal (e.g., a video signal, a clock signal, a start signal, or a reset signal) or a potential from the outside is transmitted to the driver circuit portion 806. Here, an example in which the FPC 808 is provided as the external input terminal is described. To prevent an increase in the number of steps, the conductive layer 857 is preferably formed using the same material and the same step as the electrode or the wiring in the light-emitting portion or the driver circuit portion. Here, an example in which the conductive layer 857 is formed using the same material and the same step as the electrodes included in the transistor 820 is described.

In the light-emitting panel illustrated in FIG. 11C, a connector 825 is positioned over the substrate 803. The connector 825 is connected to the conductive layer 857 through an opening provided in the substrate 803, the adhesive layer 841, the insulating layer 843, the sealing layer 823, the insulating layer 817, and the insulating layer 815. The connector 825 is also connected to the FPC 808. The FPC 808 and the conductive layer 857 are electrically connected to each other via the connector 825. In the case where the conductive layer 857 and the substrate 803 overlap with each other, the conductive layer 857, the connector 825, and the FPC 808 can be electrically connected to one another by forming an opening in the substrate 803 (or using a substrate having an opening).

The specific example 1 describes the light-emitting panel which can be manufactured by forming the insulating layer 813, the transistor 820, and the light-emitting element 830 over a formation substrate with high heat resistance, separating the formation substrate, and transferring the insulating layer 813, the transistor 820, and the light-emitting element 830 to the substrate 801 with the adhesive layer 811. The specific example 1 also describes the light-emitting panel which can be manufactured by forming the insulating layer 843, the coloring layer 845, and the light-blocking layer 847 over a formation substrate with high heat resistance, separating the formation substrate, and transferring the insulating layer 843, the coloring layer 845, and the light-blocking layer 847 to the substrate 803 with the adhesive layer 841.

In the case where a material with low heat resistance (e.g., a resin) is used for a substrate, it is difficult to expose the substrate to high temperatures in the manufacturing process. Thus, there is a limitation on conditions for forming a transistor and an insulating layer over the substrate. In addition, in the case where a material with high water permeability (e.g., a resin) is used for a substrate, it is preferable to form a film at high temperatures to have low water permeability. In the manufacturing method of this embodiment, a transistor and the like can be formed over a formation substrate with high heat resistance; thus, a highly reliable transistor and a film with sufficiently low water permeability can be formed at high temperatures. Then, these are transferred to the substrate 801 and the substrate 803, whereby a highly reliable light-emitting panel can be manufactured. Thus, according to one embodiment of the present invention, a lightweight or thin and highly reliable light-emitting panel can be realized. Details of the manufacturing method will be described later.

<Specific Example 2>

FIG. 11B illustrates a plan view of a light-emitting panel, and FIG. 11D illustrates an example of a cross-sectional view along dashed-dotted line A3-A4 in FIG. 11B. The light-emitting panel described in the specific example 2 is a top-emission light-emitting panel using a color filter method, which is different from that in the specific example 1. Portions different from those in the specific example 1 will be described in detail here and the descriptions of portions common to the specific example 1 will be omitted.

The light-emitting panel illustrated in FIG. 11D is different from the light-emitting panel illustrated in FIG. 11C in the aspects below.

The light-emitting panel illustrated in FIG. 11D includes a spacer 827 over the insulating layer 821. By providing the spacer 827, the distance between the substrate 801 and the substrate 803 can be adjusted.

In addition, in the light-emitting panel illustrated in FIG. 11D, the substrate 801 and the substrate 803 have different sizes. The connector 825 is positioned over the insulating layer 843 and thus does not overlap with the substrate 803. The connector 825 is connected to the conductive layer 857 through an opening provided in the insulating layer 843, the sealing layer 823, the insulating layer 817, and the insulating layer 815. Since no opening needs to be provided in the substrate 803, there is no limitation on the material of the substrate 803.

<Specific Example 3>

Figure 12A:
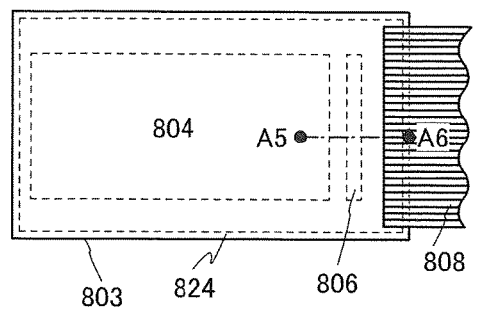
FIGS. 12A to 12E show diagrams illustrating examples of light-emitting panels according to an embodiment.
Figure 12B:
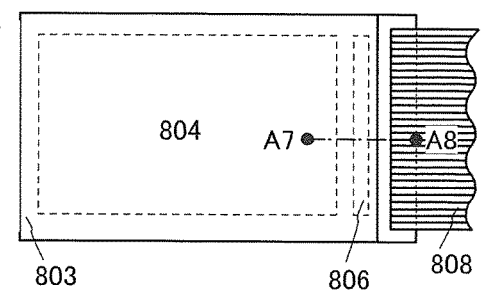
Figure 12C:
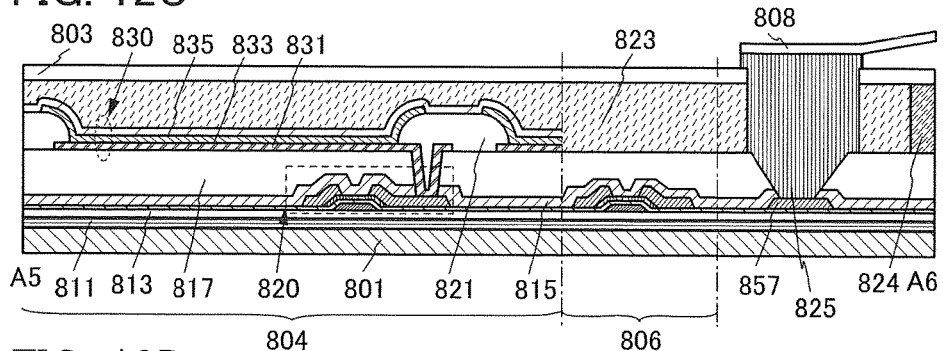

FIG. 12A illustrates a plan view of a light-emitting panel, and FIG. 12C illustrates an example of a cross-sectional view along dashed-dotted line A5-A6 in FIG. 12A. The light-emitting panel described in the specific example 3 is a top-emission light-emitting panel using a separate coloring method.

The light-emitting panel illustrated in FIG. 12A includes the light-emitting portion 804, the driver circuit portion 806, and the FPC 808. Light-emitting elements and transistors included in the light-emitting portion 804 and the driver circuit portion 806 are sealed by the substrate 801, the substrate 803, a frame-like sealing layer 824, and the sealing layer 823.

The light-emitting panel illustrated in FIG. 12C includes the substrate 801, the adhesive layer 811, the insulating layer 813, a plurality of transistors, the conductive layer 857, the insulating layer 815, the insulating layer 817, a plurality of light-emitting elements, the insulating layer 821, the sealing layer 823, the frame-like sealing layer 824, and the substrate 803. The sealing layer 823 and the substrate 803 transmit visible light.

The frame-like sealing layer 824 is preferably a layer having a higher gas barrier property than the sealing layer 823. Accordingly, the entry of external moisture or oxygen into the light-emitting panel can be reduced. Thus, the light-emitting panel with high reliability can be realized.

In the specific example 3, light emitted from the light-emitting element 830 is extracted from the light-emitting panel through the sealing layer 823. Therefore, the sealing layer 823 preferably has a higher light-transmitting property than the frame-like sealing layer 824. In addition, the sealing layer 823 preferably has a higher refractive index than the frame-like sealing layer 824. In addition, it is preferable that a reduction in the volume of the sealing layer 823 by curing be smaller than that of the frame-like sealing layer 824.

The light-emitting portion 804 includes the transistor 820 and the light-emitting element 830 over the substrate 801 with the adhesive layer 811 and the insulating layer 813 provided therebetween. The light-emitting element 830 includes the lower electrode 831 over the insulating layer 817, the EL layer 833 over the lower electrode 831, and the upper electrode 835 over the EL layer 833. The lower electrode 831 is electrically connected to the source electrode or the drain electrode of the transistor 820. The end portion of the lower electrode 831 is covered with the insulating layer 821. The lower electrode 831 preferably reflects visible light. The upper electrode 835 transmits visible light.

The driver circuit portion 806 includes a plurality of transistors over the substrate 801 with the adhesive layer 811 and the insulating layer 813 provided therebetween. FIG. 12C illustrates one of the transistors included in the driver circuit portion 806.

The insulating layer 813 and the substrate 801 are attached to each other with the adhesive layer 811. It is preferable to use a film with low water permeability for the insulating layer 813, in which case the entry of an impurity such as water into the light-emitting element 830 or the transistor 820 can be reduced, leading to high reliability of the light-emitting panel.

The conductive layer 857 is electrically connected to an external input terminal through which a signal or a potential from the outside is transmitted to the driver circuit portion 806. Here, an example in which the FPC 808 is provided as the external input terminal is described. In addition, here, an example in which the conductive layer 857 is formed using the same material and the same step as the electrodes included in the transistor 820 is described.

In the light-emitting panel illustrated in FIG. 12C, connector 825 is positioned over the substrate 803. The connector 825 is connected to the conductive layer 857 through an opening provided in the substrate 803, the sealing layer 823, the insulating layer 817, and the insulating layer 815. The connector 825 is also connected to the FPC 808. The FPC 808 and the conductive layer 857 are electrically connected to each other via the connector 825.

The specific example 3 describes the light-emitting panel which can be manufactured by forming the insulating layer 813, the transistor 820, and the light-emitting element 830 over a formation substrate with high heat resistance, separating the formation substrate, and transferring the insulating layer 813, the transistor 820, and the light-emitting element 830 to the substrate 801 with the adhesive layer 811. A transistor and the like can be formed over a formation substrate with high heat resistance; thus, a highly reliable transistor and a film with sufficiently low water permeability can be formed at high temperatures. Then, these are transferred to the substrate 801, whereby a highly reliable light-emitting panel can be manufactured. Thus, according to one embodiment of the present invention, a lightweight or thin and highly reliable light-emitting panel can be realized.

<Specific Example 4>

Figure 12D:
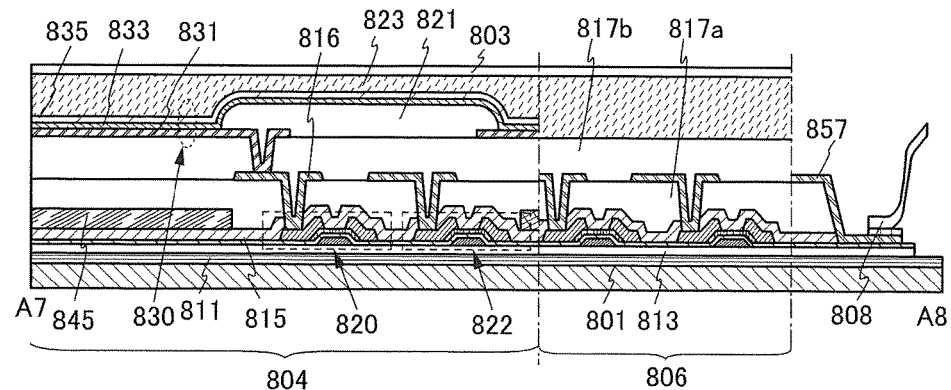

FIG. 12B illustrates a plan view of a light-emitting panel, and FIG. 12D illustrates an example of a cross-sectional view along dashed-dotted line A7-A8 in FIG. 12B. The light-emitting panel described in the specific example 4 is a bottom-emission light-emitting panel using a color filter method.

The light-emitting panel illustrated in FIG. 12D includes the substrate 801, the adhesive layer 811, the insulating layer 813, a plurality of transistors, the conductive layer 857, the insulating layer 815, a coloring layer 845, an insulating layer 817a, an insulating layer 817b, a conductive layer 816, a plurality of light-emitting elements, the insulating layer 821, the sealing layer 823, and the substrate 803. The substrate 801, the adhesive layer 811, the insulating layer 813, the insulating layer 815, the insulating layer 817a, and the insulating layer 817b transmit visible light.

The light-emitting portion 804 includes the transistor 820, a transistor 822, and the light-emitting element 830 over the substrate 801 with the adhesive layer 811 and the insulating layer 813 provided therebetween. The light-emitting element 830 includes the lower electrode 831 over the insulating layer 817, the EL layer 833 over the lower electrode 831, and the upper electrode 835 over the EL layer 833. The lower electrode 831 is electrically connected to the source electrode or the drain electrode of the transistor 820. The end portion of the lower electrode 831 is covered with the insulating layer 821. The upper electrode 835 preferably reflects visible light. The lower electrode 831 transmits visible light. The position where the coloring layer 845 that overlaps with the light-emitting element 830 is provided is not particularly limited; for example, it may be provided between the insulating layer 817a and the insulating layer 817b or between the insulating layer 815 and the insulating layer 817a.

The driver circuit portion 806 includes a plurality of transistors over the substrate 801 with the adhesive layer 811 and the insulating layer 813 provided therebetween. FIG. 12D illustrates two of the transistors included in the driver circuit portion 806.

The insulating layer 813 and the substrate 801 are attached to each other with the adhesive layer 811. It is preferable to use a film with low water permeability for the insulating layer 813, in which case the entry of an impurity such as water into the light-emitting element 830 or the transistor 820 or 822 can be reduced, leading to high reliability of the light-emitting panel.

The conductive layer 857 is electrically connected to an external input terminal through which a signal or a potential from the outside is transmitted to the driver circuit portion 806. Here, an example in which the FPC 808 is provided as the external input terminal is described. In addition, here, an example in which the conductive layer 857 is formed using the same material and the same step as the conductive layer 816 is described.

The specific example 4 describes the light-emitting panel which can be manufactured by forming the insulating layer 813, the transistor 820, the light-emitting element 830, and the like over a formation substrate with high heat resistance, separating the formation substrate, and transferring the insulating layer 813, the transistor 820, the light-emitting element 830, and the like to the substrate 801 with the adhesive layer 811. A transistor and the like can be formed over a formation substrate with high heat resistance; thus, a highly reliable transistor and a film with sufficiently low water permeability can be formed at high temperatures. Then, these are transferred to the substrate 801, whereby a highly reliable light-emitting panel can be manufactured. Thus, according to one embodiment of the present invention, a lightweight or thin and highly reliable light-emitting panel can be realized.

<Specific Example 5>

Figure 12E:
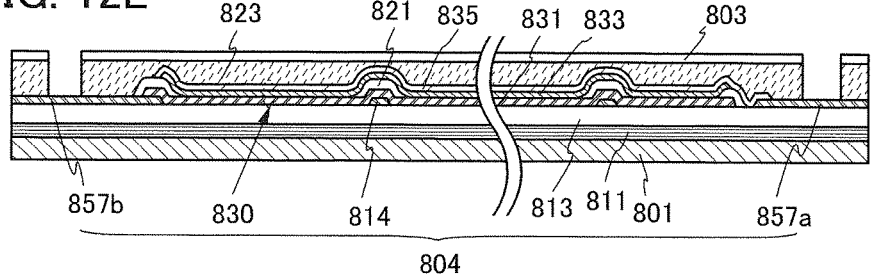

FIG. 12E illustrates an example of a light-emitting panel that is different from those in the specific examples 1 to 4.

The light-emitting panel illustrated in FIG. 12E includes the substrate 801, the adhesive layer 811, the insulating layer 813, a conductive layer 814, a conductive layer 857*a*, a conductive layer 857*b*, the light-emitting element 830, the insulating layer 821, the sealing layer 823, and the substrate 803.

The conductive layer 857*a* and the conductive layer 857*b*, which are external connection electrodes of the light-emitting panel, can each be electrically connected to an FPC or the like.

The light-emitting element 830 includes the lower electrode 831, the EL layer 833, and the upper electrode 835. The end portion of the lower electrode 831 is covered with the insulating layer 821. The light-emitting element 830 is bottom-emission, top-emission, or dual-emission. An electrode, a substrate, an insulating layer, and the like on the light extraction side transmit visible light. The conductive layer 814 is electrically connected to the lower electrode 831.

The substrate on the light extraction side may have, as a light extraction structure, a hemispherical lens, a micro lens array, a film provided with an uneven surface structure, a light diffusing film, or the like. For example, a light extraction structure can be formed by attaching the above lens or film to a resin substrate with an adhesive or the like having substantially the same refractive index as the substrate, or the lens or film.

The conductive layer 814 is preferably, though not necessarily, provided because voltage drop due to the resistance of the lower electrode 831 can be reduced. In addition, for a similar purpose, a conductive layer electrically connected to the upper electrode 835 may be provided over the insulating layer 821, over the EL layer 833, over the upper electrode 835, or the like.

The conductive layer 814 can be a single layer or a stacked layer formed using a material selected from copper, titanium, tantalum, tungsten, molybdenum, chromium, neodymium, scandium, nickel, or aluminum; an alloy material containing any of these as its main component; or the like. The thickness of the conductive layer 814 can be, for example, greater than or equal to 0.1 μm and less than or equal to 3 μm, preferably greater than or equal to 0.1 μm and less than or equal to 0.5 μm.

When a paste (e.g., silver paste) is used as a material for the conductive layer electrically connected to the upper electrode 835, metal particles forming the conductive layer aggregate. Therefore, the surface of the conductive layer is rough and has many gaps in a structure. Thus, it is difficult for the EL layer 833 to completely cover the conductive layer; accordingly, the upper electrode and the conductive layer are electrically connected to each other easily, which is preferable.

The specific example 5 describes the light-emitting panel which can be manufactured by forming the insulating layer 813, the light-emitting element 830, and the like over a formation substrate with high heat resistance, separating the formation substrate, and transferring the insulating layer 813, the light-emitting element 830, and the like to the substrate 801 with the adhesive layer 811. The insulating layer 813 and the like with sufficiently low water permeability are formed over the formation substrate with high heat resistance at high temperatures and then are transferred to the substrate 801, whereby a highly reliable light-emitting panel can be manufactured. Thus, according to one embodiment of the present invention, a lightweight or thin and highly reliable light-emitting panel can be realized.

<Examples of Materials>

Next, materials and the like that can be used for a light-emitting panel will be described. Note that description on the components already described in this specification may be omitted in some cases.

For each of the substrates, a material such as glass, quartz, an organic resin, a metal, or an alloy can be used. For the substrate on the side from which light from the light-emitting element is extracted, a material which transmits that light is used.

It is particularly preferable to use a flexible substrate. For example, an organic resin or glass, a metal, or an alloy that is thin enough to have flexibility can be used.

An organic resin, which has a specific gravity smaller than that of glass, is preferably used for the flexible substrate, in which case the light-emitting panel can be more lightweight than in the case where glass is used.

For the substrates, a material with high toughness is preferably used. Accordingly, a light-emitting panel with high impact resistance that is robust can be realized. For example, when an organic resin substrate, a thin metal substrate, or a thin alloy substrate is used, the light-emitting panel which is lighter and more robust than in the case where a glass substrate is used can be realized.

A metal material and an alloy material, which have high thermal conductivity, are preferred because they can easily conduct heat to the whole substrate and accordingly can reduce a local temperature rise in the light-emitting panel. The thickness of a substrate using a metal material or an alloy material is preferably greater than or equal to 10 μm and less than or equal to 200 μm, further preferably greater than or equal to 20 μm and less than or equal to 50 μm.

There is no particular limitation on a material of the metal substrate or the alloy substrate, but it is preferable to use, for example, aluminum, copper, nickel, or a metal alloy such as an aluminum alloy or stainless steel.

Furthermore, when a material with high thermal emissivity is used for the substrate, a surface temperature rise of the light-emitting panel can be reduced, leading to reduction of breakage or a decrease in reliability of the light-emitting panel. For example, the substrate may have a stacked-layer structure of a metal substrate and a layer with high thermal emissivity (e.g., a metal oxide or a ceramic material can be used).

Examples of such a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose coefficient of thermal expansion is low is preferably used, and for example, a polyamide imide resin, a polyimide resin, or PET can be suitably used. A substrate in which a fibrous body is impregnated with a resin (also referred to as prepreg) or a substrate whose coefficient of thermal expansion is reduced by mixing an organic resin with an inorganic filler can also be used.

The flexible substrate may have a stacked-layer structure in which a hard coat layer (such as a silicon nitride layer) by which a device surface is protected from damage or the like, a layer (such as an aramid resin layer) that can disperse pressure, or the like is stacked over a layer of any of the above-mentioned materials.

For the flexible substrate, a plurality of layers may be stacked and used. With a structure including a glass layer, a barrier property against water and oxygen can be improved and thus a reliable light-emitting panel can be provided.

For example, a flexible substrate in which a glass layer, an adhesive layer, and an organic resin layer are stacked from the side closer to a light-emitting element can be used. The thickness of the glass layer is greater than or equal to 20 μm and less than or equal to 200 μm, preferably greater than or equal to 25 μm and less than or equal to 100 μm. With such a thickness, the glass layer can realize both an excellent barrier property against water and oxygen and a high flexibility. The thickness of the organic resin layer is greater than or equal to 10 μm and less than or equal to 200 μm, preferably greater than or equal to 20 μm and less than or equal to 50 μm. By providing such an organic resin layer outside the glass layer, a crack or a break in the glass layer can be reduced and mechanical strength can be improved. With the substrate that includes such a composite material of a glass material and an organic resin, a highly reliable and flexible light-emitting panel can be provided.

As the adhesive layer or the sealing layer, a variety of curable adhesives such as a reactive curable adhesive, a thermosetting adhesive, an anaerobic adhesive, and a photo curable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. A material with low moisture permeability, such as an epoxy resin, is particularly preferable. Alternatively, a two-component-mixture-type resin may be used. Alternatively, an adhesive sheet or the like may be used.

In addition, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can reduce the entry of an impurity such as moisture into a functional element, thereby improving the reliability of the light-emitting panel.

In addition, by mixing a filler with a high refractive index or light-scattering member into the resin, the efficiency of light extraction from the light-emitting element can be improved. For example, titanium oxide, barium oxide, zeolite, zirconium, or the like can be used.

There is no particular limitation on the structure of the transistors of the light-emitting panel. For example, a staggered transistor or an inverted staggered transistor may be used. Furthermore, the structure of the transistor may be either top-gate or bottom-gate. There is no particular limitation on a semiconductor material used for the transistors; examples include silicon and germanium. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be reduced.

Here, an oxide semiconductor is preferably used for semiconductor devices such as transistors used for pixels, driver circuits, touch sensors described later, or the like. It is particularly preferable to use an oxide semiconductor having a wider band gap than silicon. A semiconductor material having a wider band gap and a lower carrier density than silicon is preferably used because off-state current of the transistor can be reduced.

For example, the oxide semiconductor preferably contains at least at least indium (In) or zinc (Zn). Further preferably, it contains an oxide represented by an In—M—Zn-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

There is no grain boundary in such an oxide semiconductor; therefore, generation of a crack in an oxide semiconductor film which is caused by stress when a display panel is curved is reduced. Therefore, such an oxide semiconductor can be preferably used for a display panel which has flexibility and is used in a bent state, or the like.

The use of such materials for the semiconductor layer makes it possible to realize a highly reliable transistor in which a change in the electrical characteristics is reduced.

In addition, charge accumulated in a capacitor through a transistor can be held for a long time because of the low off-state current of the transistor. When such a transistor is used for a pixel, a driver circuit can be stopped while a gray scale of an image displayed in each display region is maintained. As a result, an electronic device with an extremely low power consumption can be realized.

For stable characteristics of the transistor or the like, a base film is preferably provided. The base film can be formed with an inorganic insulating film such as a silicon oxide film, a silicon nitride film, a silicon oxynitride film, or a silicon nitride oxide film to have a single-layer structure or a stacked-layer structure. The base film can be formed using a sputtering method, a CVD (Chemical Vapor Deposition) method (e.g., a plasma CVD method, a thermal CVD method, or an MOCVD (Metal Organic CVD) method), an ALD (Atomic Layer Deposition) method, a coating method, a printing method, or the like. Note that the base film is not necessarily provided when not needed. In each of the above structure examples, the insulating layer 813 can serve as a base film of the transistor.

As the light-emitting element, an element capable of self-emission can be used, and an element whose luminance is controlled by current or voltage is included in its category. For example, a light-emitting diode (LED), an organic EL element, an inorganic EL element, or the like can be used.

The light-emitting element may be top-emission, bottom-emission, or dual-emission. A conductive film that transmits visible light is used as the electrode on the side from which light is extracted. In addition, a conductive film that reflects visible light is preferably used as the electrode on the side from which light is not extracted.

The conductive film that transmits visible light can be formed using, for example, indium oxide, indium tin oxide (ITO: Indium Tin Oxide), indium zinc oxide, zinc oxide, or zinc oxide to which gallium is added. Alternatively, a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin so as to have a light-transmitting property. Alternatively, a stacked film of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. In addition, lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, palladium, and copper, or an alloy of silver and magnesium can be used. An alloy containing silver and copper is preferable because of its high heat resistance. Moreover, a metal film or a metal oxide film is stacked on an aluminum alloy film, whereby oxidation of the aluminum alloy film can be reduced. Examples of a material for the metal film or the metal oxide film include titanium and titanium oxide. Alternatively, the conductive film that transmits visible light and a film containing any of the above metal materials may be stacked. For example, a stacked film of silver and ITO or a stacked film of an alloy of silver and magnesium and ITO can be used.

The electrodes may be formed separately using an evaporation method or a sputtering method. Alternatively, they can be formed using a discharging method such as an ink-jet method, a printing method such as a screen printing method, or a plating method.

When a voltage higher than the threshold voltage of the light-emitting element is applied between the lower electrode 831 and the upper electrode 835, holes are injected to the EL layer 833 from the anode side and electrons are injected from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include a layer containing a substance with a high hole-injection property, a substance with a high hole-transport property, a hole-blocking material, a substance with a high electron-transport property, a substance with a high electron-injection property, a substance with a bipolar property (a substance with a high electron-transport property and hole-transport property), or the like.

For the EL layer 833, either a low molecular compound or a high molecular compound can be used, and an inorganic compound may also be contained. Each of the layers included in the EL layer 833 can be formed by a method such as an evaporation method (including a vacuum evaporation method), a transfer method, a printing method, an ink jet method, a coating method, or the like.

The light-emitting element is preferably provided between a pair of insulating films with low water permeability. Thus, the entry of an impurity such as water into the light-emitting element can be reduced, leading to suppression of a decrease in the reliability of the light-emitting device.

Examples of an insulating film with low water permeability include a film containing nitrogen and silicon such as a silicon nitride film or a silicon nitride oxide film, a film containing nitrogen and aluminum such as an aluminum nitride film, and the like. Alternatively, a silicon oxide film, a silicon oxynitride film, an aluminum oxide film, or the like can be used.

For example, the water vapor permeation amount of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

An insulating film with low water permeability is preferably used for the insulating layer 813 and the insulating layer 843.

As the insulating layer 815, for example, an inorganic insulating film such as a silicon oxide film, a silicon oxynitride film, or an aluminum oxide film can be used. For example, as each of the insulating layer 817, the insulating layer 817a, and the insulating layer 817b, an organic material such as polyimide, acrylic, polyamide, polyimide amide, or a benzocyclobutene-based resin can be used. Alternatively, a low-dielectric constant material (a low-k material) or the like can be used. Furthermore, each of the insulating layers may be formed by stacking a plurality of insulating films.

The insulating layer 821 is formed using an organic insulating material or an inorganic insulating material. As the resin, for example, a polyimide resin, a polyamide resin, an acrylic resin, a siloxane resin, an epoxy resin, or a phenol resin can be used. It is particularly preferable that the insulating layer 821 be formed using a photosensitive resin material so that a sidewall thereof has an inclined surface with continuous curvature.

There is no particular limitation on the method for forming the insulating layer 821; a photolithography method, a sputtering method, an evaporation method, a droplet discharging method (e.g., an ink-jet method), a printing method (e.g., screen printing or off-set printing), or the like may be used.

The spacer 827 can be formed using an inorganic insulating material, an organic insulating material, a metal material, or the like. As the inorganic insulating material and the organic insulating material, for example, a variety of materials that can be used for the insulating layer can be used. As the metal material, titanium, aluminum, or the like can be used. With a structure in which the spacer 827 containing a conductive material and the upper electrode 835 are electrically connected to each other, a potential drop due to the resistance of the upper electrode 835 can be reduced. The spacer 827 may also have either a tapered shape or an inverse tapered shape.

A conductive layer used in the light-emitting panel, which functions as an electrode or a wiring of the transistor, an auxiliary electrode of the light-emitting element, or the like, can be formed to have a single-layer structure or a stacked-layer structure using a metal material such as molybdenum, titanium, chromium, tantalum, tungsten, aluminum, copper, neodymium, or scandium, or an alloy material containing these elements, for example. Alternatively, the conductive layer may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an ink-jet method, an etching method using a photolithography method, or the like.

The light-blocking layer is provided between the adjacent coloring layers. The light-blocking layer blocks light from an adjacent light-emitting element to reduce color mixture between adjacent light-emitting elements. Here, the coloring layer is provided such that its end portion overlaps with the light-blocking layer, whereby light leakage can be reduced. As the light-blocking layer, a material that blocks light from the light-emitting element can be used; for example, a black matrix may be formed using a resin material containing a metal material, pigment, or dye. Note that it is preferable to provide the light-blocking layer in a region other than the light-emitting portion, such as a driver circuit portion, in which case undesired leakage of guided light or the like can be reduced.

Furthermore, an overcoat covering the coloring layer and the light-blocking layer may be provided. With the overcoat, impurities and the like contained in the coloring layer can be prevented from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and a stacked-layer structure of an organic insulating film and an inorganic insulating film may be used.

In addition, in the case where a material of the sealing layer is applied onto the coloring layer and the light-blocking layer, a material that has high wettability with respect to the material of the sealing layer is preferably used as the material of the overcoat. For example, an oxide conductive film such as an ITO film or a metal film such as an Ag film that is thin enough to have a light-transmitting property is preferably used as the overcoat.

For the connector, it is possible to use a paste-like or sheet-like material which is obtained by mixing metal particles into a thermosetting resin and for which anisotropic electric conductivity is provided by thermocompression bonding. As the metal particles, particles in which two or more kinds of metals are layered, for example, nickel particles coated with gold are preferably used.

<Manufacturing Method Example>

Next, a method for manufacturing a light-emitting panel is exemplified with reference to FIGS. 13A to 13C and FIGS. 14A to 14C. Here, description is made using the light-emitting panel having the structure in the specific example 1 (FIG. 11C) as an example.

Figure 13A:
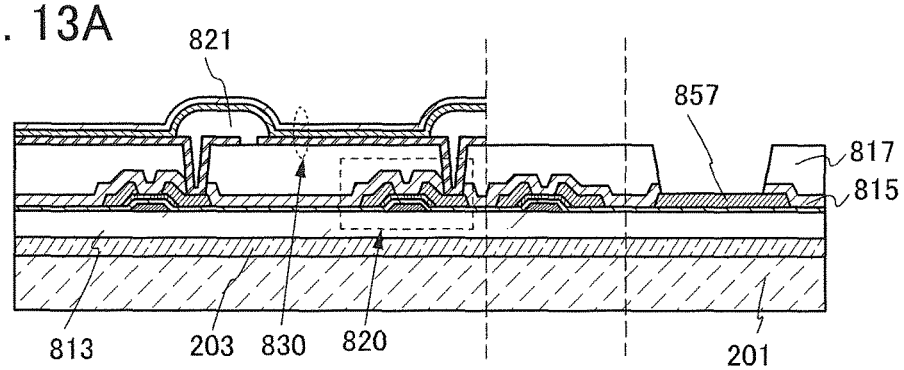
FIGS. 13A to 13C show diagrams illustrating a manufacturing method example of a light-emitting panel according to an embodiment.

First, a separation layer 203 is formed over a formation substrate 201, and the insulating layer 813 is formed over the separation layer 203. Next, the plurality of transistors, the conductive layer 857, the insulating layer 815, the insulating layer 817, the plurality of light-emitting elements, and the insulating layer 821 are formed over the insulating layer 813. Note that an opening is formed in the insulating layer 821, the insulating layer 817, and the insulating layer 815 to expose the conductive layer 857 (FIG. 13A).

Figure 13B:
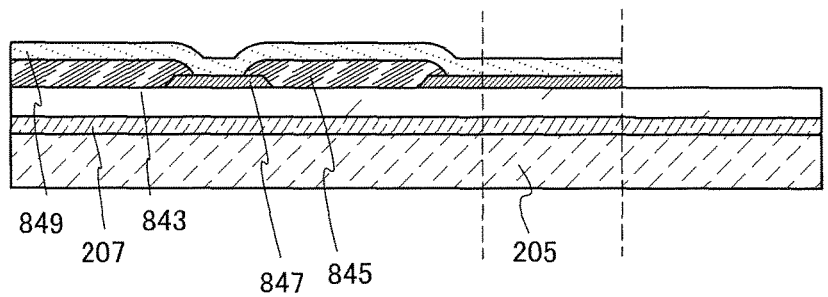

In addition, a separation layer 207 is formed over a formation substrate 205, and the insulating layer 843 is formed over the separation layer 207. Next, the light-blocking layer 847, the coloring layer 845, and the overcoat 849 are formed over the insulating layer 843 (FIG. 13B).

As each of the formation substrate 201 and the formation substrate 205, a glass substrate, a quartz substrate, a sapphire substrate, a ceramic substrate, a metal substrate, or the like can be used.

In addition, for the glass substrate, for example, a glass material such as aluminosilicate glass, aluminoborosilicate glass, or barium borosilicate glass can be used. In the case where the temperature of the later heat treatment is high, the one having a strain point of 730° C. or higher is preferably used. Note that by containing a large amount of barium oxide (BaO), glass which is heat-resistant and more practical can be obtained. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

Each of the separation layer 203 and the separation layer 207 is a single layer or a stacked layer containing an element selected from tungsten, molybdenum, titanium, tantalum, niobium, nickel, cobalt, zirconium, zinc, ruthenium, rhodium, palladium, osmium, iridium, and silicon; an alloy material containing the element; or a compound material containing the element. A crystal structure of a layer containing silicon may be amorphous, microcrystal, or polycrystal.

The separation layer can be formed by a sputtering method, a plasma CVD method, a coating method, a printing method, or the like. Note that a coating method includes a spin coating method, a droplet discharging method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that a mixture of tungsten and molybdenum corresponds to an alloy of tungsten and molybdenum, for example.

In the case where the separation layer is formed to have a stacked-layer structure including a layer containing tungsten and a layer containing an oxide of tungsten, the layer containing an oxide of tungsten may be utilized which is formed at the interface between a tungsten layer and an insulating film by forming the layer containing tungsten first and forming an insulating film formed of an oxide thereover. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. In addition, plasma treatment or heat treatment may be performed in an atmosphere of oxygen, nitrogen, or nitrous oxide alone, or a mixed gas of the gas and another gas. Surface condition of the separation layer is changed by the plasma treatment or heat treatment, whereby adhesion between the separation layer and the insulating film formed later can be controlled.

Each of the insulating layers can be formed using a sputtering method, a plasma CVD method, a coating method, a printing method, or the like, and can be a dense film with very low water permeability when formed at a deposition temperature higher than or equal to 250° C. and lower than or equal to 400° C. by a plasma CVD method, for example.

Figure 13C:
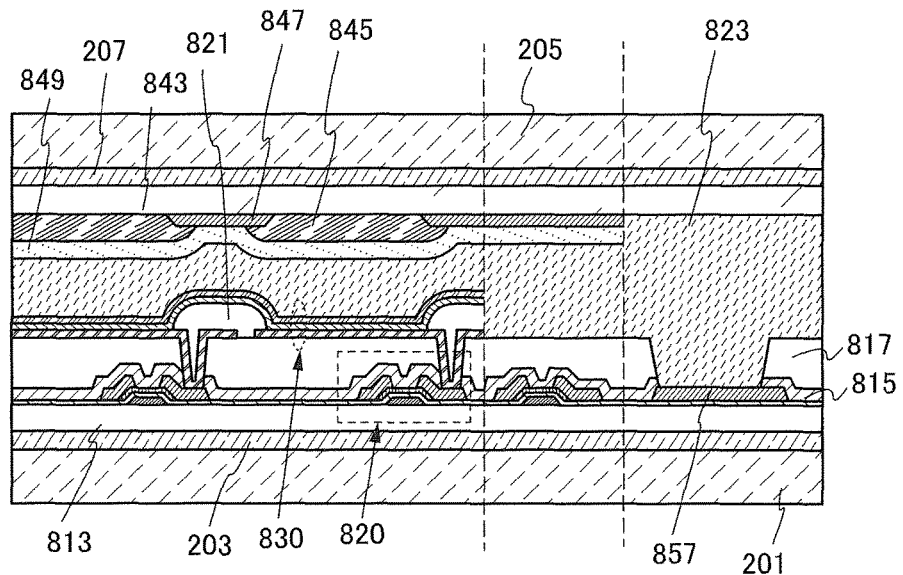

Then, a material for the sealing layer 823 is applied to a surface of the formation substrate 205 over which the coloring layer 845 and the like are provided or a surface of the formation substrate 201 over which the light-emitting element 230 and the like are provided, and the formation substrate 201 and the formation substrate 205 are attached so that these surfaces face each other with the sealing layer 823 provided therebetween (FIG. 13C).

Next, the formation substrate 201 is separated, and the exposed insulating layer 813 and the substrate 801 are attached to each other with the adhesive layer 811. Furthermore, the formation substrate 205 is separated, and the exposed insulating layer 843 and the substrate 803 are attached to each other with the adhesive layer 841. Although the substrate 803 does not overlap with the conductive layer 857 in FIG. 14A, the conductive layer 857 and the substrate 803 may overlap with each other.

Note that a variety of methods can be used as appropriate for the separation process. For example, in the case where a layer including a metal oxide film is formed as the separation layer on the side in contact with the layer to be separated, the metal oxide film is embrittled by crystallization, whereby the layer to be separated can be separated from the formation substrate. Alternatively, in the case where an amorphous silicon film containing hydrogen is formed as the separation layer between a formation substrate having high heat resistance and a layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, the separation can be performed at the embrittled metal oxide film. Further alternatively, a method may be employed in which a film containing nitrogen, oxygen, hydrogen, or the like (e.g., an amorphous silicon film containing hydrogen, an alloy film containing hydrogen, or an alloy film containing oxygen) is used as the separation layer, and the separation layer is irradiated with laser light to release the nitrogen, oxygen, or hydrogen contained in the separation layer as gas, thereby promoting separation between the layer to be separated and the substrate. Still further alternatively, it is possible to use a method or the like in which the formation substrate where the layer to be separated is formed is removed mechanically or removed by etching using a solution or a fluoride gas such as $NF_3$, $BrF_3$, or $ClF_3$, or the like. In this case, the separation layer is not necessarily provided.

In addition, when a plurality of the above-described separation methods are combined, the separation process can be performed easily. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated are brought into an easily separable state.

Alternatively, the layer to be separated may be separated from the formation substrate by soaking the interface between the separation layer and the layer to be separated with a liquid. Furthermore, the separation may be performed while a liquid such as water is being poured at the time of separation.

As another separation method, in the case where the separation layer is formed using tungsten, it is preferable that the separation be performed while etching the separation layer using a mixed solution of ammonium water and a hydrogen peroxide solution.

Note that the separation layer is not necessarily provided in the case where separation at an interface between the formation substrate and the layer to be separated is possible. For example, glass is used as the formation substrate, an organic resin such as polyimide, polyester, polyolefin, polyamide, polycarbonate, or acrylic is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed by providing the metal layer between the formation substrate and the organic resin and heating the metal layer by making current to flow in the metal layer.

Figure 14A:
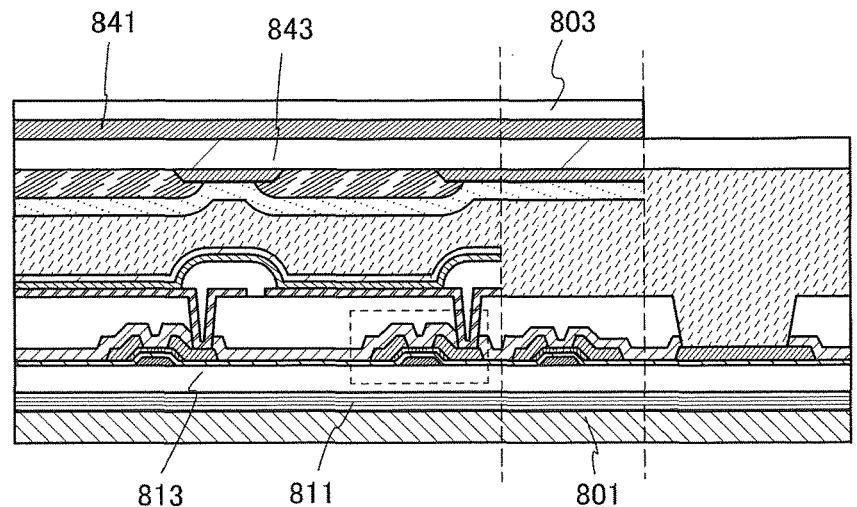
FIGS. 14A to 14C show diagrams illustrating a manufacturing method example of a light-emitting panel according to an embodiment.
Figure 14B:
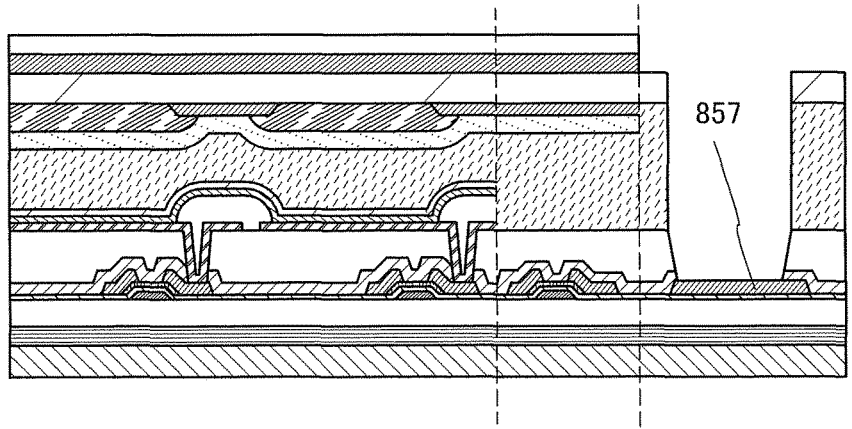
Figure 14C:
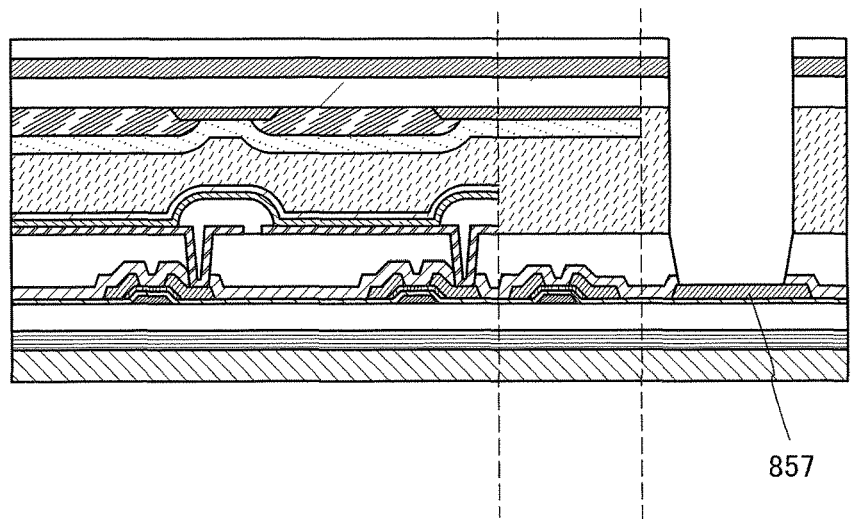

Lastly, an opening is formed in the insulating layer 843 and the sealing layer 823 to expose the conductive layer 857 (FIG. 14B). Note that in the case of the structure where the substrate 803 overlaps with the conductive layer 857, the opening is formed also in the substrate 803 and the adhesive layer 841 so that the conductive layer 857 is exposed (FIG. 14C). There is no particular limitation on the method for forming the opening. For example, a laser ablation method, an etching method, an ion beam sputtering method, or the like may be used. Alternatively, a cut may be made in a film over the conductive layer 857 with a sharp knife or the like and part of the film may be separated by physical force.

In the above-described manner, the light-emitting panel can be manufactured.

At least part of this embodiment can be implemented as appropriate in combination with any of the other embodiments described in this specification.

(Embodiment 3)

In this embodiment, structures of a foldable touch panel that is applicable to a display panel of the electronic device of one embodiment of the present invention will be described with reference to FIGS. 15A to 15C, FIGS. 16A and 16B, FIGS. 17A to 17c, and FIGS. 18A to 18C. Note that for a material of each layer, Embodiment 2 can be referred to.

<Structure Example 1>

Figure 15A:
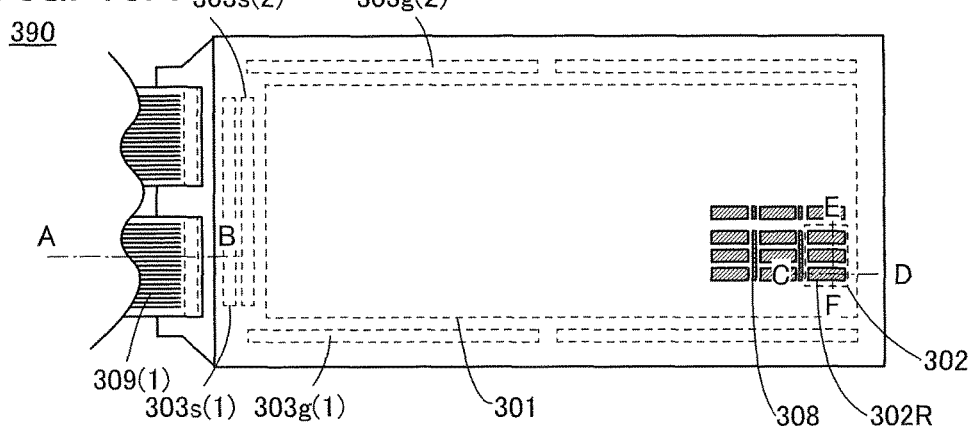
FIGS. 15A to 15C show diagrams illustrating an example of a touch panel according to an embodiment.
Figure 15B:
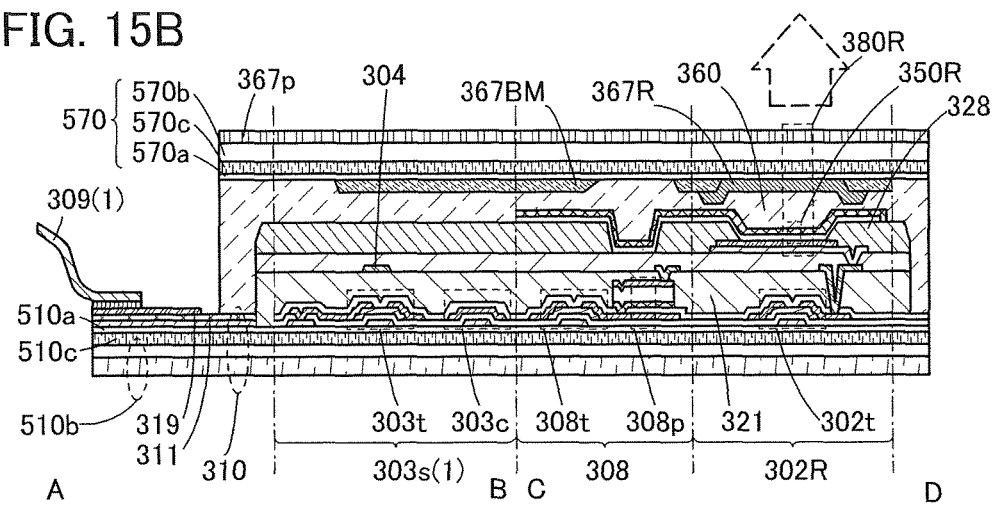
Figure 15C:
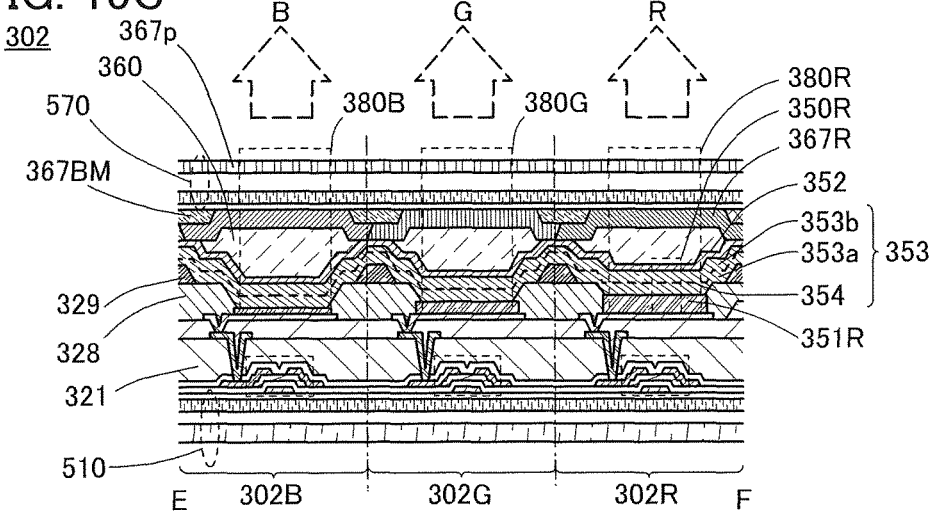

FIG. 15A is a top view of the touch panel. FIG. 15B is a cross-sectional view along dashed-dotted line A-B and dashed-dotted line C-D in FIG. 15A. FIG. 15C is a cross-sectional view along dashed-dotted line E-F in FIG. 15A.

As illustrated in FIG. 15A, a touch panel 390 includes a display portion 301.

The display portion 301 includes a plurality of pixels 302 and a plurality of imaging pixels 308. The imaging pixels 308 can sense a touch of a finger or the like on the display portion 301. Thus, a touch sensor can be formed using the imaging pixels 308.

The pixels 302 include a plurality of sub-pixels (e.g., a sub-pixel 302R). In the sub-pixels, light-emitting elements and pixel circuits that can supply electric power for driving the light-emitting elements are provided.

The pixel circuits are electrically connected to wirings through which selection signals can be supplied and wirings through which image signals can be supplied.

Furthermore, the touch panel 390 is provided with a scan line driver circuit 303g(1) that can supply selection signals to the pixels 302 and an image signal line driver circuit 303s(1) that can supply image signals to the pixels 302.

The imaging pixels 308 include photoelectric conversion elements and imaging pixel circuits that drive the photoelectric conversion elements.

The imaging pixel circuits are electrically connected to wirings through which control signals can be supplied and wirings through which power supply potentials can be supplied.

Examples of the control signals include a signal capable of selecting an imaging pixel circuit from which a recorded imaging signal is read, a signal capable of initializing an imaging pixel circuit, and a signal capable of determining the time it takes for an imaging pixel circuit to sense light.

The touch panel 390 is provided with an imaging pixel driver circuit 303g(2) that can supply control signals to the imaging pixels 308 and an imaging signal line driver circuit 303s(2) that reads out imaging signals.

As illustrated in FIG. 15B, the touch panel 390 includes a substrate 510 and a substrate 570 that faces the substrate 510.

A flexible material can be favorably used for the substrate 510 and the substrate 570.

A material with which passage of impurities is reduced can be favorably used for the substrate 510 and the substrate 570. For example, a material with a water vapor permeability of lower than or equal to $10^{-5}$ g/(m$^2$·day), preferably lower than or equal to $10^{-6}$ g/(m$^2$·day) can be favorably used.

For the substrate 510 and the substrate 570, materials whose coefficients of linear expansion are substantially equal can be favorably used. For example, materials whose coefficients of linear expansion are lower than or equal to $1\times10^{-3}$/K, preferably lower than or equal to $5\times10^{-5}$/K, and further preferably lower than or equal to $1\times10^{-5}$/K can be favorably used.

The substrate 510 is a stacked body including a flexible substrate 510b, an insulating layer 510a that prevents diffusion of impurities into the light-emitting elements, and an adhesive layer 510c that attaches the flexible substrate 510b and the insulating layer 510a to each other.

The substrate 570 is a stacked body including a flexible substrate 570b, an insulating layer 570a that prevents diffusion of impurities into the light-emitting elements, and an adhesive layer 570c that attaches the flexible substrate 570b and the insulating layer 570a to each other.

For example, a material that includes polyester, polyolefin, polyamide (e.g., nylon, aramid), polyimide, polycarbonate, or a resin having an acrylic, urethane, epoxy, or siloxane bond can be used for the adhesive layer.

A sealing layer 560 attaches the substrate 570 and the substrate 510 to each other. The sealing layer 560 has a refractive index higher than that of air. In addition, in the case where light is extracted through the sealing layer 560, the sealing layer 560 also serves as a layer (hereinafter, also referred to as an optical bonding layer) that optically bonds two members (here, the substrate 570 and the substrate 510) between which the sealing layer 560 is sandwiched. The pixel circuits and the light-emitting elements (e.g., a first light-emitting element 350R) are provided between the substrate 510 and the substrate 570.

The pixel 302 includes the sub-pixel 302R, a sub-pixel 302G, and a sub-pixel 302B (FIG. 15C). In addition, the sub-pixel 302R includes a light-emitting module 380R, the sub-pixel 302G includes a light-emitting module 380G, and the sub-pixel 302B includes a light-emitting module 380B.

For example, the sub-pixel 302R includes the light-emitting element 350R and the pixel circuit that can supply electric power to the light-emitting element 350R and includes a transistor 302t (FIG. 15B). Furthermore, the light-emitting module 380R includes the light-emitting element 350R and an optical element (e.g., a coloring layer 367R).

The light-emitting element 350R includes a lower electrode 351R, an upper electrode 352, and an EL layer 353 between the lower electrode 351R and the upper electrode 352 (FIG. 15C).

The EL layer 353 includes a first EL layer 353a, a second EL layer 353b, and an intermediate layer 354 between the first EL layer 353a and the second EL layer 353b.

The light-emitting module 380R includes the coloring layer 367R on the substrate 570. The coloring layer transmits light of a particular wavelength, and for example, the one that selectively transmits light of red, green, blue, or the like can be used. Alternatively, a region that transmits light emitted from the light-emitting element as it is may be provided.

The light-emitting module 380R, for example, includes the sealing layer 360 that is in contact with the light-emitting element 350R and the coloring layer 367R.

The coloring layer 367R is positioned to overlap with the light-emitting element 350R. Accordingly, part of light emitted from the light-emitting element 350R passes through the sealing layer 360 that also serves as an optical bonding layer and through the coloring layer 367R and is emitted to the outside of the light-emitting module 380R as indicated by arrows in drawings.

The touch panel 390 includes a light-blocking layer 367BM on the substrate 570. The light-blocking layer 367BM is provided so as to surround the coloring layer (e.g., the coloring layer 367R).

The touch panel 390 includes an anti-reflective layer 367p positioned to overlap with the display portion 301. As the anti-reflective layer 367p, a circular polarizing plate can be used, for example.

The touch panel 390 includes an insulating layer 321. The insulating layer 321 covers the transistor 302t. Note that the insulating layer 321 can be used as a layer for planarizing unevenness caused by the pixel circuits. In addition, an insulating layer on which a layer that can reduce the diffusion of impurities into the transistor 302t and the like is stacked can be used as the insulating layer 321.

The touch panel 390 includes the light-emitting elements (e.g., the light-emitting element 350R) over the insulating layer 321.

The touch panel 390 includes, over the insulating layer 321, a partition 328 that overlaps with an end portion of the lower electrode 351R. In addition, a spacer 329 that controls the distance between the substrate 510 and the substrate 570 is provided over the partition 328.

The image signal line driver circuit 303s(1) includes a transistor 303t and a capacitor 303c. Note that the driver circuit and the pixel circuits can be formed in the same process over the same substrate. As illustrated in FIG. 15B, the transistor 303t may include a second gate 304 over the insulating layer 321. The second gate 304 may be electrically connected to a gate of the transistor 303t. Alternatively, different potentials may be supplied thereto. In addition, the second gate 304 may be provided in a transistor 308t, the transistor 302t, or the like if necessary.

The imaging pixel 308 includes a photoelectric conversion element 308p and an imaging pixel circuit for sensing light with which the photoelectric conversion element 308p is irradiated. In addition, the imaging pixel circuit includes the transistor 308t.

For example, a pin photodiode can be used as the photoelectric conversion element 308p.

The touch panel 390 includes a wiring 311 through which a signal can be supplied. The wiring 311 is provided with a terminal 319. Note that an FPC 309(1) through which signals such as an image signal and a synchronization signal can be supplied is electrically connected to the terminal 319. Note that a printed wiring board (PWB) may be attached to the FPC 309(1).

Transistors formed in the same process can be used as transistors such as the transistor 302t, the transistor 303t, and the transistor 308t. Embodiment 2 can be referred to for the structures of the transistors.

As a material that can be used for a gate, a source, and a drain of a transistor, and a variety of wirings and electrodes included in a touch panel, a single-layer structure or a stacked-layer structure using a metal such as aluminum, titanium, chromium, nickel, copper, yttrium, zirconium, molybdenum, silver, tantalum, or tungsten, or an alloy containing the same as its main component is used. Examples include a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film stacked over the titanium film or the titanium nitride film, and a titanium film or a titanium nitride film thereover are formed, a three-layer structure in which a molybdenum film or a molybdenum nitride film, an aluminum film or a copper film stacked over the molybdenum film or the molybdenum nitride film, and a molybdenum film or a molybdenum nitride film thereover are formed, and the like. Note that a transparent conductive material containing indium oxide, tin oxide, or zinc oxide may be used. In addition, copper containing manganese is preferable because controllability of a shape by etching is increased.

<Structure Example 2>

Figure 16A:
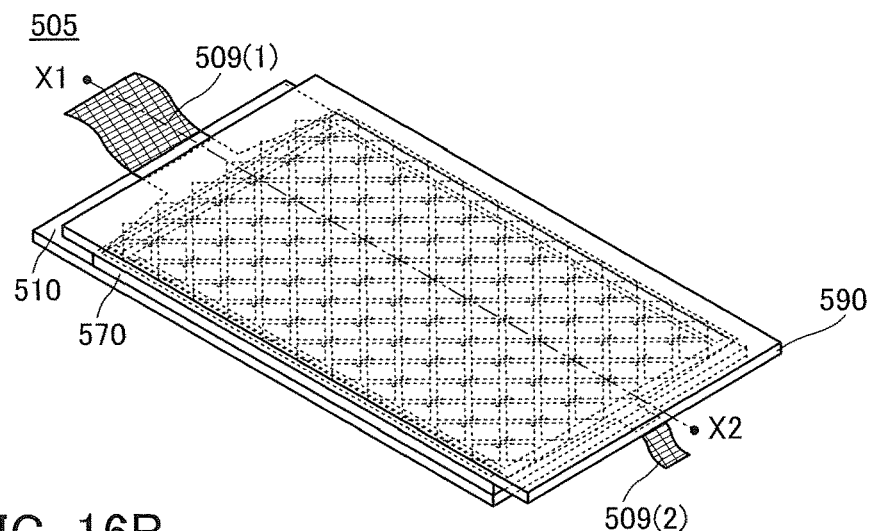
FIGS. 16A to 16B show diagrams illustrating an example of a touch panel according to an embodiment.
Figure 16B:
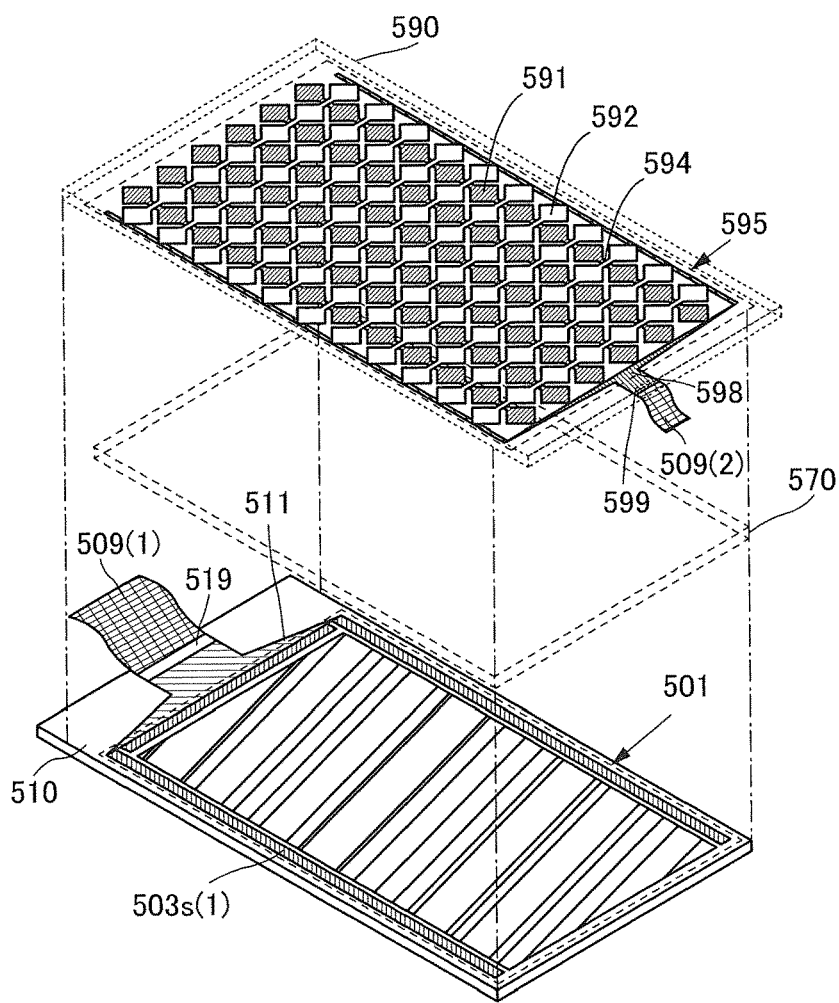
Figure 17A:
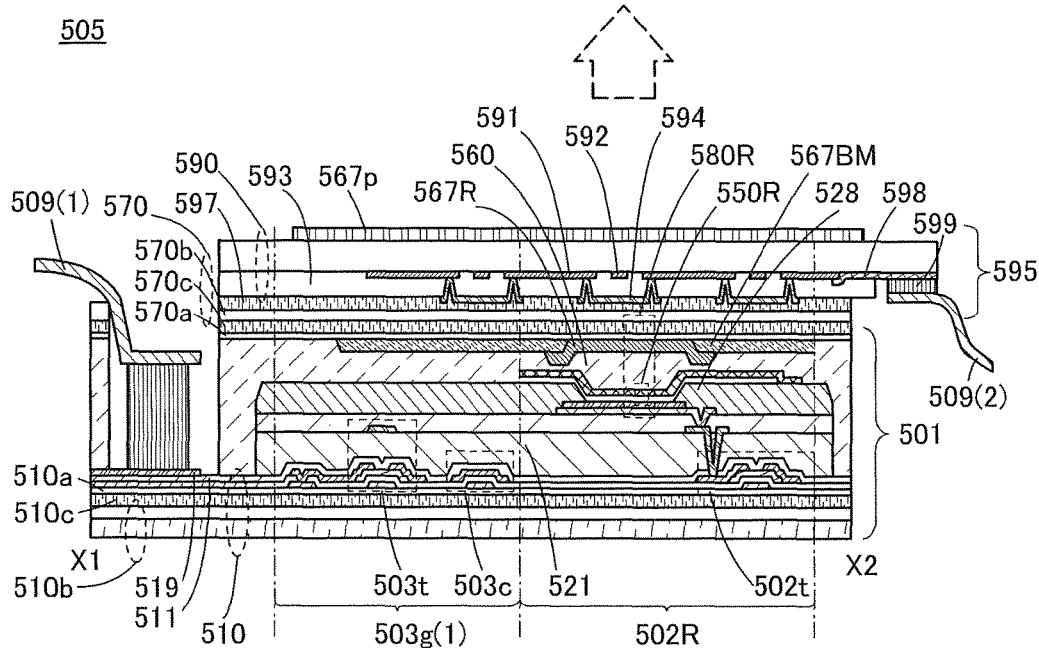
FIGS. 17A to 17C show diagrams illustrating an example of a touch panel according to an embodiment.
Figure 17B:
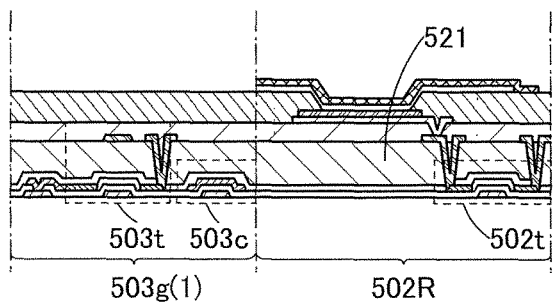
Figure 17C:
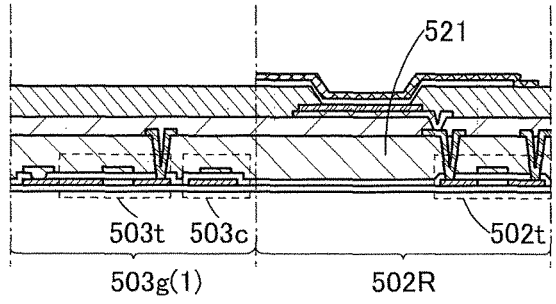

FIGS. 16A and 16B are perspective views of a touch panel 505. Note that main components are illustrated for simplicity. FIGS. 17A to 17C are cross-sectional views along dashed-dotted line X1-X2 illustrated in FIG. 16A.

The touch panel 505 includes a display portion 501 and a touch sensor 595 (FIG. 16B). Furthermore, the touch panel 505 includes the substrate 510, the substrate 570, and a substrate 590. Note that the substrate 510, the substrate 570, and the substrate 590 each have flexibility.

The display portion 501 includes the substrate 510, a plurality of pixels over the substrate 510, and a plurality of wirings 511 through which signals can be supplied to the pixels. The plurality of wirings 511 are led to a peripheral portion of the substrate 510, and portions thereof form a terminal 519. The terminal 519 is electrically connected to an FPC 509(1).

The substrate 590 includes the touch sensor 595 and a plurality of wirings 598 electrically connected to the touch sensor 595. The plurality of wirings 598 are led to a peripheral portion of the substrate 590, and portions thereof form a terminal. The terminal is electrically connected to an FPC 509(2). Note that in FIG. 16B, electrodes, wirings, and the like of the touch sensor 595 provided on the back surface side of the substrate 590 (on the substrate 510 side) are indicated by solid lines for clarity.

As the touch sensor 595, a capacitive touch sensor can be used, for example. Examples of the capacitive type include a surface capacitive type and a projected capacitive type.

Examples of the projected capacitive type are a self-capacitive type and a mutual capacitive type, which differ mainly in the driving method. The use of the mutual capacitive type is preferable because multiple points can be detected simultaneously.

A case of using a projected capacitive touch sensor will be described below with reference to FIG. 16B.

Note that a variety of sensors that can sense the approach or contact of a sensing target such as a finger can be used.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 16A and 16B.

The electrodes 591 each have a quadrangular shape and are arranged in a direction intersecting with the direction in which the electrodes 592 extend.

A wiring 594 electrically connects two electrodes 591 between which one electrode 592 is sandwiched. At this time, a shape where the intersecting area of the electrode 592 and the wiring 594 is as small as possible is preferable. This allows a reduction in the area of a region where the electrodes are not provided, reducing unevenness in transmittance. As a result, unevenness in luminance of light transmitted through the touch sensor 595 can be reduced.

Note that the shapes of the electrodes 591 and the electrodes 592 are not limited thereto and can be any of a variety of shapes. For example, the plurality of electrodes 591 may be provided so that spaces therebetween are reduced as much as possible, and a plurality of electrodes 592 may be provided with an insulating layer provided therebetween and may be spaced apart from each other to form a region not overlapping with the electrodes 591. At this time, between two adjacent electrodes 592, a dummy electrode that is electrically insulated from these is preferably provided, whereby the area of a region having a different transmittance can be reduced.

The touch sensor 595 includes the substrate 590, the electrodes 591 and the electrodes 592 provided in a staggered arrangement over the substrate 590, an insulating layer 593 covering the electrodes 591 and the electrodes 592, and the wiring 594 that electrically connects the adjacent electrodes 591 to each other.

An adhesive layer 597 attaches the substrate 590 to the substrate 570 so that the touch sensor 595 overlaps with the display portion 501.

The electrodes 591 and the electrodes 592 are formed using a light-transmitting conductive material. As the light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film including graphene oxide formed in the form of a film. As a reducing method, a method with application of heat or the like can be employed.

The electrodes 591 and the electrodes 592 may be formed by depositing a light-transmitting conductive material over the substrate 590 by a sputtering method and then removing an unnecessary portion by any of various patterning techniques such as a photolithography method.

As a material that is used for the insulating layer 593, a resin such as acrylic or epoxy, a resin having a siloxane bond, or an inorganic insulating material such as silicon oxide, silicon oxynitride, or aluminum oxide can also be used.

Furthermore, openings reaching the electrodes 591 are formed in the insulating layer 593, and the wiring 594 electrically connects the adjacent electrodes 591. A light-transmitting conductive material can be favorably used for the wiring 594 because the aperture ratio of the touch panel can be increased. Moreover, a material with higher conductivity than those of the electrodes 591 and the electrodes 592 can be favorably used for the wiring 594 because electric resistance can be reduced.

One of the electrodes 592 extends in one direction, and a plurality of electrodes 592 are provided in the form of stripes.

The wiring 594 is provided so as to intersect with the electrodes 592.

A pair of electrodes 591 are provided with one of the electrodes 592 provided therebetween. The wiring 594 electrically connects the pair of electrodes 591.

Note that the plurality of electrodes 591 are not necessarily arranged in the direction orthogonal to one electrode 592 and may be arranged at an angle of less than 90 degrees.

One wiring 598 is electrically connected to any of the electrodes 591 and the electrodes 592. Part of the wiring 598 serves as a terminal. For the wiring 598, a metal material such as aluminum, gold, platinum, silver, nickel, titanium, tungsten, chromium, molybdenum, iron, cobalt, copper, or palladium or an alloy material containing the metal material can be used.

Note that an insulating layer that covers the insulating layer 593 and the wiring 594 may be provided to protect the touch sensor 595.

Furthermore, a connection layer 599 electrically connects the wiring 598 and the FPC 509(2) to each other.

As the connection layer 599, any of various anisotropic conductive films (ACF: Anisotropic Conductive Film), anisotropic conductive pastes (ACP: Anisotropic Conductive Paste), and the like can be used.

The adhesive layer 597 has a light-transmitting property. For example, a thermosetting resin or an ultraviolet curable resin can be used; specifically, a resin such as acrylic, urethane, epoxy, a resin having a siloxane bond, or the like can be used.

The display portion 501 includes a plurality of pixels arranged in a matrix. The pixel includes a display element and a pixel circuit for driving the display element.

In this embodiment, a case of using an organic EL element that emits white light as a display element will be described; however, the display element is not limited thereto.

For example, organic EL elements that emit light of different colors may be used in sub-pixels so that the light of different colors can be emitted from the respective sub-pixels.

The substrate 510, the substrate 570, and the sealing layer 560 can have structures similar to those in the structure example 1.

A pixel includes a sub-pixel 502R, and the sub-pixel 502R includes a light-emitting module 580R.

The sub-pixel 502R includes a light-emitting element 550R and a pixel circuit including a transistor 502$t$ that can supply electric power to the light-emitting element 550R. Furthermore, the light-emitting module 580R includes the light-emitting element 550R and an optical element (e.g., a coloring layer 567R).

The light-emitting element 550R includes a lower electrode, an upper electrode, and an EL layer between the lower electrode and the upper electrode.

The light-emitting module 580R includes the coloring layer 567R on the light extraction side.

Furthermore, in the case where the sealing layer 560 is provided on the light extraction side, the sealing layer 560 is in contact with the light-emitting element 550R and the coloring layer 567R.

The coloring layer 567R is positioned to overlap with the light-emitting element 550R. Accordingly, part of light emitted from the light-emitting element 550R passes through the coloring layer 567R and is emitted to the outside of the light-emitting module 580R in a direction of an arrow illustrated in the drawing.

The display portion 501 includes a light-blocking layer 567BM in the light emitting direction. The light-blocking layer 567BM is provided so as to surround the coloring layer (e.g., the coloring layer 567R).

The display portion 501 includes an anti-reflective layer 567$p$ positioned to overlap with pixels. As the anti-reflective layer 567$p$, a circular polarizing plate can be used, for example.

The display portion 501 includes an insulating film 521. The insulating film 521 covers the transistor 502$t$. Note that the insulating film 521 can be used as a layer for planarizing unevenness caused by the pixel circuits. A stacked film including a layer that can reduce the diffusion of impurities can be used as the insulating film 521. This can suppress a decrease in the reliability of the transistor 502$t$ or the like by diffusion of impurities.

The display portion 501 includes the light-emitting elements (e.g., the light-emitting element 550R) over the insulating film 521.

The display portion 501 includes, over the insulating film 521, a partition 528 that overlaps with an end portion of a lower electrode. In addition, a spacer that controls the distance between the substrate 510 and the substrate 570 is provided over the partition 528.

A scan line driver circuit 503g(1) includes a transistor 503t and a capacitor 503c. Note that the driver circuit and the pixel circuits can be formed in the same process over the same substrate.

The display portion 501 includes the wirings 511 through which signals can be supplied. The wirings 511 are provided with the terminal 519. Note that the FPC 509(1) through which signals such as an image signal and a synchronization signal can be supplied is electrically connected to the terminal 519.

Note that a printed wiring board (PWB) may be attached to the FPC 509(1).

The display portion 501 includes wirings such as scan lines, signal lines, and power supply lines. The variety of conductive films described above can be used as the wirings.

Note that a variety of transistors can be used in the display portion 501. A structure in the case of using bottom-gate transistors in the display portion 501 is illustrated in FIGS. 17A and 17B.

For example, a semiconductor layer containing an oxide semiconductor, amorphous silicon, or the like can be used in the transistor 502t and the transistor 503t illustrated in FIG. 17A.

For example, a semiconductor layer containing polycrystalline silicon that is obtained by crystallization process such as laser annealing can be used in the transistor 502t and the transistor 503t illustrated in FIG. 17B.

In addition, a structure in the case of using top-gate transistors in the display portion 501 is illustrated in FIG. 17C.

For example, a semiconductor layer including polycrystalline silicon, a single crystal silicon film that is transferred from a single crystal silicon substrate, or the like can be used in the transistor 502t and the transistor 503t illustrated in FIG. 17C.

<Structure Example 3>

Figure 18A:
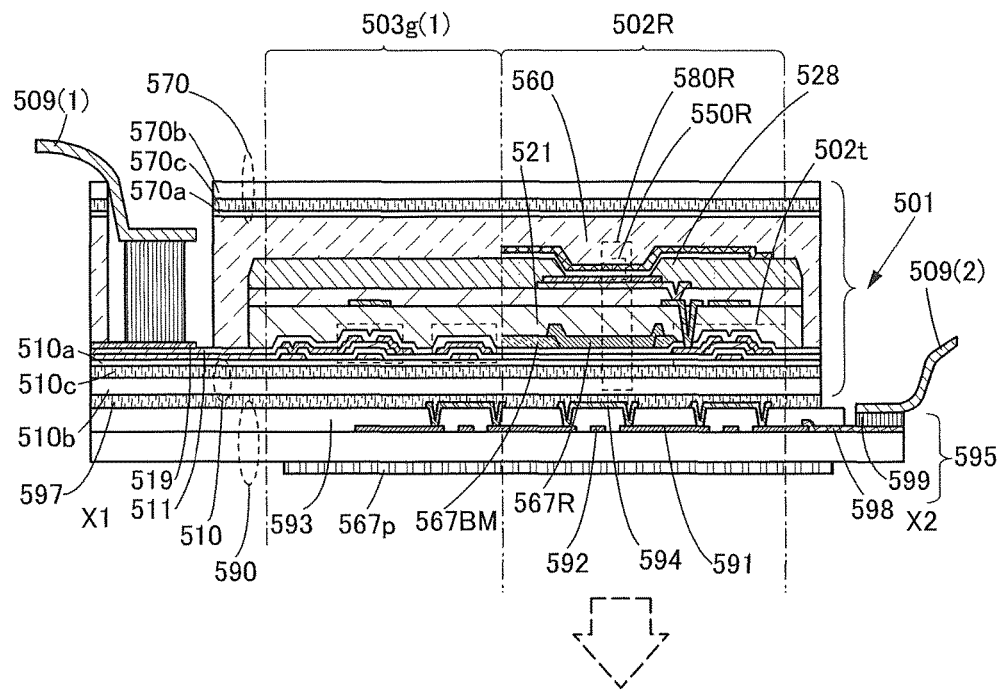
FIGS. 18A to 18C show diagrams illustrating examples of touch panels according to an embodiment.
Figure 18B:
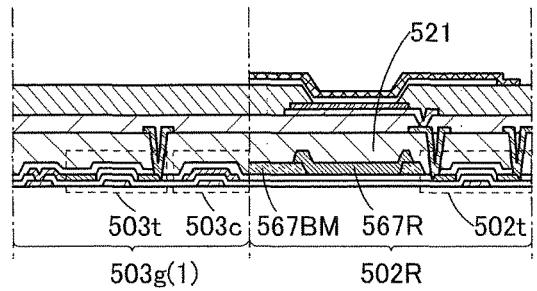
Figure 18C:
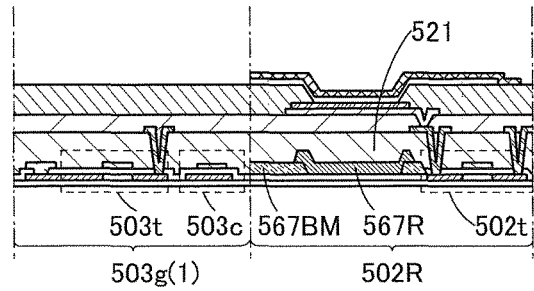

FIGS. 18A to 18C are cross-sectional views of a touch panel 505B. The touch panel 505B described in this embodiment is different from the touch panel 505 in the structure example 2 in including the display portion 501 that displays supplied image data to the side where the transistors are provided and in being provided with the touch sensor on the substrate 510 side of the display portion. Different structures will be described in detail here, and the above description is referred to for portions that can use similar structures.

The coloring layer 567R is positioned to overlap with the light-emitting element 550R. In addition, the light-emitting element 550R illustrated in FIG. 18A emits light to the side where the transistor 502t is provided. Accordingly, part of light emitted from the light-emitting element 550R passes through the coloring layer 567R and is emitted to the outside of the light-emitting module 580R in a direction of an arrow illustrated in the drawing.

The display portion 501 includes the light-blocking layer 567BM in the light emitting direction. The light-blocking layer 567BM is provided so as to surround the coloring layer (e.g., the coloring layer 567R).

The touch sensor 595 is provided on the substrate 510 side of the display portion 501 (FIG. 18A).

The adhesive layer 597 is provided between the substrate 510 and the substrate 590 and attaches the touch sensor 595 and the display portion 501 to each other.

Note that a variety of transistors can be used in the display portion 501. A structure in the case of using bottom-gate transistors in the display portion 501 is illustrated in FIGS. 18A and 18B.

For example, a semiconductor layer containing an oxide semiconductor, amorphous silicon, or the like can be used in the transistor 502t and the transistor 503t illustrated in FIG. 18A.

For example, a semiconductor layer containing polycrystalline silicon or the like can be used in the transistor 502t and the transistor 503t illustrated in FIG. 18B.

In addition, a structure in the case of using top-gate transistors in the display portion 501 is illustrated in FIG. 18C.

For example, a semiconductor layer including polycrystalline silicon, a transferred single crystal silicon film, or the like can be used in the transistor 502t and the transistor 503t illustrated in FIG. 18C.

At least part of this embodiment can be implemented as appropriate in combination with any of the other embodiments described in this specification.

(Embodiment 4)

In this embodiment, an example of a driving method of a touch panel that is applicable to a display panel of the electronic device of one embodiment of the present invention will be described with reference to drawings.

[Example of Sensing Method of Sensor]

Figure 19A:
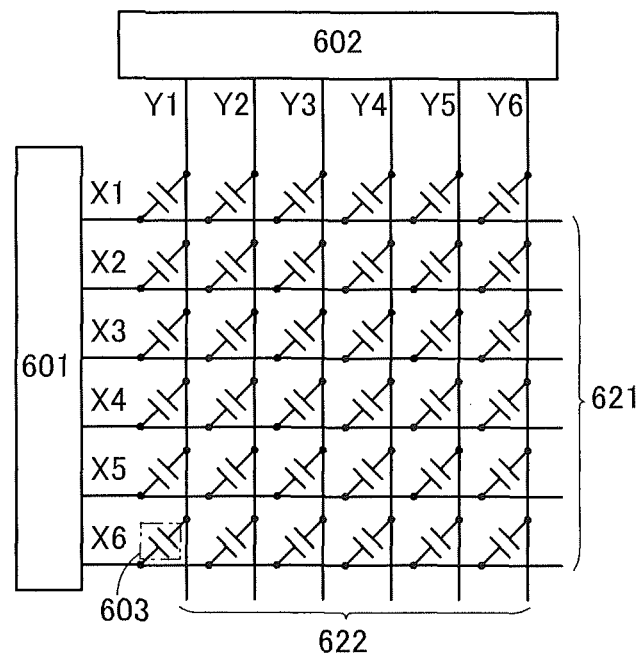
FIGS. 19A to 19B show a block diagram and a timing chart for a touch sensor according to an embodiment.

FIG. 19A is a block diagram illustrating the structure of a mutual capacitive touch sensor. FIG. 19A illustrates a pulse voltage output circuit 601 and a current detection circuit 602. Note that in FIG. 19A, electrodes 621 to which a pulse voltage is applied and electrodes 622 that sense changes in current are denoted by six wirings X1-X6 and Y1-Y6, respectively. In addition, FIG. 19A also illustrates a capacitor 603 that is formed by an electrode 121 and an electrode 122 overlapping with each other. Note that the functions of the electrode 121 and the electrode 122 may be interchanged with each other.

The pulse voltage output circuit 601 is a circuit for sequentially applying a pulse voltage to the wirings X1-X6. By application of a pulse voltage to the wirings X1-X6, an electric field is generated between the electrode 121 and the electrode 122 which form the capacitor 603. By utilizing a change in the mutual capacitance of the capacitor 603 which is caused when the electric field generated between the electrodes is shielded, for example, the approach or contact of a sensing target can be detected.

The current detection circuit 602 is a circuit for detecting changes in current through the wirings Y1-Y6 that are caused by the change in the mutual capacitance in the capacitor 603. No change in current value is detected in the wirings Y1-Y6 when there is no approach or contact of a sensing target, whereas a decrease in current value is detected as a change when mutual capacitance is decreased owing to the approach or contact of a sensing target to be detected. Note that current detection may be performed using an integrator circuit or the like.

Figure 19B:
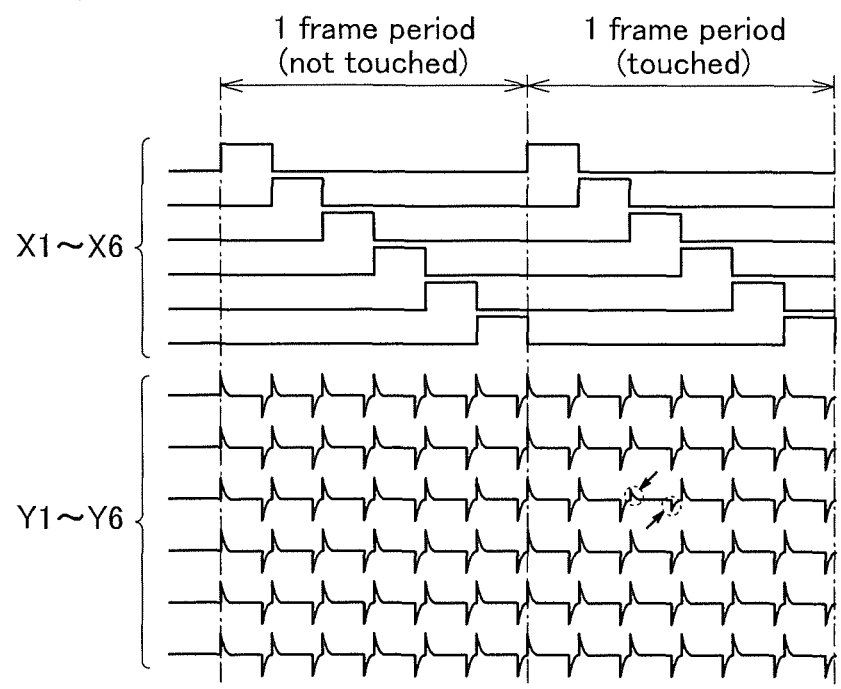

Next, FIG. 19B illustrates a timing chart with input and output waveforms in the mutual capacitive touch sensor illustrated in FIG. 19A. In FIG. 19B, detection of a sensing target is performed in all the rows and columns in one frame period. Furthermore, FIG. 19B illustrates two cases: a case where a sensing target is not detected (not touched) and a case where a sensing target is detected (touched). Note that the waveforms of voltage values corresponding to detected current values are illustrated for the wirings Y1-Y6.

A pulse voltage is sequentially applied to the wirings X1-X6, and the waveforms of the wirings Y1-Y6 change in accordance with the pulse voltage. In the case where there is no approach or contact of a sensing target, the waveforms of the Y1-Y6 uniformly change in accordance with changes in the voltages of the wirings X1-X6. Meanwhile, the current value is decreased at the point of approach or contact of a sensing target and accordingly the waveform of the corresponding voltage value also changes.

By detecting a change in mutual capacitance in this manner, the approach or contact of a sensing target can be sensed.

Figure 20:
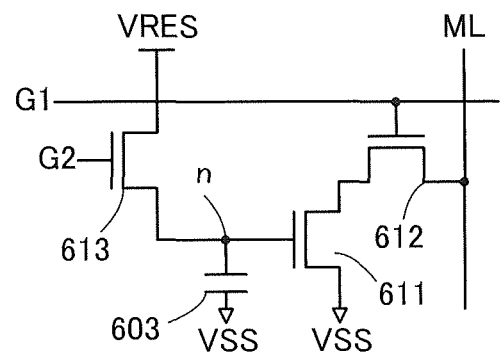
FIG. 20 shows a circuit diagram of a touch sensor according to an embodiment.

Although FIG. 19A illustrates a passive-matrix touch sensor in which only the capacitor 603 is provided as a touch sensor at the intersection of wirings, an active-matrix touch sensor including a transistor and a capacitor may also be used. FIG. 20 illustrates an example of a sensor circuit included in an active-matrix touch sensor.

The sensor circuit includes the capacitor 603, a transistor 611, a transistor 612, and a transistor 613. The transistor 613 has a gate supplied with a signal G2, has one of a source and a drain supplied with a voltage VRES, and has the other electrically connected to one electrode of the capacitor 603 and a gate of the transistor 611. The transistor 611 has one of a source and a drain electrically connected to one of a source and a drain of the transistor 612, and has the other supplied with a voltage VSS. The transistor 612 has a gate supplied with a signal G2, and has the other of the source and the drain electrically connected to a wiring ML. The other electrode of the capacitor 603 is supplied with the voltage VSS.

Next, the operation of the sensor circuit will be described. First, a potential for turning on the transistor 613 is applied as the signal G2, and a potential corresponding to the voltage VRES is thus applied to a node n to which the gate of the transistor 611 is connected. Then, a potential for turning off the transistor 613 is applied as the signal G2, and the potential of the node n is thus retained.

Then, mutual capacitance of the capacitor 603 changes owing to the approach or contact of a sensing target such as a finger, and accordingly the potential of the node n is changed from VRES.

In a reading operation, a potential for turning on the transistor 612 is applied as the signal G1. A current flowing through the transistor 611, that is, a current flowing through the wiring ML is changed in accordance with the potential of the node n. By detecting this current, the approach or contact of a sensing target can be detected.

It is preferable that transistors in which an oxide semiconductor is used for a semiconductor layer where a channel is formed be used as the transistor 611, the transistor 612, and the transistor 613. In particular, by using such a transistor as the transistor 613, the potential of the node n can be retained for a long time and the frequency of operation of resupplying VRES to the node n (refresh operation) can be reduced.

[Driving Method Example for Display Device]

Figure 21A:
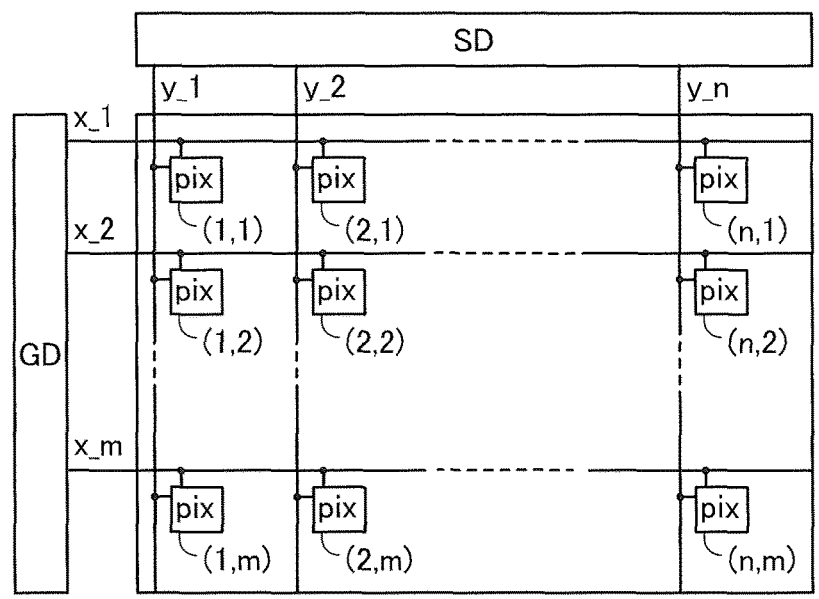
FIGS. 21A to 21B show a block diagram and a timing chart for a display device according to an embodiment.

FIG. 21A is a block diagram illustrating an example of the structure of a display device. FIG. 21A illustrates a gate driver circuit GD, a source driver circuit SD, and pixels pix. Note that in FIG. 21A, the pixels pix are denoted by (1, 1) to (n, m) which correspond to gate lines x_1 to x_m (m is a natural number) electrically connected to the gate driver circuit GD and source lines y_1 to y_n (n is a natural number) electrically connected to the source driver circuit SD.

Figure 21B:
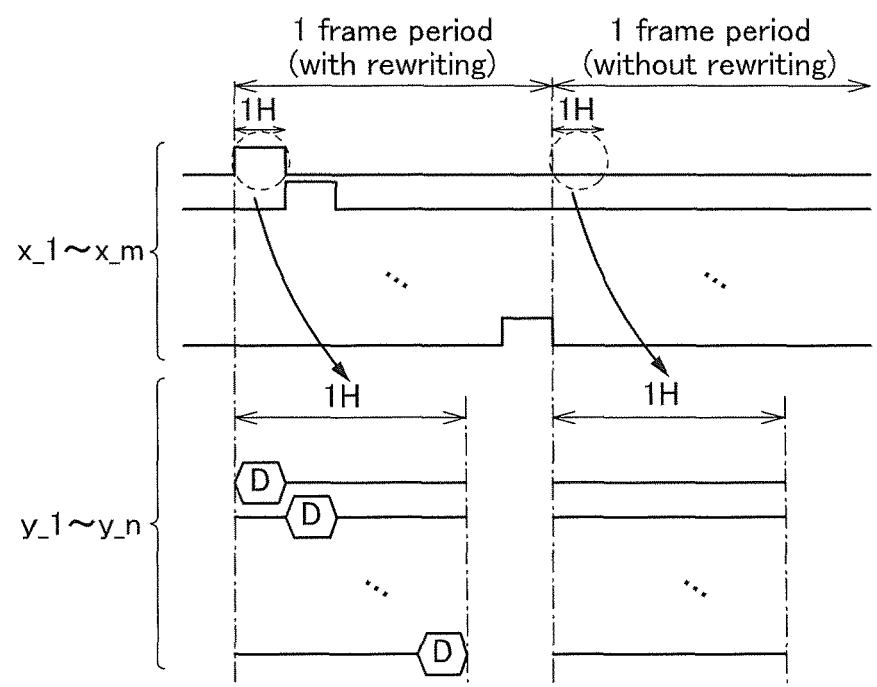

Next, FIG. 21B is a timing chart of signals supplied to the gate lines and the source lines in the display device illustrated in FIG. 21A. The periods in FIG. 21B show the case where data signals are rewritten every frame period and the case where data signals are not rewritten. Note that periods such as a retrace period are not taken into consideration in FIG. 21B.

In the case where data signals are rewritten every frame period, scan signals are sequentially supplied to the gate lines x_1 to x_m. In a horizontal scanning period 1H, during which the scan signal is at H level, data signals D are supplied to the source lines y_1 to y_n in the columns.

In the case where data signals are not rewritten every frame period, the scan signals supplied to the gate lines x_1 to x_m are stopped. In the horizontal scanning period 1H, the data signals supplied to the source lines y_1 to y_n in the columns are stopped.

A driving method in which data signals are not rewritten every frame period is effective particularly in the case where an oxide semiconductor is used for a semiconductor layer where a channel is formed as a transistor included in a pixel. A transistor in which an oxide semiconductor is used can have much lower off-state current than a transistor in which a semiconductor such as silicon is used. Thus, data written in the previous period can be retained without rewriting data signals every frame period, and the gray levels of pixels can be retained for 1 second or longer, preferably 5 seconds or longer, for example.

[Example of Driving Method for Display Device and Touch Sensor]

Figure 22A:
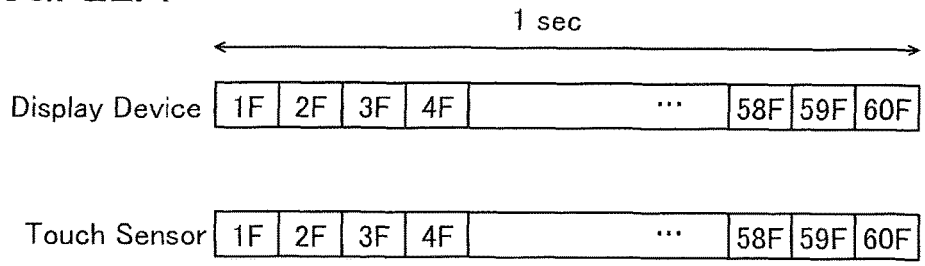
FIGS. 22A to 22D show diagrams illustrating operations of a display device and a touch sensor according to an embodiment.

FIGS. 22A to 22D are diagrams illustrating examples of the operations in successive frame periods of the touch sensor described with FIGS. 19A and 19B and the display device described with FIGS. 21A and 21B that are driven for 1 sec (one second). Note that FIG. 22A illustrates a case where one frame period for the display device is 16.7 ms (frame frequency: 60 Hz), and one frame period for the touch sensor is 16.7 ms (frame frequency: 60 Hz).

Figure 22B:
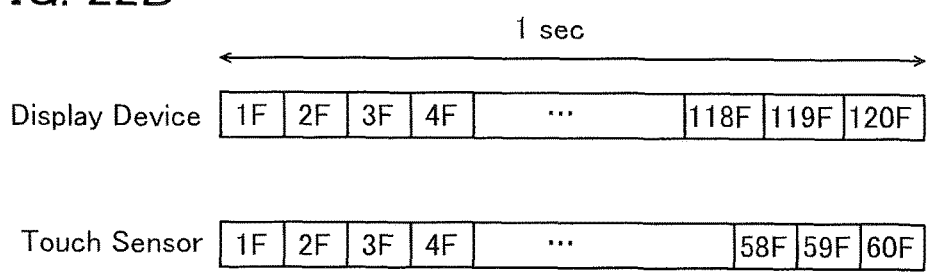

In the touch panel of this embodiment, the display device and the touch sensor operate independently of each other, and a touch sensing period can be concurrent with a display period. That is why one frame periods for the display device and the touch sensor can both be 16.7 ms (frame frequency: 60 Hz) as illustrated in FIG. 22A. The frame frequencies for the touch sensor and the display device may differ from each other. For example, as illustrated in FIG. 22B, one frame period for the display device may be set to 8.3 ms (frame frequency: 120 Hz) and one frame period for the touch sensor may be 16.7 ms (frame frequency: 60 Hz). Although not illustrated, the frame frequency for the display device may also be 33.3 ms (frame frequency: 30 Hz).

The frame frequency for the display device may be changeable, i.e., the frame frequency in displaying moving images may be increased (e.g., 60 Hz or more, or 120 Hz or more), whereas the frame frequency in displaying still images may be decreased (e.g., 60 Hz or less, 30 Hz or less, or 1 Hz or less). Accordingly, power consumption of the display device can be reduced. The frame frequency for the touch sensor may be changeable so that the frame frequencies in waiting and in sensing a touch differ from each other.

In addition, the touch panel of this embodiment retains data rewritten in the previous period without rewriting data signals in the display device, and one frame period for the display device can thus be a period longer than 16.7 ms. Thus, as illustrated in FIG. 22C, one frame period for the display device can be set to 1 sec (frame frequency: 1 Hz) and one frame period for the touch sensor can be 16.7 ms (frame frequency: 60 Hz).

Figure 22C:
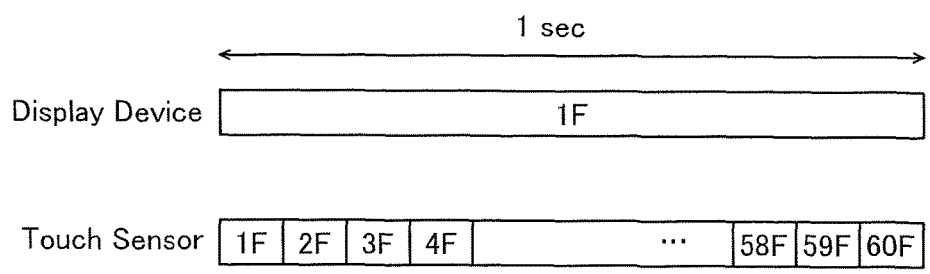
Figure 22D:
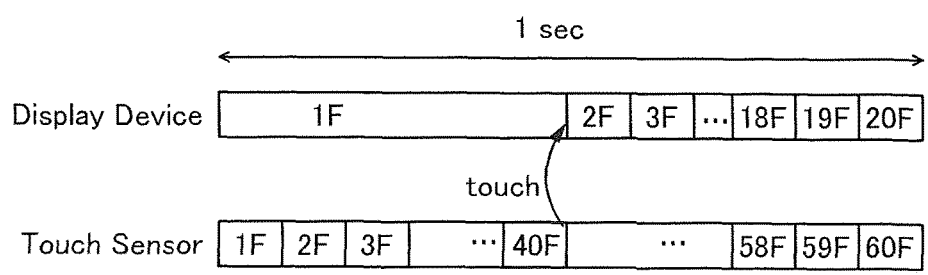

Furthermore, the touch panel of this embodiment can continue to drive the touch sensor in the case of the driving illustrated in FIG. 22C. Thus, data signals in the display device can be rewritten at the timing at which the approach or contact of a sensing target is sensed by the touch sensor, as illustrated in FIG. 22D.

If the operation of rewriting data signals in a display device is performed during a sensing period of a touch sensor, noise caused by driving the display device might be transmitted to the touch sensor, lowering the sensitivity of the touch sensor. For this reason, driving is preferably performed such that a rewriting period for data signals in a display device and a sensing period for a touch sensor are different periods.

Figure 23A:
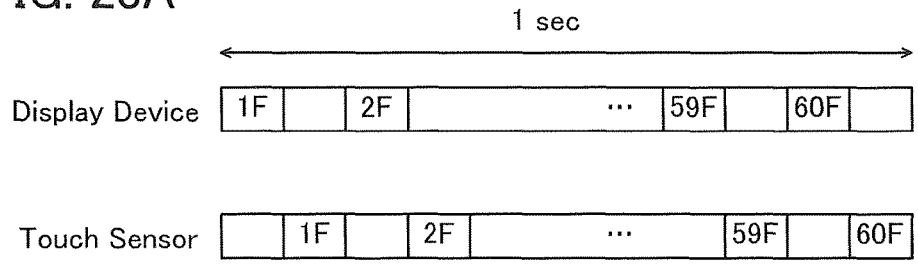
FIGS. 23A to 23D show diagrams illustrating operations of a display device and a touch sensor according to an embodiment.
Figure 23B:
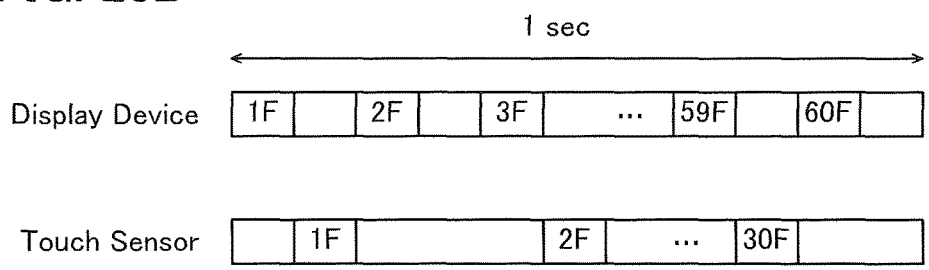

FIG. 23A illustrates an example in which rewriting of data signals in a display device and sensing in a touch sensor are performed alternately. In addition, FIG. 23B illustrates an example in which sensing in a touch sensor is performed once every other operation of rewriting data signals in a display device. Note that without being limited thereto, sensing in a touch sensor may be performed once every three or more rewriting operations.

In addition, in the case where an oxide semiconductor is used as a semiconductor where a channel is formed in a transistor used in a pixel of a display device, the off-state current can be significantly reduced and the frequency of rewriting data signals can be sufficiently reduced. Specifically, a sufficiently long break period can be provided after data signal rewriting and before the next data signal rewriting. The break period can be 0.5 seconds or longer, 1 second or longer, or 5 seconds or longer, for example. The upper limit of the break period, which is restricted by the leakage current of a capacitor or a display element connected to a transistor, can be, for example, approximately 1 minute or shorter, 10 minutes or shorter, 1 hour or shorter, or 1 day or shorter.

Figure 23C:
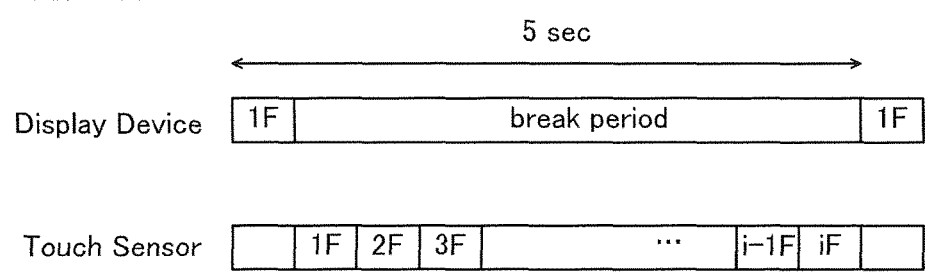
Figure 23D:
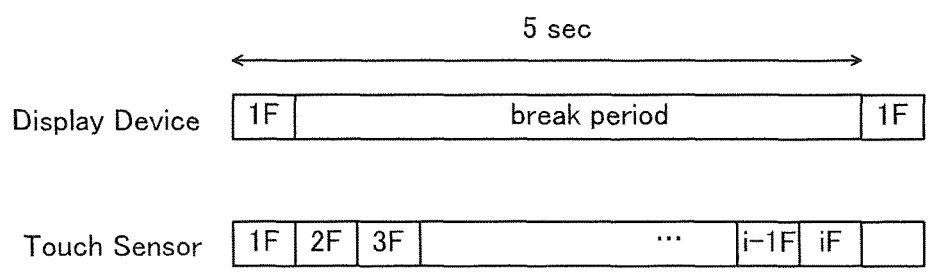

FIG. 23C illustrates an example in which rewriting of data signals in a display device is performed once every 5 seconds. In FIG. 23C, a break period for stopping the operation of a display device is provided after data signal rewriting and before the next data signal rewriting operation. In the break period, a touch sensor can be driven at a frame frequency of i Hz (i is more than or equal to the frame frequency of a display device; here, 0.2 Hz or more). In addition, it is preferable that sensing in a touch sensor be performed in a break period and not be performed in a rewriting period of data signals in a display device as illustrated in FIG. 23C, in which case the sensitivity of the touch sensor can be increased. When rewriting of data signals in a display device and sensing in a touch sensor are performed at the same time as illustrated in FIG. 23D, signals for driving can be simplified.

In a break period during which the operation of rewriting data signals in a display device is not performed, only the supply of signals to a driver circuit may be stopped, and in addition, the supply of a power supply potential may be stopped for further reducing power consumption.

The touch panel of one embodiment of the present invention has a structure in which a display device and a touch sensor are sandwiched between two flexible substrates, for example, and the distance between the display device and the touch sensor can be extremely reduced. At this time, noise caused by driving the display device might be easily transmitted to the touch sensor, lowering the sensitivity of the touch sensor; by employing the driving method exemplified in this embodiment, a touch panel with both reduced thickness and high detection sensitivity can be realized.

(Embodiment 5)

In this embodiment, examples of a structure and a driving method of a touch panel that is applicable to a display panel of the electronic device of one embodiment of the present invention will be described with reference to drawings.

[Structure of Touch Panel]

Figure 24:
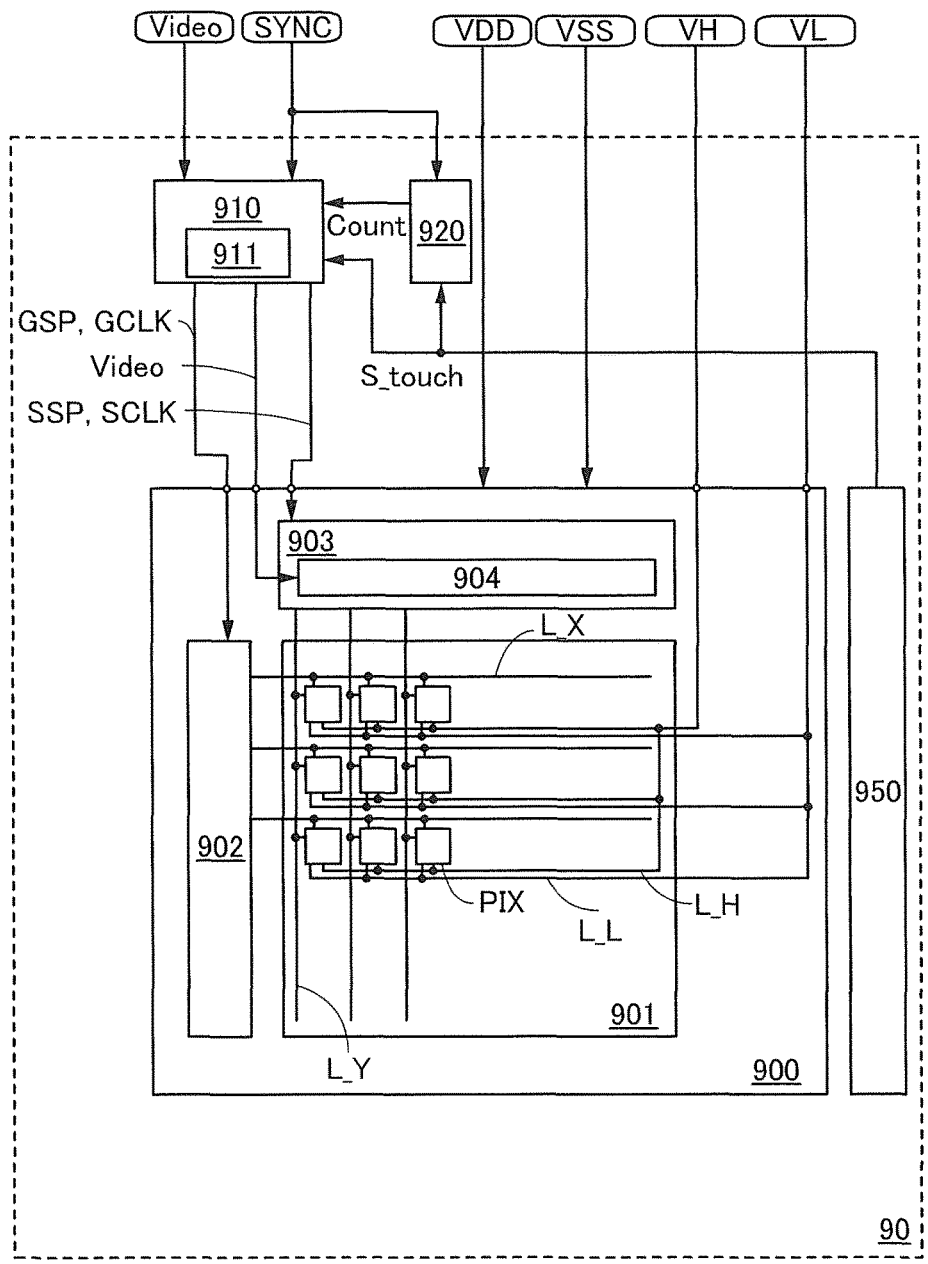
FIG. 24 shows a block diagram of a touch panel according to an embodiment.

FIG. 24 is a block diagram illustrating a structure example of a touch panel exemplified below. As illustrated in FIG. 24, a touch panel 90 includes a display device 900, a control circuit 910, a counter circuit 920, and a touch sensor 950.

An image signal (Video), which is digital data, and a synchronization signal (SYNC) for controlling rewriting of a screen of the display device 900 are input to the touch panel 90. Examples of the synchronization signal include a horizontal synchronization signal (Hsync), a vertical synchronization signal (Vsync), and a reference clock signal (CLK).

The display device 900 includes a display portion 901, a gate driver 902, and a source driver 903. The display portion 901 includes a plurality of pixels PIX. The pixels PIX in the same row are connected to the gate driver 902 through a common gate line L_X, and the pixels PIX in the same column are connected to the source driver 903 through a common source line L_Y.

A high-level voltage (VH), a low-level voltage (VL), and a high power supply voltage (VDD) and a low power supply voltage (VSS) which serve as power supply voltages are supplied to the display device 900. The high-level voltage (VH) is supplied to each pixel PIX in the display portion 901 through a wiring L_H. The low-level voltage (VL) is supplied to each pixel PIX in the display portion 901 through a wiring L_L.

The source driver 903 processes an input image signal to generate a data signal, and outputs the data signal to the source line L_Y. The gate driver 902 outputs, to the gate line L_X, a scan signal for selecting the pixel PIX into which a data signal is to be written.

The pixel PIX includes a switching element whose electrical connection to the source line L_Y is controlled by a scan signal. When the switching element is turned on, a data signal is written into the pixel PIX through the source line L_Y.

The control circuit 910 is a circuit that controls the whole touch panel 90 and includes a circuit that generates control signals for circuits included in the touch panel 90.

The control circuit 910 includes a control signal generation circuit that generates control signals for the gate driver 902 and the source driver 903 from the synchronization signal (SYNC). Examples of control signals for the gate driver 902 include a start pulse (GSP) and a clock signal (GCLK). Examples of control signals for the source driver 903 include a start pulse (SSP) and a clock signal (SCLK). For example, the control circuit 910 generates a plurality of clock signals with the same cycle and shifted phases as the clock signals (GCLK and SCLK).

In addition, the control circuit 910 controls the output of an image signal (Video), which is input from the outside of the touch panel 90 to the source driver 903.

In addition, a sensor signal (S_touch) input from the touch sensor 950 is input to the control circuit 910, and an image signal in accordance with the sensor signal is corrected. The correction of the image signal depends on the sensor signal; image processing corresponding to touch is performed.

The source driver 903 includes a digital/analog conversion circuit 904 (hereinafter referred to as a D-A conversion circuit 904). The D-A conversion circuit 904 converts an image signal into an analog signal, thereby generating a data signal.

Note that in the case where an image signal input to the touch panel 90 is an analog signal, it is converted into a digital signal in the control circuit 910 and output to the display device 900.

An image signal is image data for each frame. The control circuit 910 has a function of performing image processing on the image data and controlling output of the image signal to the source driver 903 on the basis of data obtained by the processing. Therefore, the control circuit 910 includes a motion detection portion 911 that performs image processing on the image data to detect motion in accordance with the image data for each frame. Furthermore, in the case where a sensor signal is input, the image signal based on the image data is corrected in response to the sensor signal.

When the motion detection portion 911 determines that there is motion, the control circuit 910 continues to output image signals to the source driver 903. Conversely, the control circuit 910 stops the output of image signals to the source driver 903 when it is determined that there is no motion, and restarts the output of image signals when it is determined again that there is motion.

The control circuit 910 can control display in the display portion 901 by switching between a first mode for displaying images with motion (moving image display) and a second mode for displaying images without motion (still image display), depending on determination by the motion detection portion 911. The first mode is a mode where when the vertical synchronization signal (Vsync) is 60 Hz, for example, the frame frequency is set to 60 Hz or higher. The second mode is a mode where when the vertical synchronization signal (Vsync) is 60 Hz, for example, the frame frequency is set to lower than 60 Hz.

The frame frequency set in the second mode is preferably set in advance in accordance with a voltage retaining property of a pixel. For example, in the case where the motion detection portion 911 determines that there is no motion for a certain period of time and the output of image signals to the source driver 903 is stopped, a voltage corresponding to the gray level of an image signal that is written to the pixel PIX is lowered. Therefore, it is preferable to write in a voltage corresponding to the gray level of an image signal for the same image in accordance with the cycle of the frame frequency (also called refreshing). A structure may be employed in which the timing of the refreshing (also referred to as a refresh rate) is performed every certain period of time in accordance with, for example, the vertical synchronization signal (a signal obtained by counting the H level of Vsync) in the counter circuit 920.

In the case where the refresh rate is set to a frequency of once every second with the counter circuit 920, when the frequency of the vertical synchronization signal (Vsync) is 60 Hz, refresh may be performed in response to a count signal (Count) that is obtained by counting the H level of the vertical synchronization signal (Vsync) to 60. In the case where the refresh rate is set to a frequency of once every five seconds, when the frequency of the vertical synchronization signal (Vsync) is 60 Hz, refresh may be performed in response to a count signal (Count) that is obtained by counting the H level of the vertical synchronization signal (Vsync) to 300. Furthermore, in the case where a sensor signal input from the touch sensor 950 is input, the counter circuit 920 may be configured to forcibly switch from the second mode to the first mode in response to the sensor signal.

Note that there is no particular limitation on the image processing for detecting motion that is performed in the motion detection portion 911. An example of a method for detecting motion is a method to obtain difference data from image data for two consecutive frames, for example. It can be determined whether there is motion or not from the obtained difference data. There is also a method to detect a motion vector or the like.

The operation and structure described in the above embodiment can be used for the touch sensor 950.

The display device and the touch sensor 950 of this embodiment can be operated independently of each other; thus, a touch sensing period concurrent with a display period can be provided. Even in the structure in which the control circuit 910 switches between the first mode and the second mode, the operation of the touch sensor can thus be controlled independently. By synchronizing the operation of the display device 900 with that of the touch sensor 950 and performing the operation of rewriting data signals in the display device 900 and the sensing operation in the touch sensor 950 in different periods, the sensitivity of sensing can be increased.

[Structure Example of Pixel]

Figure 25A:
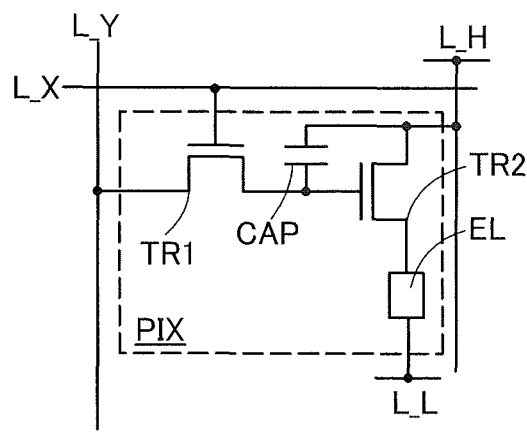
FIGS. 25A to 25B show circuit diagrams of pixels according to an embodiment.

FIG. 25A is a circuit diagram illustrating a structure example of the pixel PIX. The pixel PIX includes a transistor TR1, a transistor TR2, a light-emitting element EL, and a capacitor CAP.

The transistor TR1 functions as a switching element that controls electrical connection between the source line L_Y and a gate of the transistor TR1, and whether it is turned on or off is controlled by a scan signal input to its gate. The transistor TR2 functions as a switching element for controlling a current supplied to the light-emitting element EL.

Note that an oxide semiconductor is preferably used for a semiconductor where a channel is formed in the transistor TR1 and the transistor TR2.

The light-emitting element EL includes an EL layer containing a light-emitting organic compound sandwiched between two electrodes. The luminance of light emitted from the light-emitting element depends on a current flowing between the two electrodes. A low-level potential is applied from the wiring L_L to one electrode of the light-emitting element, and a high-level potential is applied from the wiring L_H to the other electrode via the transistor TR2.

The capacitor Cap has a function of retaining the potential of the gate of the transistor TR2.

Figure 25B:
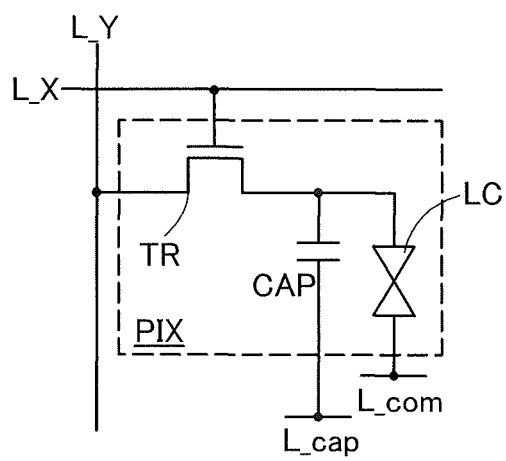

FIG. 25B is an example of the pixel PIX including a liquid crystal element. The pixel PIX includes a transistor TR, a liquid crystal element LC, and a capacitor CAP.

The transistor TR is a switching element that controls electrical connection between one electrode of the liquid crystal element LC and the source line L_Y, and whether it is turned on or off is controlled by a scan signal input to its gate.

Note that an oxide semiconductor is preferably used as a semiconductor where a channel is formed in the transistor TR.

The liquid crystal element LC includes two electrodes and a liquid crystal. The alignment of the liquid crystal is changed by the action of an electric field between the two electrodes. One of the two electrodes of the liquid crystal element LC, which is connected to the source line L_Y through the transistor TR, corresponds to a pixel electrode, and the other, which is connected to a common line L_com to which Vcom is applied, corresponds to a common electrode.

The capacitor Cap is connected in parallel with the liquid crystal element LC. In this case, one electrode of the capacitor is connected to a source or a drain of the transistor TR, and the other electrode of the capacitor is connected to a capacitor line L_cap to which a capacitor line voltage is applied.

Note that although the example where the liquid crystal element LC or the light-emitting element EL is used as a display element is described here, one embodiment of the present invention is not limited thereto.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an EL (electroluminescence) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using MEMS (micro electro mechanical system), a digital micromirror device (DMD), a DMS (digital micro shutter), MIRASOL (registered trademark), an interferometric modulator (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by electrical or magnetic action may be included. Examples of a display device including an EL element include an EL display. Examples of a display device including an electron emitter include a field emission display (FED) and an SED-type flat panel display (SED: Surface-conduction Electron-emitter Display). Examples of a display device including a liquid crystal element include a liquid crystal display (a transmissive liquid crystal display, a transflective liquid crystal display, a reflective liquid crystal display, a direct-view liquid crystal display, or a projection liquid crystal display). Examples of a display device including electronic ink or an electrophoretic element include electronic paper. Note that in the case of realizing a transflective liquid crystal display or a reflective liquid crystal display, some or all of pixel electrodes may function as reflective electrodes. For example, some or all of pixel electrodes are formed to contain aluminum, silver, or the like. In such a case, a memory circuit such as an SRAM can be further provided under the reflective electrodes. Accordingly, power consumption can be further reduced.

For example, in this specification and the like, an active-matrix method in which an active element (a non-linear element) is included in a pixel or a passive-matrix method in which an active element is not included in a pixel can be used.

In the active-matrix method, as an active element, not only a transistor but also a variety of active elements can be used. For example, an MIM (Metal Insulator Metal), a TFD (Thin Film Diode), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced or higher luminance can be achieved.

Since an active element is not used in the passive-matrix type, the number of manufacturing steps is small, so that manufacturing cost can be reduced or yield can be improved. Alternatively, since an active element is not used, the aperture ratio can be improved, so that power consumption can be reduced or higher luminance can be achieved, for example.

[Driving Method Example for Touch Panel]

Figure 26:
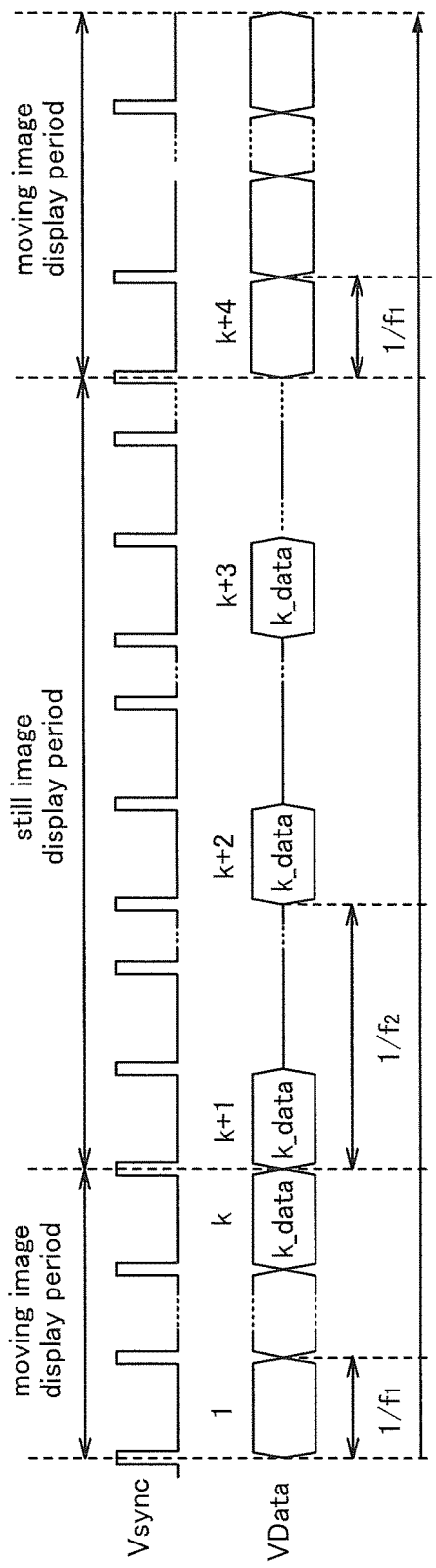
FIG. 26 shows a timing chart illustrating operation of a display device according to an embodiment.

The operation of the touch panel 90, which performs display in the first mode for moving image display and in the second mode for still image display, will be described below with reference to a timing chart in FIG. 26. FIG. 26 illustrates the signal waveforms of the vertical synchronization signal (Vsync) and a data signal (Vdata) that is output to the source line L_Y from the source driver 903.

FIG. 26 is an example of a timing chart of the touch panel 90 in the case where moving image display, still image display, and moving image display are performed in that order. Here, there is motion in image data for the first to k-th frames. Then, there is no motion in image data for the (k+1)-th to (k+3)-th frames. Then, there is motion in image data for the (k+4)-th and subsequent frames. Note that k is an integer of 2 or more.

In the first moving image display period, the motion detection portion 911 determines that there is motion in image data for each frame. Therefore, the touch panel 90 operates in the first mode. The control circuit 910 outputs image signals (Video) to the source driver 903 at higher than or equal to the frequency of the vertical synchronization signal, here a frame frequency $f_1$. The source driver 903 continuously outputs data signals (Vdata) to the source line L_Y. Note that the length of one frame period in the moving image display period is represented by $1/f_1$ (seconds).

Next, in the still image display period, the motion detection portion 911 performs image processing for detecting motion and determines that there is no motion in image data for the (k+1)-th frame. Therefore, the touch panel 90 operates in the second mode. The control circuit 910 outputs to the source driver 903 at a frame frequency lower than the frequency of the vertical synchronization signal, here a frame frequency $f_1$. The source driver 903 intermittently outputs data signals (Vdata) to the source line Ly. Note that the length of one frame period in the still image display period is represented by $1/f_2$ (seconds).

Since the source driver 903 can intermittently output data signals (Vdata), the supply of control signals (e.g., a start pulse signal and a clock signal) to the gate driver 902 and the source driver 903 can also be performed intermittently; thus, the gate driver 902 and the source driver 903 can be stopped at regular intervals.

The intermittent output of data signals (Vdata) to the source line L_Y in the second mode will be specifically described. For example, as illustrated in FIG. 26, in the (k+1)-th frame, the control circuit 910 outputs control signals to the gate driver 902 and the source driver 903 and outputs image signals Video to the source driver 903 at the frame frequency $f_2$. The source driver 903 outputs the data signal (Vdata) written in the previous period, that is, the data signal (Vdata) output to the source line L_Y in the k-th frame, to the source line L_Y. In this manner, in the still image display period, the data signal (Vdata) written in the previous period is repeatedly written to the source line L_Y every period of 1/f$_2$ (seconds). Thus, a voltage corresponding to the gray level of an image signal for the same image can be refreshed. Refresh performed at regular intervals can reduce flickers due to the shift of gray levels caused by a voltage drop and can provide a touch panel with improved display quality.

The control circuit 910 operates in the second mode until the result of determination that there is motion in image data or the input of a sensor signal is obtained in the motion detection portion 911.

Then, when the motion detection portion 911 determines that there is motion in image data for the (k+4)-th and subsequent frames, the touch panel 90 operates in the first mode again. The control circuit 910 outputs image signals (Video) to the source driver 903 at higher than or equal to the frequency of the vertical synchronization signal, here the frame frequency f$_1$. The source driver 903 continuously outputs data signals (Vdata) to the source line L_Y.

The touch panel of one embodiment of the present invention has a structure in which a display device and a touch sensor are sandwiched between two flexible substrates, for example, and the distance between the display device and the touch sensor can be extremely reduced. At this time, noise caused by driving the display device might be easily transmitted to the touch sensor, lowering the sensitivity of the touch sensor; by employing the driving method exemplified in this embodiment, a touch panel with both reduced thickness and high detection sensitivity can be realized.

At least part of this embodiment can be implemented as appropriate in combination with any of the other embodiments described in this specification.

EXAMPLE

In this example, an electronic device of one embodiment of the present invention was manufactured.

A display panel of the electronic device manufactured in this example was manufactured by forming a separation layer (a tungsten film) over a formation substrate (a glass substrate), forming a layer to be separated which included a transistor, a light-emitting element, and the like over the separation layer, then separating the formation substrate and the layer to be separated from each other, and attaching a flexible substrate to the separated layer with an adhesive.

As the transistor, a transistor using a CAAC-OS (C Axis Aligned Crystalline Oxide Semiconductor) was used. Unlike an amorphous one, the CAAC-OS has few defect states and can improve the reliability of the transistor. Moreover, since the CAAC-OS is characterized in that a grain boundary is not observed, a stable and uniform film can be formed over a large area and stress that is caused by curving a flexible light-emitting device does not easily make a crack in a CAAC-OS film.

The CAAC-OS refers to a crystalline oxide semiconductor having c-axis alignment of crystals in a direction substantially perpendicular to the film surface. It has been confirmed that oxide semiconductors have a variety of crystal structures other than a single crystal, for example, a nano-crystal (nc), which is an aggregate of nanoscale microcrystals. The crystallinity of the CAAC-OS is lower than that of a single crystal and higher than that of an nc.

In this example, a channel-etched transistor using an In—Ga—Zn-based oxide was used. The transistor was manufactured over a glass substrate through a process at lower than 500° C.

In a method of manufacturing an element such as a transistor directly over an organic resin such as a plastic substrate, the temperature of the process for manufacturing the element needs to be lower than the upper temperature limit of the organic resin. In this example, the formation substrate is a glass substrate and the separation layer, which is an inorganic film, has high heat resistance; thus, the transistor can be manufactured at the same temperature as in the case where a transistor is manufactured over a glass substrate, and the performance and reliability of the transistor can be easily secured.

As the light-emitting element, a white-light-emitting tandem (stacked) organic EL element was used. The light-emitting element has a top-emission structure, and light from the light-emitting element is extracted to the outside of the display panel through a color filter.

In the manufactured display panel, the diagonal size of a display portion is 5.9 inches, the number of pixels is 720×1280, the pixel size is 102 μm×102 the resolution is 249 ppi, and the aperture ratio is 45.2%. In addition, the frame frequency is 60 Hz, a scan driver was integrated, and a source driver was mounted by a COF method. The manufactured display panel had a thickness of 100 μm or less and a weight of approximately 3 g.

Figure 27A:
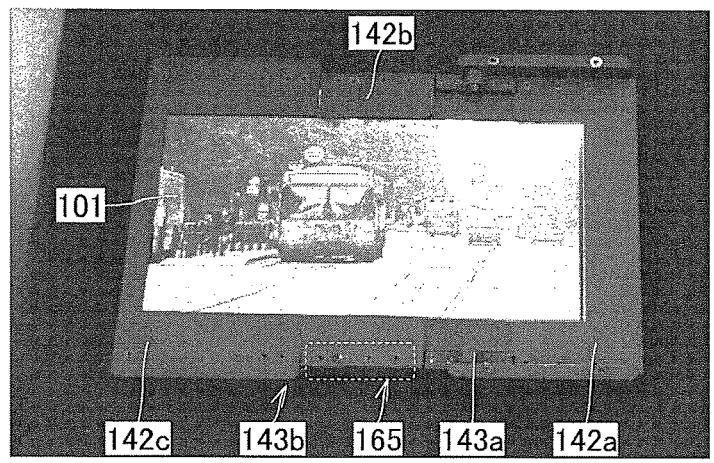
FIGS. 27A to 27C show photographs of an electronic device according to an example.
Figure 27B:
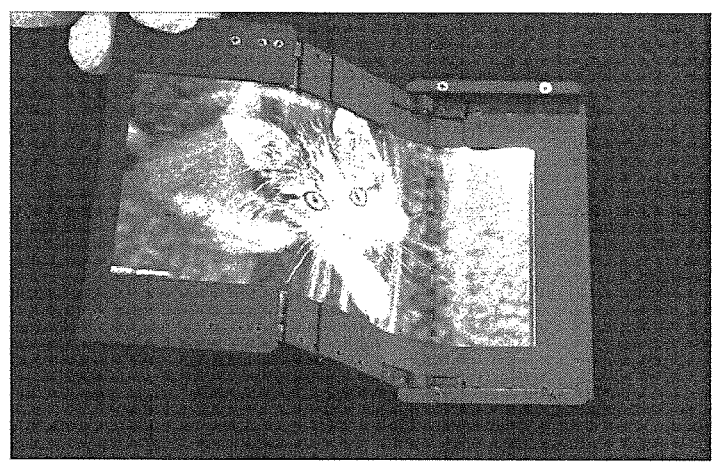
Figure 27C:
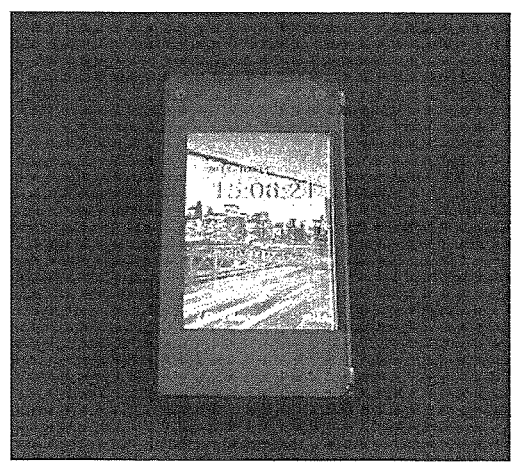

FIGS. 27A, 27B, and 27C show photographs of the manufactured electronic device. FIG. 27A shows a state where a display surface of the display panel is planar, FIG. 27B shows a state in the middle of folding the display panel, and FIG. 27C shows a state where the display panel is folded. Note that reference numerals and the like are omitted in FIGS. 27B and 27C for clarity.

The electronic device shown in FIG. 27A and the like includes the display panel 101, the support body 142a, the support body 142b, the support body 142c, the hinge 143a, and the hinge 143b. In addition, the support body 142b has a mechanism with which the length between both ends thereof changes (a slide mechanism 165).

In this manner, the electronic device of one embodiment of the present invention can be easily changed in shape from the state where the display surface of the display panel 101 is planar into the state where it is folded without damage to the display panel 101.

The above is the description of the example.

At least part of this example can be implemented as appropriate in combination with any of the embodiments described in this specification.

REFERENCE NUMERALS

100 electronic device
101 display panel
101a portion
101b portion
101c portion
102a support body
102b support body
102c support body
103 hinge
103a hinge
103b hinge
110 hinge
110a plane
110b plane
111 rotation axis
111a rotation axis
111b rotation axis
120 electronic device
121 electrode
122 electrode 130 electronic device
140 electronic device
141 housing
142a support body
142b support body
142c support body
143a hinge
143b hinge
144 printed board
145 operation button
147 FPC
148 terminal connection portion
149 battery
151a rotation axis
151b rotation axis
160 electronic device
161 housing
162a member
162b member
162c member
163 screw
164 opening
201 formation substrate
203 separation layer
205 formation substrate
207 separation layer
230 light-emitting element
301 display portion
302 pixel
302B sub-pixel
302G sub-pixel
302R sub-pixel
302t transistor
303c capacitor
303g(1) scan line driver circuit
303g(2) imaging pixel driver circuit
303s(1) image signal line driver circuit
303s(2) imaging signal line driver circuit
303t transistor
304 gate
308 imaging pixel
308p photoelectric conversion element
308t transistor
309 FPC
311 wiring
319 terminal
321 insulating layer
328 partition
329 spacer
350R light-emitting element
351R lower electrode
352 upper electrode
353 EL layer
353a EL layer
353b EL layer
354 intermediate layer
360 sealing layer
367BM light-blocking layer
367p anti-reflective layer
367R coloring layer
380B light-emitting module
380G light-emitting module
380R light-emitting module
390 touch panel
501 display portion
502R sub-pixel
502t transistor
503c capacitor
503g scan line driver circuit
503t transistor
505 touch panel
505B touch panel
509 FPC
510 substrate
510a insulating layer
510b flexible substrate
510c adhesive layer
511 wiring
519 terminal
521 insulating film
528 partition
550R light-emitting element
560 sealing layer
567BM light-blocking layer
567p anti-reflective layer
567R coloring layer
570 substrate
570a insulating layer
570b flexible substrate
570c adhesive layer
580R light-emitting module
590 substrate
591 electrode
592 electrode
593 insulating layer
594 wiring
595 touch sensor
597 adhesive layer
598 wiring
599 connection layer
601 pulse voltage output circuit
602 current detection circuit
603 capacitor
611 transistor
612 transistor
613 transistor
621 electrode
622 electrode
801 substrate
803 substrate
804 light-emitting portion
806 driver circuit portion
808 FPC
811 adhesive layer
813 insulating layer
814 conductive layer
815 insulating layer
816 conductive layer
817 insulating layer
817a insulating layer
817b insulating layer
820 transistor
821 insulating layer
822 transistor
823 sealing layer
824 sealing layer
825 connector
827 spacer
830 light-emitting element
831 lower electrode
833 EL layer
835 upper electrode
841 adhesive layer
843 insulating layer 845 coloring layer
847 light-blocking layer
849 overcoat
857 conductive layer
857a conductive layer
857b conductive layer
90 touch panel
900 display device
901 display portion
902 gate driver
903 source driver
904 D-A conversion circuit
910 control circuit
911 detection portion
920 counter circuit
950 touch sensor This application is based on Japanese Patent Application Ser. No. 2014-039372 filed with Japan Patent Office on Feb. 28, 2014 and Japanese Patent Application Ser. No. 2014-218932 filed with Japan Patent Office on Oct. 28, 2014, the entire contents of which are hereby incorporated by reference.

What is claimed is:

1. A display device comprising:
a display panel having flexibility;
a first support body and a second support body each supporting the display panel; and
a hinge connecting the first support body and the second support body to each other,
wherein:
the display panel comprises a first portion supported by the first support body, a second portion supported by the second support body, and a third portion between the first portion and the second portion,
the display panel comprises a first surface and a second surface opposite to the first surface,
the hinge has a rotation axis,
when an angle from a state where the first and second support bodies are horizontal is 0 degree, the rotation axis is located on the first surface side of the third portion,
when an angle from the state is 180 degrees, the rotation axis is located on the second surface side of the third portion, and
wherein the first support body and the second support body are capable of rotating on the rotation axis by an angle greater than 180 degrees from the state.

2. The display device according to claim 1,
wherein one of the first surface and the second surface is a display surface.

3. The display device according to claim 2, wherein:
the rotation axis and a first plane including a first region of the display surface overlapping with the first portion are parallel to each other, and
the rotation axis and a second plane including a second region of the display surface overlapping with the second portion are parallel to each other.

4. The display device according to claim 1, wherein the third portion is in contact with the first and second support bodies on the second surface side in the state.

5. The display device according to claim 1, wherein the display panel is foldable so that an end portion of the first support body is in contact with an end portion of the second support body.

6. The display device according to claim 1, wherein a distance between the first portion and the rotation axis and a distance between the second portion and the rotation axis are substantially equal to each other.

7. The display device according to claim 1, wherein the display panel comprises a module including a touch sensor provided on the display panel.

8. A display device comprising:
a display panel having flexibility;
a first support body, a second support body, and a third support body each supporting the display panel;
a first hinge connecting the first support body and the second support body to each other; and
a second hinge connecting the second support body and the third support body to each other,
wherein:
the display panel comprises a first portion supported by the first support body, a second portion supported by the second support body, a third portion supported by the third support body, a fourth portion between the first portion and the second portion, and a fifth portion between the second portion and the third portion,
the first hinge has a first rotation axis,
the second hinge has a second rotation axis,
the display panel comprises a first surface and a second surface opposite to the first surface,
when an angle from a first state where the first and second support bodies are horizontal is 0 degree, the first rotation axis is located on the first surface side of the fourth portion,
when an angle from the first state is 180 degrees, the first rotation axis is located on the second surface side of the fourth portion,
the first support body and the second support body are capable of rotating on the first rotation axis by an angle greater than 180 degrees from the first state, and
the second support body and the third support body are capable of rotating on the second rotation axis by an angle greater than 180 degrees from a second state where the second support body and the third support body are horizontal.

9. The display device according to claim 8,
wherein one of the first surface and the second surface is a display surface.

10. The display device according to claim 9, wherein:
wherein the first rotation axis and a first plane including a first region of the display surface overlapping with the first portion are parallel to each other,
wherein the first rotation axis and a second plane including a second region of the display surface overlapping with the second portion are parallel to each other,
wherein the second rotation axis and a third plane including a third region of the display surface overlapping with the third portion are parallel to each other, and
wherein the second rotation axis and the second plane are parallel to each other.

11. The display device according to claim 8, wherein the display panel is foldable so that an end portion of the first support body is in contact with one of end portions of the second support body and/or an end portion of the third support body is in contact with the other of end portions of the second support body.

12. The display device according to claim 8, wherein:
a distance between the first portion and the first rotation axis and a distance between the second portion and the first rotation axis are substantially equal to each other, and a distance between the second portion and the second rotation axis and a distance between the third portion and the second rotation axis are substantially equal to each other.

13. The display device according to claim 8, wherein:

when an angle from the second state is 0 degree, the second rotation axis is located on the second surface side of the fifth portion, and when an angle from the first state is 180 degrees, the first rotation axis is located on the first surface side of the fifth portion.

14. The display device according to claim 8, wherein the fourth portion is in contact with the first and second support bodies on the second surface side in the first state.

15. The display device according to claim 8, wherein the display panel comprises a module including a touch sensor provided on the display panel.

* * * * *